US007014795B2

(12) United States Patent
Grigorov et al.

(10) Patent No.: US 7,014,795 B2
(45) Date of Patent: Mar. 21, 2006

(54) QUANTUM DEVICES BASED ON CRYSTALLIZED ELECTRON PAIRS AND METHODS FOR THEIR MANUFACTURE AND USE

(75) Inventors: Leonid N. Grigorov, Novato, CA (US); Andrey Krayev, Santa Rosa, CA (US); Raisa V. Talroze, Novato, CA (US)

(73) Assignee: Quantum Polymer Technologies Corporation, Santa Rosa, CA (US)

( * ) Notice: Subject to any disclaimer, the term of this patent is extended or adjusted under 35 U.S.C. 154(b) by 485 days.

(21) Appl. No.: 10/056,536

(22) Filed: Jan. 22, 2002

(65) Prior Publication Data

US 2003/0071246 A1 Apr. 17, 2003

Related U.S. Application Data

(60) Provisional application No. 60/263,386, filed on Jan. 23, 2001.

(51) Int. Cl.
*H01B 1/00* (2006.01)
*H01L 21/00* (2006.01)
(52) U.S. Cl. .................. 252/500; 977/DIG. 1; 438/142
(58) Field of Classification Search ................ 252/500, 252/510, 519.33; 204/157.6, 155; 505/100, 505/110; 438/142; 977/DIG. 1
See application file for complete search history.

(56) References Cited

U.S. PATENT DOCUMENTS

| 4,325,795 A | 4/1982 | Bourgoin ................. 204/180 R |
| 5,777,292 A | 7/1998 | Grigorov et al. ...... 204/157.15 |
| 6,294,450 B1 | 9/2001 | Chen et al. .................. 438/597 |
| 6,407,443 B1 | 6/2002 | Chen et al. .................. 257/616 |

OTHER PUBLICATIONS

M. Rice, "An analogue of superfluid 3He", Dec. 1998, Nature, vol. 396, pp. 627-629.*
J.A. Duffy, "Unconventional superconductors: how are the spins paired in?", from 2001 Annual Report of Nuetrons for Science 3 page web article with cover page.*
Arkhangorodskii, V.M, et al., "Superconductivity at room temperture in oxidized polypropylene", JETP Lett., vol. 51, No. 1, Jan. 10, 1990, pp. 67-72.
Darton, Mike, et al. "The Macmillan Dictionary of Measurement", 1994, pp. 90, 133.
Demicheva, O.V., et al., Anomalously High Electroconductivity and Magnetism in Films of Silicone Natural Rubber, translation from Vysokomolekulyarnyye Soyedineniya, Seriya B, Kratkiye Soobshcheniya, vol. 32, No. 1, Nov. 1990, pp. 3-4.
Eagles, D.M., "A conjectured explanation for room-temperature superconductivity in narrow channels in oxidised polypropylene", Jun. 1993, Submitted for publication in the Proceedings of the Conference on Physics and Chemistry of Oxide Superconductors, Eugene Oregon, Jul. 27-31, 1993, proceedings to be published in the Journal of Superconductivity.
Farges, Jean-Pierre, editor, "Organic Conductors, Fundamentals and Applications, Chapter 1" (by William A. Little), Marcel Dekker, Inc. Publishers, 1994, pp. 1-24.
Enikolopyan, et al., "Possible superconductivity near 300 K in oxidized polypropylene", JETP Lett. vol. 49, No. 6, Mar. 25, 1989, pp. 371-375.
Kragev, et al. the "Thermopower Measurements for Quasi-ID Superconducting Channels in Matrices of Some Dielectric Polymers", Advances in Science and Technology 23, Science and Engineering of HTC Super Conductivity, ed: P. Vincenzini, Techna, Faenza, pp. 459-466 (1999).
Grigorov, L.N., et al., "Destruction of ultrahigh conductivity of oxidized polypropylene in critical current", JETP Lett., vol. 51, No. 4, Feb. 25, 1990, pp. 258-263.
Grigorov, L.N., et al, "On genuine room-temperature superconductivity in high-conductivity channels in oxidized polypropylene", Superconductivity 4(2), Feb. 1991, pp. 345-352.
Grigorov, L.N. et al., "Room-Temperature Superconductivity in Films of Certain Polymers", Polymer Science, vol. 35, No. 11, 1993, pp. 1625-1633.
Grigorov, L.N., "Quantum theory of unusual heat-resistant superconductivity in polymers", Philosophical Magazine B, 1998, vol. 78, No. 4, 353-363.
Rogachev, et al., "The Instantaneous Resistance Transition Caused By Critical Current In Quasi-ID Superconductive Channels In Matrices Of Some Dielectric Polymers", paper from 9th Symposium VI, Science and Engineering of HTC Superconductivity, 1999, pp. 545-550.
Shlimak, I., et al., "Switching Phenomena in Elastic Polymer Films", Solid State Communications, vol. 00, No. 0, pp. 000-000, 1998.

(Continued)

*Primary Examiner*—Evan Pert

(57) ABSTRACT

This invention provides new, highly conductive materials comprising crystallized electron pairs within an insulating matrix. Crystallized electron pairs can combine with each other to form quasi-one-dimensional structures, quantum nanowires, that have nanoscale diameters and microscale lengths or longer. Quantum nanowires can also be formed as closed loops. Quantum nanowires comprising crystallized electron pairs exhibit very high electrical conductivity over a range of temperatures from 0 Kelvins up to the decomposition temperature of the materials. The quantum nanowires of this invention can be used in a variety of electronic, opto-electronic, electro-optical, motive, sensing and other ways to provide nanoscale structures for manufacturing small devices having low power requirements, low energy dissipation and very rapid responses.

20 Claims, 21 Drawing Sheets

OTHER PUBLICATIONS

Grigorov, L.N., et al., "The Superconductivity at Room Temperature and Much Higher in New Polymer Films", Mol. Cryst. Liq. Cryst., 1993, vol. 230, pp. 133-138.

Peng, Z.L., et al., "Correlation Between Positron Annihilation Parameters and the Conductivity For Conducting Polymer", Materials Science Forum, vols. 175-178 (1995), pp. 747-750.

Smirnova, S.G., et al., "Some Characteristics of Anomalous Conduction of Thin Layers of Polypropylene", NASA Technical Translation, NASA-TT-21402, Jul. 1993.

Rogachev, D.N., et al., "Observation of Extremely Large, Field-Dependent Diamagnetism at 300 K in Certain Disordered Organic Materials", Journal of Superconductivity: Incorporating Novel Magnetism, vol. 13, No. 6, 2000, pp. 947-949.

* cited by examiner

QUANTUM DEVICES BASED ON CRYSTALLIZED ELECTRON PAIRS AND METHODS FOR THEIR MANUFACTURE AND USE

RELATED APPLICATION

This application claims priority to U.S. Provisional Patent Application Ser. No. 60/263,386, filed Jan. 23, 2001. This application is related to United States Utility Application titled "Conductive Polymer Materials and Methods for Their Manufacture and Use," Inventors: Raisa Talroze, Ph.D., Sc.D. and Leonid N. Grigorov, Ph.D., Sc.D., filed Jan. 22, 2002. These applications are both herein incorporated fully by reference.

FIELD OF THE INVENTION

This invention relates to materials having high electrical conductivity. More particularly, it relates to polymer materials containing quantum nanowires having high conductivity over a wide temperature range.

BACKGROUND OF THE INVENTION

Electrical conductors play fundamental roles in modem civilization, and their improvements are of substantial importance and utility. Ongoing problems in electrical systems include (a) the need for materials exhibiting low electrical resistivity so as to minimize loss of the energy and (b) the need for new conducting elements of nanoscale size to be suitable for future, small scale microelectronics. Any significant increase in density of electronic elements raises the problem of overheating. Minimizing overheating can require advances both problems (a) and (b).

Any electrically neutral substance, including electrical conductors have equal amounts of positive and negative charges and, in general, a conductor's properties can depend on the physical state of both kinds of charges. All good conductors can be considered in few classes considered below from the viewpoint of the crystallinity of their charges. For example, solid metals fall to the class of partially crystalline conductors, because their positive ions form crystalline lattice and their negative charges are in a disordered state which can be described as a stable free electron gas.

Prior art conductors can be considered to be members of one or more different classes, depending upon certain characteristics.

Class I: Partially Crystalline Solid Conductors

All materials in the class of partially crystalline solid conductors are solid inorganic conductors consisting of an immovable crystalline lattice of positive ions and a disordered gas of conducting free electrons.

Solid metals and alloys (e.g., of copper, aluminum and like materials) made of inorganic elements are presently among the most widely used conductors, because at ambient temperatures, the best of them have conductivity$\approx 10^6$ Sim/cm, and wires made of these metals exhibit continuous current carrying capacity of about $10^3$ A/cm$^2$. The ionic crystalline lattice of these materials has no chemical bonds, and is stable only because of so-called metallic binding. Free electrons in metals obey Fermi-statistics and have a concentration of about $10^{23}$ cm$^3$. These conditions lead to high kinetic energy of the electrons and to relatively weak electron-electron correlations.

A property of many metals, discovered in 1911 by Kamerlingh-Onnes, is that below some critical temperature $T_c$ they suddenly lose their resistivity and become superconductors (SC), i.e. materials having extremely high conductivity. Later it was discovered by Meisner that the transition of bulk metal from normal (i.e. resistive) to the SC state is accompanied by the sudden appearance of extremely strong diamagnetism that expels the magnetic field from the SC. Basically, a SC appears as a consequence of specific electron correlations, and usually, a higher $T_c$ corresponds to a stronger correlation. Unfortunately, metal SC are of limited technical utility because their weak electron-electron correlation may result only in rather low $T_c$, of about 20K or less.

The creation of metallic nanowires having diameters less than 100 nm was described in U.S. Pat. No. 4,325,795 (1982) by R. Bourgoin. In accordance with this teaching, nanowires having some properties similar to SC at ambient temperatures should be prepared within a liquid dielectric polymer medium, namely epoxy resin, with the use of a very fine powder of conventional metal, namely bismuth, constituting not less than 10 vol. % in this mixture. The organic polymer medium does not contribute any charges participating in the formation of nanowires. The patent does not describe how only the decrease of the diameter of the bismuth wire results in superconductivity at ambient temperatures. Bulk bismuth is well known to have $T_c$=5 K, and even substantial reduction of its size (for instance, in very thin films) increases $T_c$ up to only about 8 K. Nonetheless, direct participation of large amounts of conventional metals to conductivity places this metal-organic composite material in the same conducting class as pure metals.

Class II: Completely Crystalline Conductors

The class of completely crystalline conductors includes both inorganic materials and organic molecular materials. In both cases positive and negative charges are well localized and form a common crystalline lattice.

New ceramics discovered by J. Bednorz and K. Muller (Z. Phys. B, Vol. 64, p. 188 (1986)) are examples of completely crystalline inorganic conductors. These crystals have no molecular structure, and the chemical elements are bound partially by covalent bonds and partially by ionic bonds. Sizes of both positive ions and negative ions as well as the distance between them do not usually exceed 0.2 nm. Electrons are not free in such crystals because they are strongly trapped by those elements, thereby forming negative ions. Broken stoichiometry is required, or alternatively, other elements have to be introduced to play the role of doping agent creating 'holes' in an electron spectrum. At high temperatures, these holes can move by a hopping mechanism, resulting semiconductor-type conductivity. Actually that means the formation of "defects" in a negatively charged crystal. The low concentration of such defects (between $10^{21}$ and $10^{22}$ cm$^{-3}$) causes only weak disturbance of crystalline state of the negative charges and allows charge carriers to correlate much better. Thus, ceramics may become highly conductive materials with relatively high $T_c$ of about 100K. Their superconductivity exhibits reduced dimensionality in contrast to metals, which have three-dimensional superconductivity. However wide application of superconductive ceramics has not been possible, mainly because of at one or more of the following reasons:

In general, superconductivity is a highly complicated physical phenomenon. Since first discovery, it took half-century to develop BCS theory explaining metallic SC (J. Bardeen, L. Cooper, J. Schrieffer, Phys.Rev. V. 108, p.1175 (1957)). According to the BCS theory, superconductivity may occur only from electron pairing mediated by a mechanism of energetic exchange within an electron couple, becoming a new particle which doesn't obey Fermi-statistics. For instance, in metals and ceramics, delocalized superconducting pairs have charge −2e and spin S=0, and are condensed on the same energetic level. As a result of our invention, BCS theory exploiting only electron-phonon pairing mechanisms is not universal, and fails to describe so-called "high temperature SC" in new ceramics, as well as some other related effects. For instance, on the basis of BCS, it was always thought that any SC phenomenon is incompatible with ferromagnetism. Nonetheless, the first inorganic materials combining SC with ferromagnetism at about liquid helium temperatures were discovered recently by America scientists and others (see, for instance S. S. Saxena et al., *Nature*, v. 406, p.587 (2000); C. Pfleiderer et al., *Nature*, v.412, p. 58(2001); D. Aoki et al., *Nature*, v.413, p.613 (2001)). This discovery demonstrates that mechanisms other than BCS mechanisms may also exist, and some conventional definitions of SC, including those based on the BSC Meisner effect, may not be widely applicable.

In 1980's some solid salts made of organic molecules with molecular weight about few hundreds a.m.u. were discovered to become SC at very high pressure about thousands MPa and $T_c$ less than 12K. These salts form well defined molecular crystals whose lattice is built of both positively and negatively charged chemical groups having approximate size about 0.2–0.3 nm and separated by the same small distances. That is a reason why Coulomb forces cause strong binding of electrons within such lattice. Similar to ceramics conducting "defects" can be induced by appropriate doping agents as well as by high pressure causing strong deformation of both positive and negative crystalline sub-lattices. There is presently no full theoretic understanding of intrinsic mechanism of a superconductivity in these salts.

Class III: Amorphous Conductors

Amorphous conductors include the following sub-classes:

II-1. The first sub-class includes liquid conductors in which both positive and negative charges contribute in conductivity. Due to random distribution of the charge carriers, neither form crystalline lattices.

(a) The conductivity of the group of liquid metals (e.g., mercury) and some alloys made of inorganic elements and containing no molecules, is mainly due to a negatively charged gas of free electrons. Slowly moving positive charges are well localized metallic ions having typical radii of less than about 0.2 nm. At ambient temperatures, the conductivity of these liquids is about two orders of magnitude less than that of best solid metals like copper;

(b) Liquid molecular conductors are represented, for example, by melted salts and electrolytically dissociated organic or inorganic molecules dissolved in a solvent. Conductors in this class maybe composed of elements, molecular groups, or both, and exhibit conductivity even less than that of liquid metals. In contrast to liquid metals, moving negative charges are represented in this group by disordered negative ions in which well localized electrons are captured within anionic atoms, molecules or anion chemical groups having relatively high electron affinity and characteristic sizes of 0.5 nm or less.

III-2. The second sub-class includes solid conductors in which no ions participate in conductivity and neither positive nor negative charges form crystalline lattice;

(c) Some amorphous solid metals made of inorganic elements have random distribution of positive ions, and conduct only due to the presence of disordered free electrons. In contrast to liquid conductors, a fixed state of localized positive ions prevents their direct participation in conductivity. No information has been reported that such conductors can exhibit higher ambient temperature conductivity than that of copper or gold;

(d) A well known example of a solid organic macromolecular conductor is polyacetylene (PA), which has alternating single and double bonds in a long molecular chain. Such a "polyconjugated" system results in the creation of free electrons delocalized along the whole macromolecular chain. If heavily doped with iodine, the PA and other conjugated polymers can show relatively high conductivities from $10^3$ to $10^5$ Sim/cm. Although PA has high crystallinity there is no indication that its ionic components can form a crystalline lattice or can directly participate in charge transfer.

(e) Another solid conducting material made of non conjugated, non-doped macromolecules is based on a so-called "superpolaron" quantum design disclosed in U.S. Pat. No 5,777,292; L. Grigorov et al., inventors. This material contains local conducting structures having diameters of about 1000 nm, typical lengths of about 20 microns, and exhibit conductivity at ambient temperatures more than $10^6$ Sim/cm. These structures were independently confirmed by V. Arkhangorodski et al., *JETP Lett*. V. 51, p. 67 (1990). The physical state of electrons in superpolaron structures was fully predicted by quantum mechanical methods (L. Grigorov, *Sov. Tech. Phys. Lett*. Vol. 17, p. 368 (1991)). This article described a superpolaron as a thread-like system where all free electrons exist in a cylindrical potential well formed by oriented polar groups of surrounding macromolecules. Such orientation takes place only if the medium has a high dielectric constant and, due to elasticity of macromolecules, it saturates within rather large radius, wherein $R_0 \geq 2$ nm whose value explicitly defines both the geometry and main electronic properties of the superpolaron. For instance, within the thread, the equilibrium mean distance between free electrons cannot be less than $2R_0 \geq 4$ nm resulting in local electron concentration$\approx 2 \cdot 10^{19}$ cm$^{-3}$ or less. The diameter D of a superpolaron's macromolecular shell containing randomly distributed macroions is be $D >> 2R_0$; the local concentration of positive ions cannot exceed $10^{18}$ cm$^{-3}$.

All superpolaron's electrons can be described as stationary quasi-one-dimensional plane waves concentrated near the well's axis and are delocalized along its length. These charge carriers are typical for normal metal Fermi-particles having charge −e and spin S=½. Their conductivity maybe a natural consequence of reduced dimensionality. This theory states no specific superconducting electron correlation or pairing mechanism. At the same time, experimentally observed slight ferromagnetism demonstrated the theoretic statement that electron exchange interactions as well as the presence of positive macromolecular ions partially decreasing free electron repulsion contributes to form such systems.

However, systems based on quasi-one-dimensional quantum designs having on low density of free electrons has an intrinsic instability due to a strong tendency of localization of free electrons causing them to lose mobility. This tendency is enhanced in a quasi-liquid macromolecular medium where the field of localized electrons may easily reorient dipole groups. If that happens, then delocalized electron threads becomes suddenly broken. That's why long-term stabilization of ultrahigh conductivity based on superpolarons requires the material to be solidified. Nonetheless, even that solid state should be considered as as metastable, like that of tempered steel.

Practical use of prior art materials is inherently limited by both the physical state of delocalized electrons within superpolarons and by several difficulties of their creation.

(a) The choice of material precursors is limited to amorphous macromolecules only.

(b) Producing of macroions and free electrons is limited due to long UV-irradiation causing molecular decomposition.

(c) Bulk production seems to be impossible in frameworks of the prior art discussed, due to the fact that ions and free electrons can be generated only on a solid state surface covered with very thin film of macromolecular substance.

(d) Slow diffusion of macromolecular ions from the surface limits mean electron concentration to a low value ($3 \cdot 10^{17}$ cm$^{-3}$) and thus prohibits the formation of any other, more efficient quantum structures.

(e) Due to the metastable nature of superpolarons, the ready solidified material may not be further plasticized with solvents or permitted to undergo any substantial mechanical deformation such as those necessary for manufacturing many kinds of real products. All of these disadvantages reflect the fact that neither the chemical nature of macromolecular ions nor the intimate mechanisms of their creation have been understood. Thus, there is limited ability to control all these processes and their consequences.

Class IV: Non Conventional Conductors Having Lowered Dimensionality

Non-conventional conductors having lowered dimensionality have been described.

(a) For example, W. Little, professor of physics at Stanford University, was the first one who considered easily polarized chemical groups as potential mediators of electron pairing, and proposed rather unusual quantum theory of ambient quasi-one-dimensional superconductivity in a special class of conjugated polymers (*Phys. Rev.* Vol. 134, p. A1416, (1964)). No practical realization of this idea has been reported yet.

(b) Another unusual quantum conductor, a so-called Wigner crystal, was predicted by E. Wigner in 1934. Wigner crystals may appear at decreased concentration of free electrons about or below $10^{20}$ cm$^{-3}$, and is usually considered to be a self-localized cubic electron lattice immersed within uniformly distributed positive ionic "jelly." There is no overlapping of electron wave functions related to neighboring nodes of the lattice, and the crystal is formed only because of an energetic gain due to electron localization. It is thought that above some concentration threshold of about $10^{21}$ cm$^{-3}$, conventional Wigner crystals undergo phase transition called "electron crystal melting" and behaves like a usual metal. For many decades it traditionally seemed that classic Wigner crystals, based on s-type electron wave functions, corresponded to the lowest energetic state of such electronically diluted system. In other words, it was considered as a ground state (D. Pines, in: *Elementary Excitations in Solids*, New York-Amsterdam, 1963). In a perfectly uniform positively charged jelly, a Wigner crystal should not be bound with a matter and, therefore, represents an ideal conductor able to move as a whole. However, the charge of real positive ions can never be absolutely uniform. That is why Wigner crystals recently observed in 2-dimensional semiconductor heterojunctions are good insulators pinned to a disordered ionic sub-lattice at low applied voltage (V. Goldmann et al., *Phys. Rev. Lett.*, Vol. 65, p. 2189 (1990)). A quantitatively moving classic Wigner crystal and its low voltage pinning effect were computed and described by physicists of University California, Davis and University of Michigan (C. Reichhardt et al., *arXiv: Cond-Mat*/0007376, Jul. 24, 2000).

(c) The traditional viewpoint was altered in 1998 by E. Fradkin and S. Kivelson, professors of physics at University Illinois and University of California Los Angeles. They showed theoretically that in a strong magnetic field, a diluted two-dimensional electron gas is able to form a new quantum electron liquid crystal taking place on phase diagram in between normal metal and a pinned Wigner crystal (*Cond-Mat*/981015, Oct. 13, 1998). The repulsion of non-bound electrons can result in a specific correlation combining coherent movement with crystalline order. Moreover, in 1999 French theorists showed that a two-dimensional quantum crystal of spinless fermions (i.e. electron spin of S=0) can even exhibit persistent current, reflecting very high conductivity (G. Benenti et al., *Cond-Mat*/9905028, May 3, 1999). Both these articles described crystallized electrons as individual particles having the usual charge, $-e$. However, both papers are purely quantum theory manifesting a great potential but no materials based upon those considerations has been produced.

SUMMARY OF THE INVENTION

One object of the present invention is to overcome the disadvantages of the prior art discussed above, and to provide a class of materials which contain nanowires comprising crystallized electron pairs and exhibiting ultrahigh conductivity and other useful quantum mechanical properties over a wide temperature range, namely the range from about 0 Kelvins to the temperature of material decomposition.

Another object of the invention is to provide a class of molecular materials whose quantum nanowires have conductivity much greater than that of conventional metals.

It is an additional object of the invention to provide such materials whose quantum nanowires possess useful magnetic quantum peculiarities such as significant intrinsic ferromagnetism, and in some embodiments, extremely strong diamagnetism.

A further object of this invention is to provide classes of chemical precursors suitable for producing said materials in large quantities.

It is a further object of this invention to produce such materials in which internal stability of quantum nanowires does not depend on whether the bulk material is prepared in solidified form, or visco-liquid form, or partially soluble forms. Rather an object is to produce materials under whichever conditions are most appropriate for different practical technological needs, and for further manufacturing devices including quantum nanowires.

It is another object of this invention to provide methods for producing materials having quantum nanowires.

An additional object of this invention to provide new applications using quantum nanowires and methods for their manufacture.

These and other objects can be achieved by the manufacture of quantum nanowires comprising crystallized electron pairs. We unexpectedly discovered that electron pairs, organized in the form of two moving sub-crystals, can become highly energetically favored if the mean distance between compensating positive charges is within a range from about 1.2 nm to about 3.9 nm, corresponding to a local concentration of charges in the range of about $1.6 \cdot 10^{19}$ to about $6 \cdot 10^{-3}$ within or in close proximity to a quantum nanowire.

An especially desirable mean distance between positive charges in a quantum nanowire is about 2.4 nm, corresponding to a local concentration within and in close proximity of a quantum nanowire of about $7 \cdot 10^{19}$ cm$^3$.

Once formed, quantum nanowires containing crystallized electron pairs remain organized and can remain stable if certain general, broad conditions are fulfilled. First, the local concentration of moving negatively charged particles is kept within a certain range (within about one order of magnitude (10×)) controlled by relatively immovable molecular groups trapping positive charges. Next, the distance separating positive and negative charges within a conductive core of the quantum nanowire comprising crystallized electron pairs is within one order of magnitude of about 2 nm. Third, the viscosity of an insulating matrix surrounding and in close proximity to the conductive core is desirably greater than about $10^7$ Pa·s.

In contrast to conventional conductors, in which current is carried by a "free electron gas," particles of this invention comprise crystalized electron pairs having non-zero spin and each pair is simultaneously situated in nodes of a two-coaxial, quasi-one-dimensional sub-crystal. Being inherently ferromagnetic, the sub-crystals can persistently move in two opposite directions and cannot stop until the entire system is broken down by very high temperatures, in the range of a thousand Kelvins or more. In certain embodiments, the highest useful temperatures may not be determined by intrinsic stability of the ultra-highly conductive elements themselves, but rather by the integrity of the matrix in which the quantum nanowires comprising crystallized electron pairs are held. Thus, in certain embodiments in which a matrix can remain intact at temperatures even higher than about 700 Kelvins (characteristic of many organic matrices), the maximum useful temperature maybe in the range of thousands of Kelvins. The high thermal stability of the sub-crystals maybe due to the fact that both sub-crystals join each other to form a moving chain in which all the links between them are bound by quantum exchanges similar to chemical bonds.

We have found that for an appropriate medium, a precursor can be chosen among non-ionic dielectric substances based on covalently bound atoms. In certain cases, organic or element-organic molecular substances maybe suitable, as well as mixtures of both organic and inorganic molecules. A variety of different types of precursors may be used. They include, by way of example only, epoxys, polyoxypropylene diamine, molecular water, dimethylaminoethylmethacrylate, which when prepared, can form an amorphous medium. High molecular weight molecules suitable for forming liquid crystals include mesogenic groups as side substituents. Such mesogenic groups include by way of example only, cyanbiphenyl, ether groups, ester groups, and the like. Doping agents include, by way of example, alkali metals, organic acids, chromocene, and the like. However, any suitable dopant may be used if it can provide an enthalpy to the formation of charge transfer complexes of about 8 eV or more.

Some structural and thermodynamic characteristics of charge transfer complexes can affect the concentration of positive charges in the systems. A desirable combination of variables can be achieved if a special doping agent is introduced into a correctly formed molecular substance having covalently bound atoms. One advantage of such an approach is that chemical interactions between the substance and the doping agent need not be limited to solid state surface processes and can be easily organized within bulk materials. In this case, the resulting concentration of positive charges can depend on the concentration of the doping agent, which can be controlled easily. Different substances and doping agents may be used, but each pair of suitable molecular substance and its corresponding doping agent can be always considered as a specific combination, if the pair obeys some general conditions disclosed below.

To achieve these results, methods for forming quantum nanowires comprising crystallized electron pairs comprise the following steps. First, one can form a suitable molecular medium that provides both precursors of charge transfer complexes and has a viscosity in the desired range. Next, a dopant is introduced into the medium in an amount sufficient to produce a desirable concentration of charge transfer complexes in the vicinity of the future quantum nanowire. Finally, the charge transfer complexes are modified so that positive and negative charges become partially separated. Molecular groups of modified charge transfer complexes thus can obtain a new state, intermediate between a neutral and an ionic state which permits electron re-organization necessary for formation of crystallized electron pairs. Modification can be carried out using, for example, ultra-violet irradiation, heating, mechanical stress, or in certain cases, permitting the material to remain at ambient temperature for a sufficiently long period of time.

Regardless of the specific chemistry used, quantum nanowires having crystallized electron pairs can exhibit current carrying capacities of about $10^6$ Amp/cm$^2$ or more, conductivities in the range of about $10^7$ S/cm or more, and in certain cases, the conductivity can be so high as to be difficult to quantify.

In certain embodiments, quantum nanowires comprising crystallized electron pairs can be in the form of closed loops or straight chains. Materials having closed loops can exhibit giant diamagnetism and can be used as reflectors of electromagnetic waves, or alternatively, may be incorporated into any apparatus where strong expulsion from a magnetic field is desired. Alternatively, quantum nanowires comprising crystallized electron pairs can be used as nano-particles suspended in a liquid phase.

Once made, quantum nanowires comprising crystallized electron pairs can be manipulated to form useful devices. They can be extracted from solution to form thin, highly conductive wires with an insulating shell. Alternatively, quantum nanowires in medium can be manipulated either mechanically, electrically, magnetically, or in combination, to form various configurations and shapes suitable for electronic devices. Final forms of materials having quantum nanowires comprising crystallized electron pairs of this invention include solids, liquids, colloids, and plasticized viscous matter.

Using the materials of this invention having quantum nanowires comprising crystallized electron pairs, one can manufacture a wide variety of devices having practical utility. For example, one can manufacture nanoscale electronic circuits that have properties similar to conventional semiconductor devices, but on much smaller scales, and having substantially reduced power requirements. Additionally, however, new types of devices, based upon persistent currents within quantum nanowires can be manufactured. These include connectors, extremely fast switches, quantum optical-electronic components, electro-optical components, current limiters, sensors, motors, energy saving cells of a random-access memory device, Josephson-like junctions, and the like. Additionally, quantum nanowires of this invention can be used as ultra-highly conducting wires used as parts of power transmittance lines, inductors, transformers and accumulators of electromagnetic energy. Characteristic of these devices is nanoscale dimensions, very high conductivity and very low power consumption. In some cases, devices can be made having active quantum components, and in other situations, passive quantum components can carry out desirable functions.

BRIEF DESCRIPTION OF THE FIGURES

The invention will be described with respect to the particular embodiments thereof. Other objects, features, and advantages of the invention will become apparent with reference to the specification and drawings in which:

FIG. 4 depicts an intermediate state of electron quadruplet resulting from two primary electron pairs situated near-by.

DETAILED DESCRIPTION OF THE INVENTION

Definitions

Figure 1:
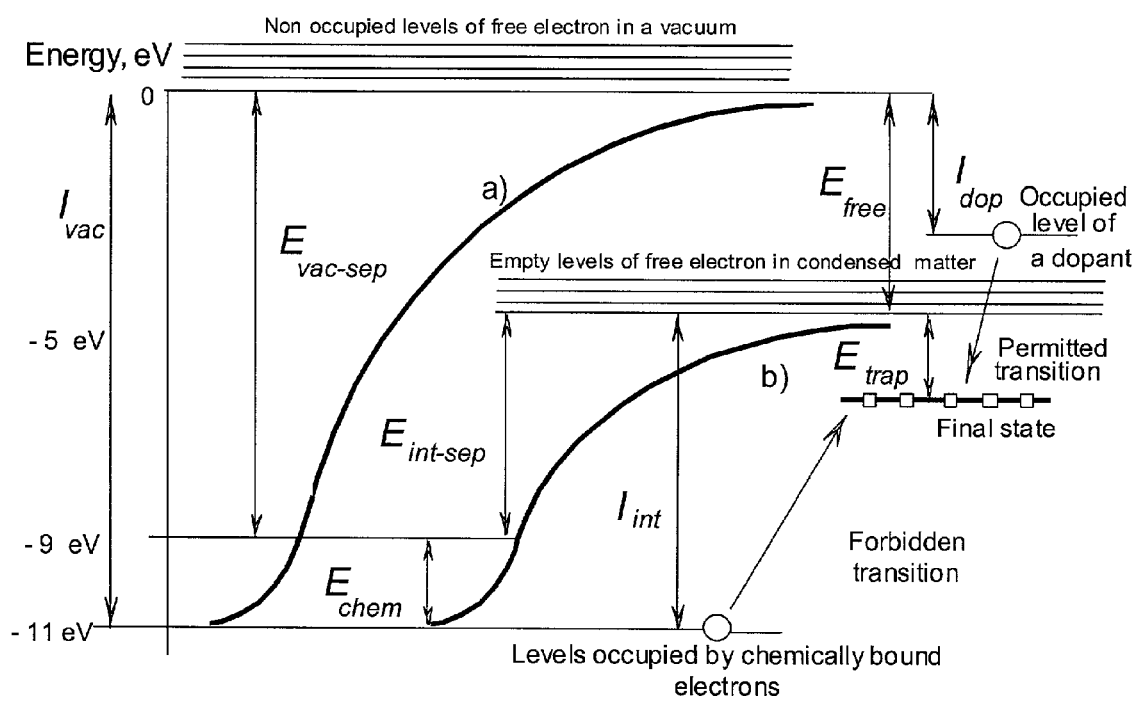
FIG. 1 depicts the energetic relationships of (a) ionization of organic molecules in vacuum, and (b) of transitions of electrons between different states in condensed dielectric molecular substances.

Prior to providing a detailed description of embodiments of this invention, some terms as used in the descriptions are defined.

As used herein, the term "nanowire" includes any good conductor having a transverse size about or less than 1000 um.

The term "quantum nanowire" includes a nanowire having significantly decreased resistivity based upon a quantum mechanical effect related to its dimensions in the nanoscale range.

The term "crystallized electron pair" is understood to be a stationary, quantum particle build of two bound electrons that exist in a quantum state having charge $-2e$ and integer spin.

The term "stable free electron in conducting condensed matter" is understood to include a stationary quantum particle having charge $-e$ and spin $S=\frac{1}{2}$ whose ground state energy is high enough to release an electron from an individual atom, molecular group, or even a whole molecule. In at least one dimension, the characteristic size of the electron's stationary wave function is significantly longer than the characteristic sizes of atoms, polarons, molecular chemical groups, and/or whole molecules constituting given type of condensed matter.

The term "ultrahigh conductivity" is used to describe conductivities of the materials of the instant invention for which mechanisms underlying the physical phenomenon are not fully understood. Conductivity is considered herein as ultrahigh if it ether exceeds the bulk conductivity of copper more than one order of magnitude, or if it exhibits continuous current carrying capacity about $10^4$ A/cm$^2$ or more in the cases which do not allow bulk characterization of conductivity. To avoid any potential confusion about the instant invention having properties similar to those of the prior art, we limit the use of the term "superconductivity" to refer to properties of prior art materials.

The terms "doping agent" and others used in describing the present invention are usually too broad and can be differently understood. In order to exclude any ambiguity and to clarify meanings of general terms we provide the following definitions. They relate to the scope of present invention only and in some cases they may be slightly different from conventional meanings:

1. The term "molecule" is understood to include a group of at least two atoms in which the stability of chemical structure uses interatomic covalent bonds, and has equal numbers of positive and negative charges represented by atomic nuclei and corresponding electrons. Molecules having molecular weights above 2000 amu are defined as macromolecules, whereas low molecular weight molecules are characterized by molecular weights equal to or less than 2000 amu. Thus, according to this definition, a molecule is, as a whole, an electrically neutral entity having zero net electric charge, in contrast to a molecular ion defined below.

2. The term "molecular substance" is understood to include matter in which all members are molecules kept together with the use of bonds other than covalent ones, represented usually by but not limited to weak intermolecular interactions, Van der Waals forces and the like. Such molecular substances may contain any combination of molecules differing in their molecular weights, chemical structures, physical properties, or combinations thereof. By definition, a molecular substance is electrically neutral and does not contain charge transfer complexes as defined below.

3. The term "molecular ion" is understood to include a molecule having any molecular weight, and in which there is a net electric charge. Electrical properties can be quantified by describing the absolute value of the difference between numbers of positive (eN$^+$) and negative (eN$^-$) charges is at least one electron charge e, or more. Mathematically, this condition can be expressed as abs$\{eN\}$=e abs$\{N^+-N^-\} \geq$ e because abs$\{N^+-N^-\} \geq 1$. The positive sign (+) of the difference within brackets corresponds to a positive molecular ion, and opposite sign − corresponds to a negative ion. This definition means the presence of non zero electric charge within whole molecule independently on any particular place of charge localization within the molecule.

4. The term "molecular group" is understood to include an electrically neutral molecular part built of at least two or more atoms connected mainly with covalent bonds. Some covalent bonds keeping the stability of chemical structure within given molecular group can exhibit a partial shift of electron density from one atom to next one resulting in their additional, relatively weak ionic interaction. The term "relatively weak" means that quantitatively, such covalent bond considered in close vicinity of its equilibrium distance provides higher binding force than an ionic attraction.

5. The term "polar molecule" (or "polar molecular group", or "dipole molecular group") is understood to include an electrically neutral molecule or molecular group which exhibits non zero electric dipole moment caused by significant electron shift in at least one covalent bond related to the same molecule or the same molecular group. For instance, a ketone group>C$^+$=O$^-$ is a typical example of strong dipole group having dipole moment about 2.7D.

6. The term "charged molecular group" is understood to include a molecular group which is not electrically neutral, because the absolute value of the difference between numbers of its positive and negative charges is more than zero, namely abs$\{N^+-N-\}>0$. In contrast to ionized state defined in above, a charged molecular group is allowed to have any fraction of electron charge, including but not limited to the case where 0<abs$\{N^+-N^-\}<1$. So, one can say that a molecular group is only partially charged at $0 \leq$ abs$\{N^+-N^-\}<$, and can become an ionized molecular group if $1 \geq$ abs$\{N^+-N-\}$. Two oppositely charged molecular groups bound together may be considered also as one polar molecule or a polar molecular group if their covalent and ionic binding satisfies quantitatively to definition 4 above.

7. The term "charge transfer complex" is understood to include an electrically neutral composition of two neighboring, oppositely charged molecular groups (or composition of molecular group(s) and atom(s), for instance: Na$^+$—OH$^-$ bound mainly with ionic interactions. These two groups (or one group and one atom) may be ether parts of same molecule or, in some cases, included into two different molecules situated near to one another. Both oppositely charged parts of a charge transfer complex may also be weakly bound with a covalent bond, which under these situations provides less binding force than Coulomb attraction between the parts. This condition makes a difference between charge transfer complex and a polar molecule or a dipole molecular group defined in accordance with definitions 4–6 above.

8. The term "doping agent" is understood with respect to a given molecular substance. It is understood to include any electrically neutral chemical compound, including either molecules, chemical elements, or any their combination, which, being introduced into said molecular substance in the form of whether vapor, or liquid, or solid (including metallic form), is able to initiate a chemical reaction resulting in the formation of either completely separated positive and negative charges, such as molecular ions and free electrons or polarons, or charge transfer complexes. Taking into account the complexity of chemical processes, this definition allows the same doping agent to participate also in other reactions which do not yield directly in electrically charged molecules or molecular groups.

Given these definitions let us consider step-by-step what conditions are desirable for correct formation of chemical precursors of quantum nanowires comprising crystallized electron pairs, procedures and conditions for their manufacturing, and methods of their further use for manufacturing of practical products.

General Description

We discovered that superconducting, triplet electron pairs, self-organized in the form of two moving sub-crystals, can become energetically preferable if the mean distance between compensating positive charges is within a range from about 1.2 nm to about 3.9 nm, corresponding to a local concentration of positive charges in the range of about $1.6 \cdot 10^{19}$ to about $6 \cdot 10^{20}$ cm$^3$ within and in close proximity to a quantum nanowire.

If this basic condition is not fulfilled, the result can be a two phase transitions. First, at a positive charge concentration above about $6 \cdot 10^{20}$ cm$^{-3}$, both sub-crystals can undergo quantum melting and the whole system becomes a usual 3-dimensional metal-like structure exhibiting no highly conductive properties. Alternatively, at a concentration of charges below about $1.6 \cdot 10^{19}$ cm$^{-3}$, the pairing of localized electrons becomes energetically less favored and instead, they prefer to exist in the form of either a pinned Wigner crystal or a highly conducting quasi-one-dimensional gas of free electrons, typical for superpolaron design at concentration less than about $10^{18}$ cm$^{-3}$, as disclosed in prior art U.S. Pat. No 5,777,292, incorporated herein fully by reference.

In contrast, conventional crystalline lattices built of ionized elements (for instance, different inorganic oxides) are not a desirable environment for quantum nanowires, because the distances between ions (typically less than 0.5 nm) are too short to permit a desirable degree of charge separation. Prior art chemical compositions and methods do not allow the ionic concentration to approach the minimum of about $1.6 \cdot 10^{-19}$ cm$^{-3}$ necessary for formation of quantum nanowires comprising crystallized electron pairs.

Embodiments of the present invention may be understood with reference to a theory discussed herein. Quantum theory suggests that multielectron systems placed in an appropriate environment of disordered positive compensating charges might exhibit desirable quantum properties, such as ultra-high conductivity in a wide temperature range of material existence. According to this theory, quantum properties can result from a self-organization of collective electron behavior. Nonetheless, practical problems remained to be resolved that relate to correct formations and subsequent treatments of substances containing such multielectron systems, in which a positively charged environment can result in electron self-organization within the system.

One theory, similar to some extent to Fradkin-Kivelson's conducting electron liquid crystal, may account for properties of the materials of this invention. This theory was worked out by L. Grigorov (*Phil. Mag.* B, Vol. 78, p. 353 (1998); and a more advanced version of the same was published in: *9$^{th}$ CIMTEC World Forum on New Materials*, (Florence, Italy Jun. 14–19, 1998), Symposium VI-Science and Engineering of HTC Superconductivity, Ed. P. Vincenzini, Techna Srl., 1999, v. 23, p. 675–684). According to this theory, in frameworks of the model of uniform jelly of positive ions, the exact self-consistent solution of a multielectron quantum system is found with the use of non-stationary Hartree-Fock approach, and a new type of time-dependent electron wave functions was conjectured. At increased concentrations of positive charges, exceeding those in typical superpolarons by at least one order of magnitude, electron-electron correlations can become sufficiently strong that a classic 3-dimensional Wigner crystal does not represent the ground state any longer, but rather, can spontaneously transform into a new, intrinsically ferromagnetic, conducting quantum phase. In contrast to a 3-dimensional classic Wigner crystal, this new phase corresponds to negatively charged particles in a quasi-one-dimensional crystal whose ground state energy is lowered up to about eV per electron by about one order of magnitude.

Thus, the most advanced non-conventional conductors described in points IV,c above, and according to this theory fall to a class in which immovable positive charges are disordered but negative charge carriers exist in well organized form of moving (or liquid) crystals of lowered dimensionality.

To emphasize the difference with the traditional term "superpolaron," a new quantum phase should be better called a "quantum nanowire comprising crystallized electron pairs." Reasons for that distinction include that: (a) superpolarons discussed in Class IIIc above represents only non-crystallized free electron quantum design; (b) on a phase diagram, the region of a superpolaron's existence requires the local ion concentration to be about $10^{18}$ cm$^{-3}$ or below; and (c) strong polarization of macromolecular medium is a main requirement for superpolaron formation. In contrast to that, the transition to the state of a quantum nanowire comprising crystallized electron pairs is caused by pure electron-electron interactions resulting in two main energetic components: (a) the gain of electron localization, and (b) the gain of exchange energy. Neither of these components depend directly on whether the molecular medium has a high or a low dielectric constant. However, the state of a quantum nanowire comprising crystallized electron pairs may be further energetically enhanced if it is present in an easily polarizable medium having dipole groups.

There are significant differences between Fradkin-Kivelson's electron liquid crystals and quantum nanowires comprising crystallized electron pairs described herein whose ground state exhibits the following pure quantum mechanical peculiarities. First, in a quantum nanowire comprising crystallized electron pairs, a negatively charged, quasi-one dimensional crystal is quantum mechanically split to two equivalent sub-crystals moving persistently, one through another, in two opposite directions along the same crystal axis. That means localized charges of both sub-crystals must collide periodically.

Second, relative speed of this collision obeys discrete quantization so that it cannot be zero. In other words, this relative movement cannot be stopped in the system's ground state.

Third, due to periodic collisions of negative charges localized in moving nodes of both sub-crystals, each particular electron has a time-dependent wave function. From the viewpoint of quantum mechanics, such electrons have no stationary states and may not be considered as individual particles. Instead, two electrons belonging to the same node of the crystal join together and form an electron pair becoming the only type of stationary quantum particles with charge −2e.

Fourth, each localized pair belongs equally to both colliding sub-crystals in order to reduce Coulomb repulsion of negative charges and to gain significant exchange energy. Obviously, such unusual behavior is inconsistent with classic physics. Nonetheless, in quantum mechanics it becomes possible due to the principle of quantum superposition as recently discussed by Nobel prize winner J. Schrieffer (arXiv: *Cond-Mat*/0012370, Dec. 19, 2000).

Fifth, a stationary state of persistently moving and colliding local pairs is allowed only if they are in triplet state providing paired spin S=1. Such triplet pairs do not belong to a Fermi-system, and as it follows from the conventional viewpoint, are condensed in the same quantum state as any superconducting particles do.

Sixth, such a system corresponds to one elementary quasi-one-dimensional nanowire domain having a typical diameter between 4 nm and 8 nm. All electron pairs moving in it with parallel spins have coherent wave functions, thereby providing the combination of superconducting properties with an intrinsic ferromagnetic state of each domain.

Seventh, domains can join and form 3-dimensional big quantum nanowires comprising crystallized electron pairs, which look like a bundle of parallel elementary nanowire domains and exhibiting either ferromagnetic or antiferromagnetic properties.

Notwithstanding rather unusual physical picture we would like to remind that the combination of specific features listed above is inevitable consequence of mathematically exact self-consistent solution of time-dependent Schrodinger equation where all main interactions within multielectron system are taken into account. The logic reason why such solution must correspond to real ground state is that it still keeps same energetic gain of electron localization as classic Wigner crystal and adds giant (about 1 eV per electron in optimized system) gain of exchange energy responsible for both electron pairing and ferromagnetic organization. The physical consequences of that is that such kind of superconducting particles can not be thermally broken until the temperature exceeds a few thousand Kelvins. In practice, that means that quantum nanowires comprising crystallized electron pairs in a real material should be able to keep their high conductivity at all temperatures at which the material is not thermally destroyed. At the same time, published quantum theory is still assuming idealized conditions including absolutely uniform positive compensating charge, and does not answer several important questions. First, how can one avoid a pinning effect in a real material where the positive potential cannot be so maintained constant? Second, what are suitable conditions for manufacturing of such materials?

The answers allowing the manufacture of materials and quantum devices based on those materials were found by the inventors of the present invention as described herein. Practical solutions of these problems are considered below step-by-step and are based on discoveries made by inventors.

I. Formation of Molecular Substances Containing Charge Transfer Complexes

One conventional way used in the prior art to get obtain high conductivity was to create free electrons, which by definition, are not bound with surrounding medium. This approach has not been fruitful for manufacturing of quantum nanowires within a medium mainly made of organic dielectric molecules. It is well known that a typical organic molecular substance corresponding to that in definition 2 does not allow easy creation of free electrons. One example of complete charge separation resulting in the appearance of positive molecular ions and free electrons is called an ionization. Under definition 1 above, molecular ionization potential I can be represented as a sum of two main components, namely the energy $E_{chem}=2 \div 3$ eV, necessary to break an intramolecular covalent bond, and a second term representing the Coulomb energy necessary to pull an electron from a remaining molecular ion to an infinitely large distance. The energy, $I_{vac}$, required to ionize an organic molecule in a vacuum is typically about 10–11 eV, but internal ionization of the same molecule within a condensed molecular substance, having a usually high frequency dielectric constant $\epsilon \approx 2$, requires less energy ($I_{it}$) in accordance with the equation $$I_{vac}=E_{chem}+e^2(R_{ion})^{-1}; I_{int}=E_{chem}+e^2(R_{ion})^{-1}/\epsilon \quad (1)$$

where e is the absolute value of an electron charge, $R_{ion}$ is the effective radius of the positively charged particle formed during ionization. It follows from expression (1) that if a small molecule having $R_{10}$ of about 0.15 m must be ionized, the total energy of charge separation within molecular substance $In_{int}$ remains as high as about $6 \div 7$ eV, corresponding to the window of optical transparency up to far UV-region of about 200 nm wavelength. Thus, spontaneous formation of free electrons in a dielectric molecular medium is thermodynamically disfavored unless this obstacle is overcome by specific means.

In the present invention, bulk manufacturing of new nanostructures called quantum nanowires comprising crystallized electron pairs starts from the creation of specific chemical precursors in which positive and negative charges are not completely separated. In this case, thermodynamic restrictions can be significantly decreased or, maybe even removed by several means discussed below.

One possible way to promote formation of quantum nanowires comprising crystallized electron pairs is to find a doping agent having a low ionization potential $I_{dop}$, and moving free electrons into empty levels of a conductivity band, as shown in FIG. 1. At the first glance, being simply blended with molecular substance such doping agent might become an independent source of free electrons even without specific chemical interaction with surrounding matter. Alkali metals presented in Table I are among other good candidates that are desirable if one can provide chemical stability, especially in reactions with trace amounts of water and oxygen molecules. However, while forming a proper medium for quantum nanowires comprising crystallized electron pairs, one can take into account that free electrons provided by doping agents into organic medium can be easily captured and localized by molecular groups having high electron affinities, $E_{aff}$ as shown with squares in FIG. 1, b. Due to Coulomb attraction, the most stable position of such a negatively charged trap is immediately in direct contact with the nearest positive ion. A result is that an electrostatically stabilized charge transfer complex can be formed in an organic medium even if the doping agent is able to release free electrons. Thus, the use of doping agents having low ionization potentials maybe very useful from the viewpoint of thermodynamics. The list of such agents provided in Table I is for example only, and is not intended to be limiting. It can be appreciated that persons skilled in the art can easily identify other agents that are suitable for this invention using data widely published.

TABLE I

Doping Agents for Forming Crystallized Electron Pairs

| Potential doping agents | Inorganic Elements and Molecules | | | | Organic and Element-Organic Compounds | |
|---|---|---|---|---|---|---|
| Chemical formula | Na | K | $Cs_2O$ | BaO | $(C_5H_5)_2Cr$ | $(CH_3)_3CH$ |
| Ionization potential(eV) | 5.14 | 4.34 | 4.45 | 6.5 | 5.5 | 6.93 |

Another promising approach does not require the generation of free electrons at all. In this case one can form a proper chemical composition of the molecular substance and then can introduce a doping agent (see FIG. 2a) which, in accordance with definition 8, can react chemically with the molecular substance and can initiate the transition of electron density from one molecular group to some other molecular group. Choice of desirable reagents results in breaking covalent bonds and thereby provides an electron and formats a charge transfer complex, as defined in definition 7 and as shown in FIG. 2b, comprises positively and negatively charged molecular groups contacting each other directly. Conditions for chemical reaction leading to formation of charge transfer complexes are defined by the specific chemistry of chosen reagents and may differ very strongly in each particular case. In some cases disclosed in the examples of preferred embodiments, this process can be performed in molecular substances having high viscosity, and in other cases, can occur in dilute solutions of the chosenmolecular substance. In the case of liquid phase reactions, no specific limitations for the concentration of charge transfer complexes is required.

FIGS. 2a and 2b are provided as an example of one particular process in which one molecular group of the substance reacts with a doping agent and becomes an electron acceptor, whereas another molecular group (shown on left side) acts as electron donor. To clarify this case, let us consider the system where a formed molecular substance, having no traces of water or oxygen molecules, contains both ester groups $R_1$—COO—$R_2$ and amino-groups $(CH_3)_2N$—$R_3$ whereas alkali metal (e.g., potassium) is a doping agent. Hereinafter $R_1$, $R_2$, and $R_3$ maybe different substituents, including but not limited to macroradicals or other moieties having complicated chemical structures. The reaction can be performed in the dissolved molecular substance, and can include at least two subsequent steps: a) initially an ester group reacts with an atom of alkali metal and becomes a negatively charged electron acceptor attracting a positively charged potassium ion (see Morantz et al. *Trans. Faraday Soc.*, v. 51, p.1375 (1955)). Then the reaction between this primary product and a neutral amino-group can result in a transfer of positive charge due to incorporation of the potassium ion into the amino-group. Finally, charge transfer complex, for example only, is formed as shown in diagram (2):

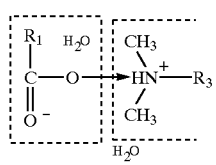

(2)

where both positively charged and negatively charged molecular groups contact each other and maintain a close proximity because of ionic binding. The chemical form of an initial doping agent can change during the reaction, and only products of its interaction with the matrix molecular substance may be found after the reaction is complete.

Other cases are also possible, including the use of doping agent for chemical formation of electron donor molecular groups, or alternatively, direct use of doping agent's molecular group as either donor or acceptor of an electron. For instance, the previously described situation (2) can be produced if a molecular substance comprises both similar amino-groups $(CH_3)_2N$—$R_3$ and some amount of water molecules, whereas organic acids having the general formula $R_1$—COOH is used as a doping agent. In contrast to the previous example (2), ionization potentials of organic acids are high (about 10–11 eV) but in the presence of water molecules they can easily dissociate and provide proton. That may be a reason why in molecular mixtures discussed above, even a few water molecules surrounding reagents may be enough to help proton to be transferred from an acid group to an amino-group. This process does not necessarily require the reaction to occur in liquid phase and may proceed in highly viscous media as well. The reactions can result in the formation of charge transfer complex, for example, shown in diagram (3):

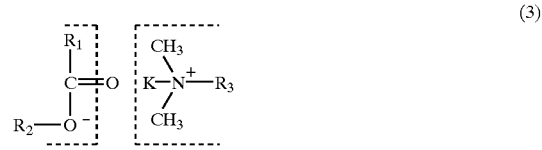

(3)

In some cases, a proper charge transfer complex satisfying definition 7 can be produced in a separate sub-step. For instance, some organic molecules R having relatively high electron affinity $E_{aff}$ can react with an element-organic compound shown, for example, in Table I, and can form stable charge transfer complexes of following structure: $[(C_5H_5)_2Cr]^+R^-$. Due to the transfer of an electron from a doping molecule to the acceptor R, this process becomes the first step in the formation of a molecular substance. If it is desirable, some other components may be later added to that molecular substance containing charge transfer complex previously made. The resulting medium remains an insulator because both positive and negative charges are bound within the internal structure of the complexes. Therefore, independently of the sequence of steps or particular chemicals chosen, nanowire production can result in form an insulating molecular substance containing precursors of quantum nanowires comprising crystallized electron pairs in the form of charge transfer complexes, namely products of the reaction initiated by the doping agent.

Several thermodynamic advantages follow from the above-described approach. The proper forming of a molecular substance, constituting the step (1) discussed above, provides, among others, three advantages. Additional advantages of this invention appear following subsequent steps, including step (2): the providing a desirable range of local concentration of charge transfer complexes within and in close proximity of desirable position of each quantum nanowire; and an additional step (3) of the inducing charge transfer complexes to increase mean distance between positively and negatively charged molecular groups. Increasing the distance between positively charged and negatively charged species can cause proper self-organization of negative charges.

To describe the thermodynamic advantages overall, we need to consider here contributions of all these steps taken together. First, the energetic gain $E_{dop}$ of the formation of charge transfer complexes can significantly exceed the chemical term approximated by equation (1), $E_{chem}$, if the molecular substance contains proper reagents.

Second, in order to decrease the Coulomb term in equation (1), one also can use proper molecular design, providing charge transfer complexes with a high effective $R_{ion}$. In general, the higher the $R_{ion}$, the greater the decrease in the Coulomb term. It is seen from FIG. 2b that a complex's effective radius $R_{ion}$ represents a mean shift of electron charge from positive to negative molecular groups, and should depend on the size and structure of both groups, especially if the acceptor group has a typical size ρ up to 0.3–0.4 nm, and if the acceptor group allows a wide electron charge distribution. In practice, at least $R_{ion}$=0.25–0.35 nm maybe easily attained if the remaining charge of positive group is also distributed between 15–20 atoms as, for instance, it takes place for big sandwich-like compounds $(C_5H_5)_2 Cr^+$ mentioned before. One can further increase the effective radius R up to 0.45–0.6 nm if the molecular substance also contains polar molecules or groups surrounding positive and negative parts of charge transfer complex, and thereby partially screens their electric fields. One can also get an $R_{ion}=0.7$ nm if especially big molecular groups, for instance having chlorophyll-like structures, participate in formation of charge transfer complexes. For anyone skilled in the art of organic chemistry and biochemistry, it can be appreciated that all explicit molecular structures are provided here for example only, and many other similar complexes can be synthesized which are within the scope of present invention.

Another thermodynamic advantage maybe obtained if a charge transfer complex is synthesized so that its non charged molecular group, designed to be electron acceptor, has a modestly high electron affinity $E_{aff}$ between about 0.4 eV and about 2 eV, desirably in between 0.7 eV and 1.7 eV, and most alternatively about 1.2 eV. $E_{aff}<0.4$ eV may not be desirable if there is too small an energetic gain, and if $E_{aff}$ is too large, the group may bind a electron too strongly and prevent its further participation in the formation of a quantum nanowire comprising crystallized electron pairs. There are many different organic molecules known to fall into desirable range of $E_{aff}$, especially among aromatic species having either an oxygen atom, an aldehyde group, an ester group as side substitutes, or a ketone group within an aromatic ring. Many different hydrocarbon radicals have $E_{aff}$ within a desirable range as well as hydrocarbon molecules having at least one double bond.

A further advantage, appearing after the 2nd and 3rd steps, is based on the fact that, in contrast to superpolaron, quantum nanowires comprising crystallized electron pairs don't require electrons to be infinitely far removed from a positive charge. Instead, in optimized quantum nanowires comprising crystallized electron pairs, the mean distance between positive charges should be about 2.4 nm and, therefore, the optimal mean distance between positive and negative charges $R_{el-ion}$ is expected to be about 2 nm. So, an optimal distance exceeds $R_{ion}$ by not too much, as shown in FIG. 2c. In the general case, $R_{el-ion}$ maybe a little bit more or less, somewhere in between 1 nm and 3.25 nm. This a transition from initial $R_{ion}$ to final $R_{el-ion}$ requires one to increase the distance between positively charged and negatively charged groups within the charge transfer complex by the term $(R_{el-ion}-R_{ion})$. Taking into account the range of potential variations of both components this term in parentheses, expressing the distance between separated positive and negative chemical groups, may be as high as about 0.3 nm, desirably in between 0.4 mu and 3 nm, and alternatively between 1.2 nm and 2.2 nm. In the final expression (4), this contributes negative energetic term $-e^2(R_{el-ion})^{-1}/\epsilon$, which expresses the decrease of the energy required for charge separation.

A yet further thermodynamic advantage appears as an energetic gain of electron pairing $E_{pair}$ of about 0.5–1 eV per electron following from specific electron interactions within a self-organized quantum nanowire comprising crystallized electron pairs.

Of course, some modest additional energetic gain $E_{pol}$ may be also added if one enhances a molecular substance with small polar molecules surrounding charged moieties and screening their positive and negative charges as shown, for example only, in FIG. 2c. For instance, a polar component may be represented by molecules of whether water, acetone, or many others included into the composition of the molecular substance in proper amounts. Obviously, similar gains may be also obtained if polar groups (e.g., different carboxylic groups or —CN groups) are present in the molecular substance as moieties of larger, flexible molecules, including but not limited to macromolecules. Energetic gains contributed by these dipoles can depend on many factors such as their concentration, chemical structure, mobility, and so on, and can be roughly evaluated in between zero and about 1 eV per complex. Nonetheless, in contrast to prior art, the presence of polar group in molecular substance is desirable but not necessary.

When the conditions above are satisfied, one can determine the energetic difference between a molecular substance in its initial non conducting state and in its final state containing quantum nanowires comprising crystallized electron pairs. The last one becomes thermodynamically profitable if that difference given in equation (4) is negative.

$$\Delta G = I_{int} - E_{dop} - E_{aff} - E_{pair} - E_{pol} - e^2(R_{el-ion})^{-1}/\epsilon = E_{chem} + e^2[(R_{el-ion})^{-1} - (R_{ion})^{-1}]/\epsilon - E_{dop} - E_{aff} - E_{pair} - E_{pol} \quad (4)$$

One can appreciate that at values: $R_{ion}=0.35$ nm, $R_{el-ion}=2$ nm, $E_{aff}=1.2$ eV, $E_{pair}=0.75$ eV, $E_{pol}=0.5$ eV, the whole expression (4) becomes negative if $E_{chem}=E_{dop}$. This last condition is easily satisfied realistic because both $E_{chem}$ and $E_{dop}$ represent comparable enthalpies of two chemical processes. The enthalpy of the doping process desirably exceeds about 3 eV, considered as typical for the energy of covalent bonds. Choice of suitable reactions can be made in order to provide a desirable relationship of their enthalpies. At the same time it can be appreciated that desirable thermal stability of nanowires over a wide temperature range can be achieved if $$\Delta G \ll 0. \quad (5)$$

The energetic gain of the doping reaction $E_{dop}$ desirably exceeds the energy $E_{chem}$ of covalent bonds in molecular substance at least 2 eV and preferably more than 3 eV. Correspondingly, EdOp desirably exceeds about 5 eV and preferably more than 6 eV. It is well known that some organic molecules and molecular groups, containing whether oxygen or nitrogen, may have chemical affinities for protons exceeding about 8 eV, and even more than 9.5 eV, whereas the energy of typical covalent bonds does not exceed about 3 eV. For instance, in accordance with M. A. Haney et al., *J. Phys. Chem.*, V. 73, p.4328 (1969), incorporated herein by reference, the proton affinity of the acetone $(CH_3)_2$ CO is found to be about 8.3 eV, and even higher proton affinity of amine-containing molecule $(CH_3)_2NH$ was found in between 9.3 eV and 10.4 eV in G. Briegleb, *Z. Electrochem.*, v. 53, p.350 (1949); R. Bonnacorsi et al., *J. Chem. Phys.* V. 52, p. 5270 (1970) incorporated herein by reference. Many other organic molecules, including aromatic ones, are known to have proton affinities between about 8 eV and about 8.5 eV, if their hydrocarbon structure is enhanced with ether hydroxyl, epoxy, ether or —CN groups. Based on an analogy between spherical electric fields of point-like protons and spherical fields of alkali metal ions, having electron shells of inert atoms, we have discovered that some amino groups can provide similar gains of about 8–9 eV to capture alkali ions instead of proton. Therefore, if a doping process involves either direct proton or proton-like transfer reactions, the quantum nanowires comprising crystallized electron pairs so created will survive for long periods of time, at temperatures up to the highest temperature of long-term material existence. However, above this temperature, the molecular substance may exhibit thermal decomposition. Usually, such temperatures are above about 500–550 Kelvins for most ordinary organic molecular substances, and maybe up to about 700 Kelvins for some special organic and element-organic molecular substances.

During a bulk doping process within molecular substance, the concentration of charge transfer complexes can be easily monitored with the use of a spectrophotometer. Charge transfer is usually accompanied by detectable changes in either ultraviolet or visible part of optical spectra of the molecular substance.

Thus, quantum nanowires comprising crystallized electron pairs can self-organize on the basis of crystallized negative charge carriers in combination with increased concentrations of compensating positive charges, formed with the use of a doping reaction. Such complexes can provide thermodynamic advantages in comparison with superpolaron design based on a quasi-1-dimensional, free electron structure and low concentrations of macromolecular ions.

Thus, according to the present invention, steps to be taken to provide desirable thermodynamic conditions of self-organization of quantum nanowire comprising crystallized electron pairs include:

I-i: Forming a molecular medium comprising chemical precursors of charge transfer complexes. Then the molecular medium is doped with doping agent to produce a molecular substance having charge transfer complexes whose oppositely charged molecular groups are in close proximity to each other;

I-ii: Inducing the molecular substance to form regions of an insulating matrix having local concentrations of charge transfer complexes of at least about $1.6 \cdot 10^{19}$ cm$^{-3}$. The matrix can desirably have local viscosity of about $10^7$ Pa·s or greater in order to satisfy kinetic conditions considered later herein;

I-iii: Increasing the distance between positively and negatively charged molecular groups in some charge transfer complexes to a distance of at least about 0.3 nm in order to a provide local concentration of positively charged molecular groups between about $1.6 \cdot 10^{19}$ cm$^{-3}$ and about $6 \cdot 10^{20}$ cm$^{-3}$.

In accordance with the definitions above, positively charged molecular groups mentioned in condition I-iii need not be completely ionized. The effective positive charge may be substantially less than +e. Quantum nanowires comprising crystallized electron pairs considered in frameworks of the present invention are based on substantial overlapping of immovable positive charges and negative current carriers that traditionally understood molecular ions need not exist in that system. In section V below, this feature will be discussed in more detail.

In addition to conditions I-i to I-iii described above, certain other desirable conditions can help self-organization of quantum nanowires comprising crystallized electron pairs and can increase thermodynamic stability of structures so made.

I-iv: The enthalpy of the doping reaction desirably is at least about 3 eV, desirably more than about 5 eV, and alternatively more than about 6 eV per one complex.

I-v: The mean separation of electron charges from donor groups to acceptor molecular groups of the complex is desirably at least about 0.25 µm, desirably more than about 0.4 nm, and alternatively, more than about 0.6 nm.

I-vi: Molecular groups of the electron acceptor desirably has electron affinity in the range of about 0.4 and about 2 eV, desirably between about 0.7 and about 1.7 eV, and most preferable about 1.2 eV.

I-vii: The molecular substance formed desirably can screen electric charges, such as molecular dipoles, either as low molecular weight polar molecules or as polar moieties within macromolecules. The concentration of molecular dipoles is desirably greater than at about $3.2 \cdot 10^{19}$ cm$^{-3}$ and alternatively between about $10^{20}$ cm$^{-3}$ and about $6 \cdot 10^{20}$ cm$^{-3}$. However concentration of dipoles is not critical. Rather, it is desirable that the concentration be at least about twice that of the positively charged molecular groups, and in alternative embodiments, more than about 4 times.

I-viii: The increase in the distance between positively and negatively charged molecular groups mentioned in point I-iii is desirably between about 0.4 nm and about 3 nm, and alternatively, between about 1.2 nm and about 2.2 nm.

I-ix: It is desirable for the local concentration of positively charged groups near a quantum nanowire comprising crystallized electron pairs mentioned in point I-iii to be between about $5 \cdot 10^{19}$ cm$^{-3}$ and about $10^{20}$ cm$^{-3}$.

There are additional desirable conditions related to kinetic properties relating to methods of manufacturing of quantum nanowires comprising crystallized electron pairs. These conditions will be considered in following sections.

II. Local Viscosity of Molecular Substances and Local Concentration of Charge Transfer Complexes A second step in manufacturing suitable materials having crystallized electron pairs includes, in general:

a) providing a molecular substance to form a local insulating matrix which has local concentrations of charge transfer complexes of about $4.5 \cdot 10^{19}$ cm$^{-3}$ or greater within or in close proximity to the future position of a quantum nanowire; and b) inducing the matrices to have viscosity of at least about $10^7$ Pa·s at about ambient temperature. It can be appreciated that these two steps (a) and (b) may be carried out at the same time.

From thermodynamic conditions described in point I-iii above, quantum nanowires having crystallized electron pairs can be self-organized in those local regions of a molecular substance where the concentration of positively charged groups falls in specific range. The first step described above involves chemical process to produce charge transfer complexes, that become precursors of quantum nanowires comprising crystallized electron pairs. However, to form quantum nanowires having crystallized electron pairs, the charge transfer complexes and the molecular substances require additional treatment. The concentration of charge transfer complexes in a reaction medium can depend on conditions of the first step, and may differ from the range mentioned. The second step is to adjust the concentration of charge transfer complexes in accordance with conditions described in point I-iii. Simultaneously, the second step can provide molecular substances with suitable values of local viscosity. It can be especially desirable for the local viscosity to be about $10^7$ Pa·s or higher at about ambient temperatures.

Factors which are relevant to the second step can depend on whether charge transfer complexes are created in diluted solution of the molecular substance, or whether they are created in concentrated visco-solid medium. These two possible cases have been illustrated by brief examples (2) and (3) before, and are considered separately below:

II-a Manufacturing Procedures with Charge Transfer Complexes Created in Viscous Molecular Substances In certain embodiments, charge transfer complexes are created in concentrated molecular medium. In certain cases, the medium has mechanical properties similar to a visco-solid state that is between solid state and a very viscous liquid state. A wide range of viscosities can be used in different embodiments adjusted for a desirable doping procedure. In some cases, a concentrated molecular substance maybe only slightly plasticized with low molecular weight components. Such slight plasticizing can increase diffusion coefficients and mobilities of molecular groups involved in doping reactions, can permit the use of small quantities of doping agents, and can permit the use of doping agents either in vaporized, solid or liquid state.

To fulfill thermodynamic condition I-ii, one desirably can use an amount of doping agent whose concentration is at least about $1.6 \cdot 10^{19} \, p^{-1} \, cm^{-3}$, where factor p<1, providing a final mean concentration of charge transfer complexes of at least about $1.6 \cdot 10^{19} \, cm^{-3}$ and desirably more than $4.5 \cdot 10^{19} \, cm^{-3}$. Their concentration in local regions may exceed this value by a factor of several times, providing even more desirable conditions for fulfilling conditions points I-iii) and I-ix). In these cases, the necessary concentration of charge transfer complexes within the insulating molecular matrix can be easily provided locally and become most likely places for quantum nanowires to form.

It can be desirable to provide sufficient viscosity of a medium in which quantum nanowires are formed. There are several methods to increase viscosity of a medium to desired values of about $10^7$ Pa·s at about ambient temperature or higher. One method involves evaporation of low molecular weight plasticizers from molecular substance by heating. Another method is to treat the substance in a vacuum for proper time. Another method is to mix the substance with an amount of a compound intrinsically having high viscosity. Yet other methods include partially cross-linking the substance by adding an appropriate chemical catalyst or applying short-wave ultraviolet irradiation sufficient to break some bonds in the chemical and to permit their reformation as a cross-linked matrix. These latter methods involve chemical compositions suitable for cross-linking. It can be possible that certain of these methods may cause some change of coefficient p mentioned above. Particular embodiments of the present invention have characteristic values of p, which corresponds to each particular combination of doping agent and molecular composition and takes into account the specificity of further processing including second and even third steps. A variety of particular values of p, corresponding to complete set of all necessary procedures, can be determined based on the instant disclosure. It is within the scope of ordinary skill to determine other methods for increasing the viscosity to desirable values.

It certain embodiments, and with the proper choice of materials, the first and second steps of quantum nanowire manufacture can be combined.

II-b Manufacture of Charge Transfer Complexes in Liquid Phase

In situations in which charge transfer complexes are created in a liquid phase of a diluted molecular substance, processing conditions may be different from those described above. The viscosity of a solution of dissolved molecular substance is much less than that of solid materials described herein above. Further, the mean concentration of charge transfer complexes may be much lower than in semi-solid, or highly viscous materials described by condition I-ii, even if coefficients $p^{-1}$>1 specific for the liquid phase conditions are considered. There are some general approaches that can be used which satisfy conditions suitable for manufacturing quantum nanowires comprising crystallized electron pairs in liquid media.

II-b-1 One approach is to evaporate the excess of the solvent to the point where the consistency of the molecular substance containing charge transfer complexes corresponds to the conditions described above in Sec. II-a. Then one can use all particular methods considered therein.

II-b-2 In some embodiments, it can be desirable to provide quantum nanowires that remain in solution. The growing concentration of charge transfer complexes in the solution can result in spontaneous aggregation of complexes begins resulting in formation of a colloid solution. Quasi-solid colloid particles containing suitably large local concentrations of charge transfer complexes can be suspended in the liquid phase containing the solvent. Thus, the localized concentrations of complexes within the colloids and their internal viscosity can satisfy conditions so that their further treatment (e.g., UV-irradiation considered in next section III) can be proceed directly in the colloid solution. Aggregates having high viscosity and high local concentrations of charge transfer complexes can provide a local insulating matrix where quantum nanowires comprising crystallized electron pairs can appear. The material can remain in the form of a colloid solution appropriate for manufacturing of many useful devices. If it is desirable, one can change the concentration of colloid particles with the use of ordinary methods known for preparative chemistry.

In other embodiments, one can extract quasi-solid aggregates from a colloid solution using, for example, filtration or sedimentation. Alternatively, other methods of extraction of aggregates known in the art can be used as well. After the extraction is complete one can use same methods given in Section IIa for further procedures.

III Modification of Charge Transfer Complexes Resulting in Quantum Self-Crystallization of Paired Electrons As stated above, the first and second steps can result in formation of charge transfer complexes where electron charge remains localized within a characteristic size $\rho=0.3-0.4$ nm of negatively charged groups directly contacting or nearby to positively charged groups, as shown in FIG. 2b. In that state, both the size of the s-type electron wave function and comparable with $\rho$ mean distance $R_{ion}$ between positive and negative charges are smaller than the mean distance between complexes. Thus, electrons belonging to two neighboring complexes do not typically overlap.

The inventors have discovered that active self-organization of a quasi-one-dimensional conducting crystal built of paired electrons (a "crystallized electron pair") may begin if a certain number of neighboring electrons begin to overlap. A practical way to achieve that is to modify charge transfer complexes so that the mean distances between positive and negative charges increases from a low value of $R_{ion}$ up to significantly larger value of $R_{el-ion}$ as shown in FIG. 2c. One can modify some part (M<1) of those complexes located in close proximity to the locations of future quantum nanowires after the second step described above. Therefore, the fractional value, M<1, reflects the simple fact that the concentration of all charge transfer complexes whether modified or not and defined by condition I-ii, is typically a little bit more, by factor $M^{-1}$, than defined by condition I-iii above. Particularly, the concentration of only those positively charged groups which become separated from negative charges, by the increased distance $R_{el-ion}$ after modification. In certain embodiments of this invention, the experimentally determined coefficient p mentioned in the previous section, includes the value M as an inherent factor. The final value of p can vary in different embodiments, and in many embodiments does not exceed 0.5.

By way of example, below we describe three different methods for modifying the materials to achieve suitable formation of highly conductive quantum nanowires comprising crystallized electron pairs. All three methods involve input of energy into the system, and all maybe represented by similar sequences of sub-steps, reflecting the sequence of the following physical events. (a) Initially, the modification leads to the formation of primary electron pairs, and (b) above a critical concentration, the interacting electron pairs can reorganize themselves to more stable forms of conducting quantum electron crystals.

III-a Modification of Charge Transfer Complexes

Figure 3:
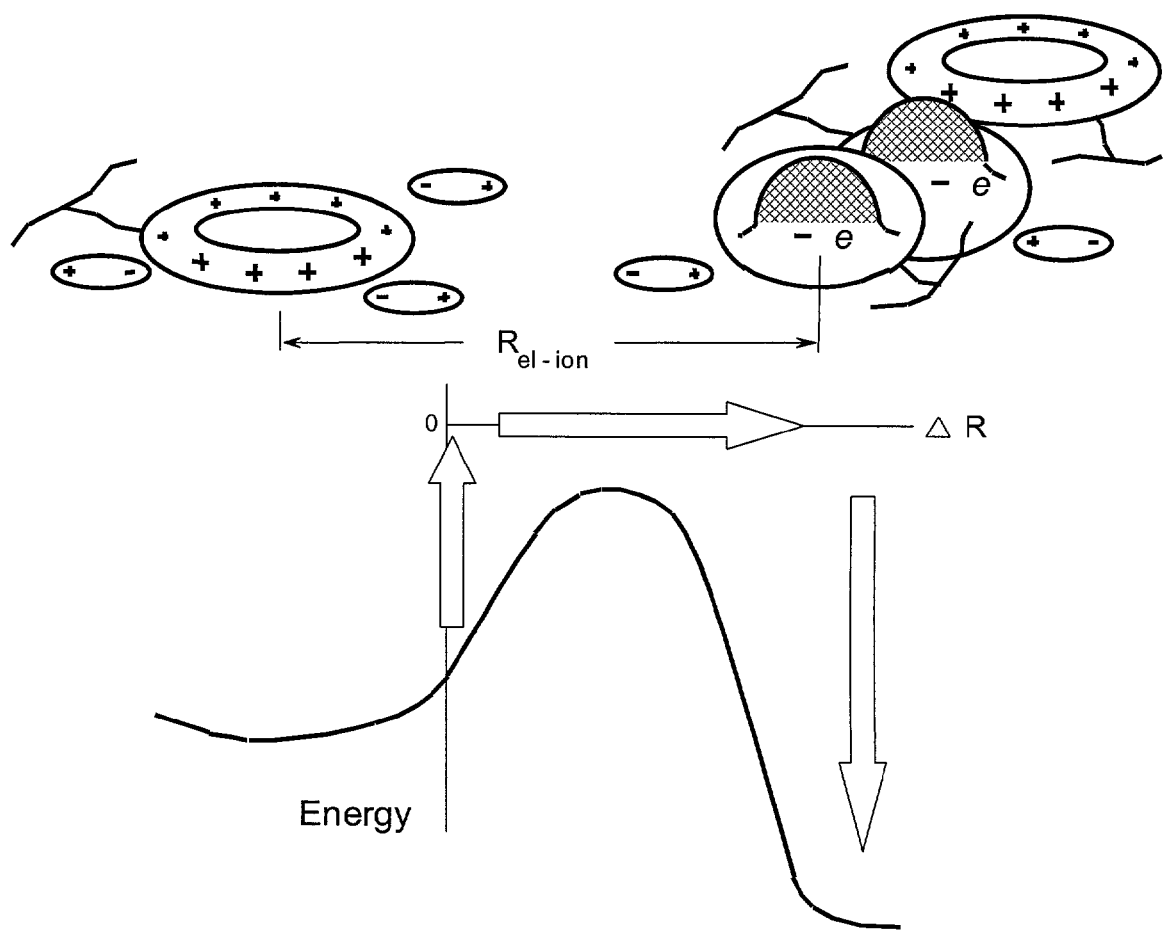
FIG. 3 demonstrates the sub-step of formation of primary electron pairs and the potential barrier which requires energetic activation to be overcome.

Providing energy into a medium containing concentrated charge transfer complexes can cause the $R_{el-ion}$ to increase, and also can cause additional disorder in the structure of the molecular substance. This disorder can lead to a statistical distribution of distances between negative charges, so that some of them are as small a distance as about 0.5 nm to about 0.7 nm. In that case, s-type wave functions of both neighboring electrons, having characteristic size of negatively charged groups ρ about 0.3–0.4 nm, begin to overlap partially. This overlapping can lead to electron exchange, which can result in decreasing the Coulomb repulsion and providing an energy gain. This energy gain, among other effects, can help to form primary electron pairs that can be localized near positively charged molecular groups as shown in FIG. 3. From a quantum mechanical viewpoint, the mechanism of that pairing can be considered similar to the formation of a hydrogen molecule when two hydrogen atoms are brought close together.

Stable pairing of two s-electrons sharing the same compensating positive charge is well known in solid state scientific literature as a formation of so-called bi-polarons (e.g., the paper A. S. Alexandrov et al., *Phys. Rev.* B, v. 33, No 7, p. 4526 (1986), incorporated fully by reference). In fact, a typical solid state bi-polaron is strongly bound to a positive node of a crystal lattice, whereas a primary electron pair in a disordered molecular substance can have weaker bonds with larger molecular groups carrying a delocalized positive charge. Such conditions do not change the principle that a primary electron pair must have zero spin S=0, and that its stable existence can be provided by an electron exchange interaction in the presence of compensating positive charge situated near-by.

Thus, inducing increased $R_{el-ion}$ can lead to modifications of initial charge transfer complexes, so that some positively charged molecular groups can become modestly separated from negatively charged ones, and that local primary electron pairs can appear that can provide a reasonable energetic gain as shown on right side of the diagram near the bottom of FIG. 3. However, FIG. 3 also shows that a spatial shift of negative charges can take place during modification and can result in electron pair formation that requires energetic activation in order to overcome a potential barrier resulting from an ionic bond between positive and negative groups of non-modified charge transfer complexes. The height of this barrier depends on many different factors, and can vary from about 1 eV to about 3 eV.

III-a-1 One method of such modification is to illuminate charge transfer complexes with light quanta, preferably in the visible or ultraviolet spectral region. Electrons captured by negatively charged groups become exited by such quantum and hop to any other 'empty' molecular group (i.e., having no captured electron) that has a sufficiently high electron affinity. While depending on the intensity of illumination, an electron can absorb another quantum and hop to another "empty" group. High intensity illumination can simultaneously excite many electrons that are weakly bound to acceptor groups, and can cause chaotic movement through a molecular medium in some ways comparable to Brownian motion. A primary electron pair can be formed when migrating electrons occupy two neighboring acceptor molecular groups in close vicinity to compensating positively charged molecular groups (this way is shown schematically on diagram of FIG. 3 with thick arrows). Broad spectrum illumination can lead to limited efficiency because high energy quanta are able to break electron pairs as easily as create them. Processes of photo-induced electron pair formation and decay can both be proportional to the light intensity, and therefore any increase in intensity can speed up the process of electron pairing, but does not adversely affect the level of dynamic equilibrium between concentrations of paired and non paired electrons. As illustrated in FIG. 3, photocreation of an electron pair can require less energy than that required to break of that pair. Thus, the equilibrium can be driven in the proper direction if a narrow spectral band is used. The use of high intensity lasers is one effective way to provide high concentrations of paired electrons in sub-step III-a-1.

III-a-2 Another method of modifying charge transfer complexes can be also used if the molecular substance used has an activation barrier below about 2 eV. In these embodiments, a similar kind of stochastic activation of electron migration may be achieved if one keeps the system for some time at an appropriate temperature below the decomposition temperature of the molecular substance. During the time, thermal fluctuations can cause electron migration and further transitions to thermodynamically more favored paired states. This method defines the equilibrium concentration of paired electrons as a function of both the temperature and energetic difference between paired and non-paired electron states as shown in FIG. 3. Higher temperatures can result in shorter periods of time necessary to drive the system to equilibrium, and simultaneously can result in a lower concentration of electron pairs in the medium. In other embodiments, ambient temperatures maybe used if rapid manufacturing is not required.

III-a-3 A third method involves application of mechanical stress to the molecular substance containing charge transfer complexes. Mechanical stress can cause plastic flow of the substance. Under plastic flow, neighboring layers of the substance can move with different velocities. Internal viscous friction involving positively and negatively charged molecular groups may cause their partial spatial separation resulting in a desired increase of $R_{el-ion}$. Such a mechanism may become especially effective if negatively and positively charged groups of the same complex belong to two different molecules. This method can create statistical distributions of distances between charges as well, resulting in formation of primary electron pairs. However, using this method, there are no high energy quanta or high temperature fluctuations that destroy electron pairs, and the concentrations of quantum nanowires can be greater than that obtainable using the two previous methods described.

These advantages result from the electrons of charge transfer complexes being localized and kept within negatively charged molecular groups serving as 'trucks' to carry captured electrons. The method of mechanical activation desirably satisfies some specific conditions originating from the fact that a trapped electron is pulled against an attractive force of positively charged groups of the complex. If the temperature is close or above an ambient one, and electron affinity of such a 'truck' can be too low, and the thermally hoping electron can escape from the trap and return back to the positively charged species rather quickly, even before the formation of a primary electron pair may be completed.

Thus, the velocity of mechanical charge separation in plastically flowing substance desirably exceeds the speed $\vartheta_R$ of the electron return process. The analysis of the speed of electron diffusion within molecular condensed matter in the presence of attractive electric field of positively charged molecular groups gives us the dependence of this speed $\vartheta_R$ on several important parameters. Such analysis has been provided herein on the basis of combinations of principles of chemical kinetics and mechanisms of thermal hopping of an electron. It results in the following expression:

$$v_R \cong \nu \rho \exp\left\{-\frac{E_{off} + E_{sol}}{k_B T}\right\}\left[\frac{2\rho}{3R_{el\text{-}ion}} + \frac{\sinh(8e^2\rho/\varepsilon k_E T R_{el\text{-}ion})}{\cosh(8e^2\rho/\varepsilon k_B T R_{el\text{-}ion})}\right] \quad (6)$$

where $\nu \approx 10^{13}$ s$^{-1}$ is the characteristic frequency of molecular oscillations, $k_B$ is the Boltzman constant, T is the absolute temperature in Kelvins, and $E_{sol} \geq 0$ is the additional energetic gain if negatively charged molecular groups are substantially solvated by polar groups present in a given molecular substance, namely:

$$E_{sol} \cong (\varepsilon^{-1} - \varepsilon_0^{-1})\frac{e^2}{2\rho} \leq 0.4 \text{ to } 0.5 \text{ eV} \quad (7)$$

(numbers correspond to $\rho = 0.3$ to $0.4$ nm and $\varepsilon_0 \leq 3$)

where $\varepsilon_0$ is the low frequency dielectric constant of molecular substance at the same temperature. All other parameters in (6) and (7) have been denoted before. Analysis of (6) is simplified by the fact that in whole practical ranges of sizes and concentrations of positively charged groups of present invention and at any reasonable temperature range the following estimation is useful:

$$8e^2\rho/\varepsilon k_B T R_{el\text{-}ion} \gg 1 \quad (8)$$

That is why the complicated term in square brackets in expression (6) has always the order of magnitude of 1 and can be omitted. On other hand, mechanical modification becomes effective if two sliding layers of flowing medium, separated by a small distance of similar order of magnitude as $\rho$, have a relative velocity $\vartheta$ more than $\vartheta_R$. A necessary speed gradient $d\vartheta/dz$ while flowing due to mechanical stress molecular substance can typically exceed the ratio $\vartheta_R/\rho$ expressed as follows $$\frac{d}{dz}v > \nu\exp\left\{-\frac{E_{off} + E_{sol}}{k_B T}\right\} \quad (9)$$

Quantitatively, the effective speed gradient following from (9) can desirably be between about $10^{-4}$ s$^{-1}$ and about $10^2$ s$^{-1}$ if $2 < \varepsilon_0 \leq$ about 3 and molecular groups involved have an electron have an electron affinity between about 1 eV and about 1.5 eV. Additionally, the temperature can be desirably between about 270 K and about 450 K. Higher speed gradients of plastic flow of molecular substance may be effective as well if some practical parameters of the process (i.e., electron affinity, temperature, and so on) are different from ones given above.

Another desirable condition relates to the fact that the force causing the modification of charge transfer complexes can occur because of viscous friction of both positively and negatively charged molecular groups moving with different velocities in neighboring layers of the molecular substance. In contrast, Coulomb attraction of the same groups can create an opposite force resisting that modification. Mechanical modification may be especially effective when the friction force exceeds the force of Coulomb resistance by about one order of magnitude or more, as expressed in equation (10) where $\mu(T)$ is viscosity of the molecular substance at given temperature T.

$$\mu(T)\rho^2\frac{dv}{dz} \gg \frac{e^2}{\varepsilon R_{ion}^2} \quad (10)$$

Finally, it follows from (9) and (10) that the viscosity of a molecular substance desirably obeys the condition given in the following formula:

$$\mu(T) \gg \frac{e^2}{\varepsilon\rho^2\nu R_{ion}^2}\exp\left\{\frac{E_{off} + E_{sol}}{k_B T}\right\} \quad (11)$$

At the same parameters and in the same temperature range as before, the condition (11) provides that a molecular substance can desirably have a viscosity at least $10^7$ Pa·s and most preferably to have a viscosity between about $10^8$ Pa·s and about $10^{13}$ Pa·s. Desirable ranges of viscosities can be achieved in some embodiments if a proper composition of molecular substance combines low molecular weight molecules with relatively low amounts of macromolecules able to increase the viscosity of the whole medium.

Conditions following from expressions (9) and (11) are applicable to many kinds of plastic flow regardless of the state of that substance, whether glassy, crystalline, or viscoliquid. Mechanical methods for forming primary electron pairs are applicable to viscous liquid molecular substances with no stress threshold and to solid molecular substances, whether crystalline or glassy, at stresses above their threshold of plastic flow.

Figure 4:
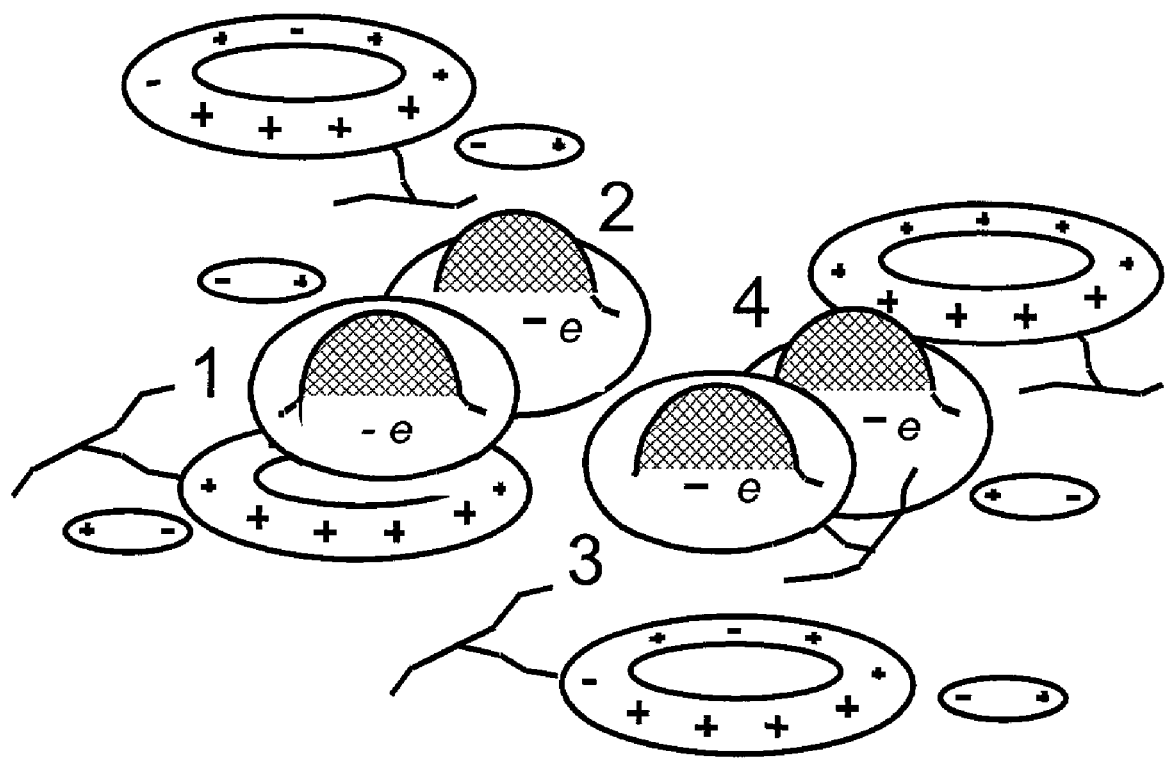

III-b: Design of 'Nuclei' of Quantum Nanowires Comprising Crystallized Electron Pairs Thus, independently on which method is used in sub-step III-a, the result is that some concentration of primary electron pairs shown in FIG. 3 appears in the molecular substance. These pairs are randomly distributed in the bulk medium, and therefore, some pairs may be separated by rather small distances. The increase in concentration of primary electron pairs can lead to smaller mean distance between them. Increasing the concentration of primary electron pairs thus increases the probability that in certain places, two similar pairs can be close enough to each other to form an electron quadruplet as schematically shown in FIG. 4. In FIG. 4, electrons of the first pair have numbers 1 and 2, whereas electrons of the second pair have numbers 3 and 4. Even at non zero electron affinity of keeping electrons acceptor groups, such quadruplet, having reduced distances between the four electrons, can be considered as an exited state having limited life-time (e.g., are metastable). Nonetheless, the presence of positively charged groups in close vicinity of the quadruplet can reduce the energy of this excitation to a relatively modest values about 1–2 eV, so that all the methods considered above in section III-a are capable of producing quadruplet-like structures.

Partial overlapping of wave functions of the electrons involved in such a metastable quadruplet system leads to its immediate (within a few femtoseconds) internal structural transformation from an excited state to a new quantum state having much lower energy and, therefore, much longer life-time. This transition is based on well known quantum mechanical principle that the ground state wave function of a system containing more than 3 electrons is not required to have antiparallel electron spins, and is allowed also to have so-called nodes. This means that electrons of such system are not limited to only s-type of wave functions, but rather may also possess functions of other types, for instance such as p- or d-type functions, and so on. Thus, we have discovered new, energetically more profitable states of quadruplet electron systems, herein termed "electron crystals" that combine these features as shown in FIG. 5.

Figure 5:
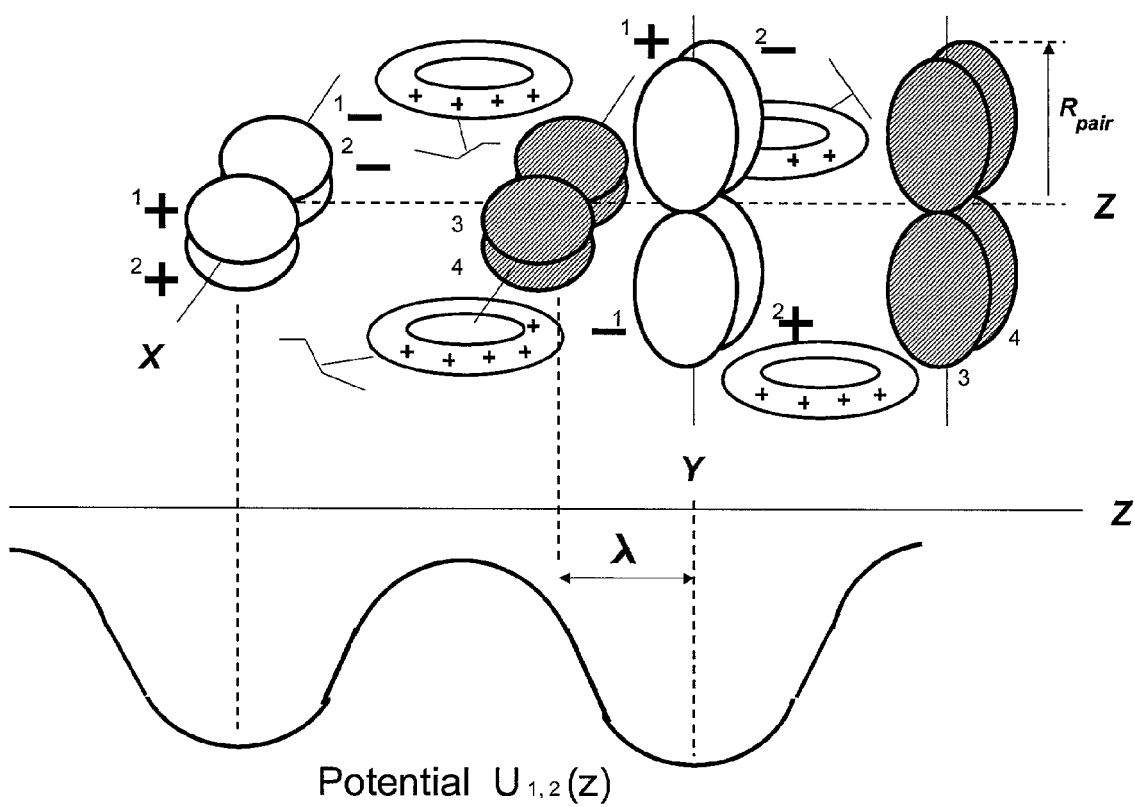
FIG. 5 depicts a stable quantum structure of electron quadruplet comprising crystallized electron pairs becoming a nucleus for a nanowire domain growth and comprising both localized p-type wave functions of bound electrons #1 and #2 forming a first couple, and the same functions of electrons #3 and #4 forming a second couple (shadowed).

FIG. 5 depicts such a stable quadruplet built of two identical electron pairs, each pair existing self-consistently in an attractive field of positively charged molecular groups and repulsive field of the other electron pair. For instance, considering the first pair, electrons 1 and 2, a repulsive field for them is created by electrons 3 and 4 shown shadowed in FIG. 5. In summary, both attractive and repulsive fields can produce the potential $U_{1,2}$ (z, x, y) shown on the bottom of FIG. 5, and consists of two symmetric potential wells localizing electrons of the first pair. A self-consistent solution of the Schrödinger equation, found by the inventors, states that each of the two first electrons can be distributed between both wells in the form of two perpendicularly directed fractions of its wave function ($p_x$ in left well and $p_y$ in right well). Resulting complete function 1 is symmetrical along z-axis, and the function 2 is an antisymmetric one as marked by corresponding signs near the wings of the p-functions in FIG. 5. That is why both functions 1 and 2 are orthogonal and, therefore, electrons 1 and 2 can have parallel spins forming the first triplet pair with spin S=1. Both functions 1 and 2 coincide in the space, and in some embodiments, there may be little or no shift as is intentionally shown in FIG. 5. Rather, the shift shown is for more convenient viewing only. Such overlapping of electrons 1 and 2 can result in large exchange gain, which can counteract their Coulomb repulsion, and in certain embodiments, counteracting up to about 90% of their Coulomb repulsion. Such counteracting can result in an energetic gain of electron pairing of between about 0.5 eV and about 1.5 eV, when the radial distribution of p-wings is concentrated within modestly high radius $R_{pair}$ of about 2 nm, and the parameter $\lambda$ characterizing the z-axial distance between neighboring quadruplet electrons is within the range of about 0.5 nm to about 1.5 nm. Optimization of both parameters $\lambda$ and $R_{pair}$ is defined first by the mean local concentration of positively charged groups, and second by the concentration and dipole moments of polar groups which may also be present within the medium. For simplicity of illustration, polar groups are not shown in FIG. 5.

Similar considerations are applicable to second electron pair built of electrons 3 and 4. Thus, both electron pairs are substantially equivalent from the viewpoint of their energy, quantum design, and the state of electron spins. Such equivalence leads to the unpredictability of which pair occupies the left and right position at a given moment in time. In other words, the situation shown in FIG. 5 can be realized with probability 0.5, and the other probability 0.5 corresponds to the second possible case in which both electron pairs exchange their positions. That means that first pair (1, 2) must move in right direction, whereas second one (3, 4) moves simultaneously in left direction, and such periodic exchange commonly occurs. Therefore this process can result in the wave function of each electron pair being split into (or represented by superposition of) two components simultaneously moving in two opposite directions. These components may be called as left-moving and right-moving "half-pairs" where each electron half-pair keeps exactly the same paired quantum design as discussed above but can be considered to be two "halves" of different electrons' wave functions. Thus, the complete charge of the right-moving half-pair is equal to −e as well as the charge −e of left-moving half-pair. It can be understood that only probabilities of electron detection are split in the mathematic solution corresponding to this physical picture, but electrons, being basic particles are not physically split. A more general discussion of quantum mechanical nature of electron splitting may be found in recent paper of Nobel prize winner J. Schrieffer (arXiv: *Cond-Mat*/0012370, Dec. 19, 2000).

One more factor appears from the representation of paired wave functions as a superposition of two components moving periodically forth and back. The half of first pair moving from left to right must periodically collide with that half of second pair which moves at the same time from right to left. Such periodic collisions can provide additional gain of exchange interaction between the electron pairs. Quantitatively, this gain is a function of parameters $R_{pair}$ and $\lambda$, and falls typically between about 0.35 and about 1 eV per electron if the following desirable conditions are fulfilled: first, spins of both colliding triplet pairs are desirably parallel; and second, the orthogonality of colliding wave functions should be preserved at any moment during the collision, notwithstanding their periodic complete overlapping. The last condition may be fulfilled when their allowed relative velocity is quantified as follows:

$$V = \frac{\pi k}{m_e(1+2k)\lambda} \tag{12}$$

where h is Planck's constant, $m_e$ is the electron mass, and k is any integer from the series $$k=1, 2, 3 \ldots \leq N-1; \tag{13}$$

where N is number of electron pairs involved in such collision.

The total energetic gain of such an unusual quadruplet's quantum design is at least about 2.4 eV and preferably between about 4.5 eV and about 6 eV. Obviously, these numbers substantially exceed initial the relatively modest Coulomb excitation of 1–2 eV and, moreover, are high enough to provide reliable stability of new persistently moving quadruplets with binding energy up to about 1 eV per electron. Three important conclusions follow also from expressions (12) and (13). First, at finite N velocity V can never be zero and, therefore, back and forth movement of half-pairs cannot be stopped without destroying the whole system. Second, the quadruplet design corresponds to the minimum number of participating electron pairs N=2, thereby providing the highest velocity V at the only possible value k=1. And third, velocity V can be further significantly decreased at higher values k>>1 if the number of participating electron pairs can be N>>2. Therefore, such electron systems have a natural motivation to increase the number N of participating electron pairs as much as possible, because the decrease of V leads to the drop of kinetic energy of moving half-pairs. Once formed, a quadruplet system is ready to start self-organization of a nanowire immediately after one provides external conditions suitable for formation of the quadruplet system. That is why the quadruplet is "nucleus" for organization of quantum nanowires comprising crystallized electron pairs.

III-c Self-Organization and Growth of Stable Quantum Nanowires Comprising Crystallized Electron Pairs In accordance with design shown in FIG. 5, even in the smallest "nucleus system," persistently moving pairs of electrons can interact with all other particles placed within a quasi-cylindrical "active" volume $v_{nucl} \approx 6\pi\lambda(R_{activ})^2$ having length about $6\lambda$ and an effective radius $R_{activ} \approx R_{pair} + \rho$. One can easily find that at highest $R_{activ} \approx 3$ nm and $\lambda$ of about 1.5 nm this volume does not exceed about $v_{nucl} = 260$ nm$^3$. Spontaneous growth of quantum nanowires comprising crystallized electron pairs can occur if the wave function of a "nucleus system" has a volume high enough to overlap and to begin exchange interactions with at least two other charge transfer complexes situated near-by. If this is the case the nucleus system can incorporate two additional immovable electrons, trapped before within negatively charged groups of said complexes whether modified before or not, and can convert their electrons into an additional, persistently moving electron pair, because such transition is energetically favorable. Two consequences follow from that consideration. First, these two charge transfer complexes become new positively charged molecular groups situated either within or in close proximity of a growing nanowire, and second, the volume of the quasi-cylindrical structure can increase because the incorporation of two electrons can result in its elongation from $6\lambda$ to about $8\lambda$. Thus, the added volume is about $\Delta v_{add} = 87$ nm$^3$. The teaching of present invention provides that the growing volume permits the same incorporation of another couple of charge transfer complexes, and to continue similar processes up to a final point where no new complexes can participate. The growth process does not stop until the probability of finding two new complexes in added volume remains to be about 1. At a value of $\Delta v_{add}$=about 87 nm$^3$, this condition may be fulfilled if the local concentration of charge transfer complexes near a growing quantum nanowire exceeds a value of about $4.5 \cdot 10^{19}$ cm$^{-3}$. Desirably, it is between about $9 \cdot 10^{19}$ and about $5 \cdot 10^{20}$ cm$^{-3}$. This range can be especially desirable because of two possibilities: (a) the added volume can be a few times less than about 87 nm$^3$, and/or (b) the previously mentioned factor P of the transformation of charge transfer complexes into positively charged molecular groups is typically less than 1.

The highest volume of a "nucleus system" $v_{nucl} = 260$ nm$^3$ contains four negative electron charges, and corresponds to the lowest local concentration of compensating charge, represented by positively charged molecular groups situated within and in close proximity of a quantum nanowire, at least about $1.6 \cdot 1019$ cm$^{-3}$. On other hand, the highest local concentration desirably does not exceed about $6 \cdot 10^{20}$ cm$^{-3}$ in order to avoid transition to the state similar to a conventional metal. Naturally, the most desirable values are between these two extremes, and correspond to concentration ranges between about $3 \cdot 10^{19}$ cm$^{-3}$ and about $2 \cdot 10^{20}$ cm$^{-3}$, and most preferable values are between about $5 \cdot 10^{19}$ cm$^{-3}$ and about $10^{20}$ cm$^{-3}$.

The process described demonstrates how an initial quadruplet system appearing as a result of statistical fluctuation becomes a "nucleus" for spontaneously growing quantum nanowires comprising crystallized electron pairs in which a gradual increase in the number N of incorporated triplet electron pairs reflects the effects of a so-called Bose-condensation applicable to any self-consistent particles having integer spin.

Figure 6:
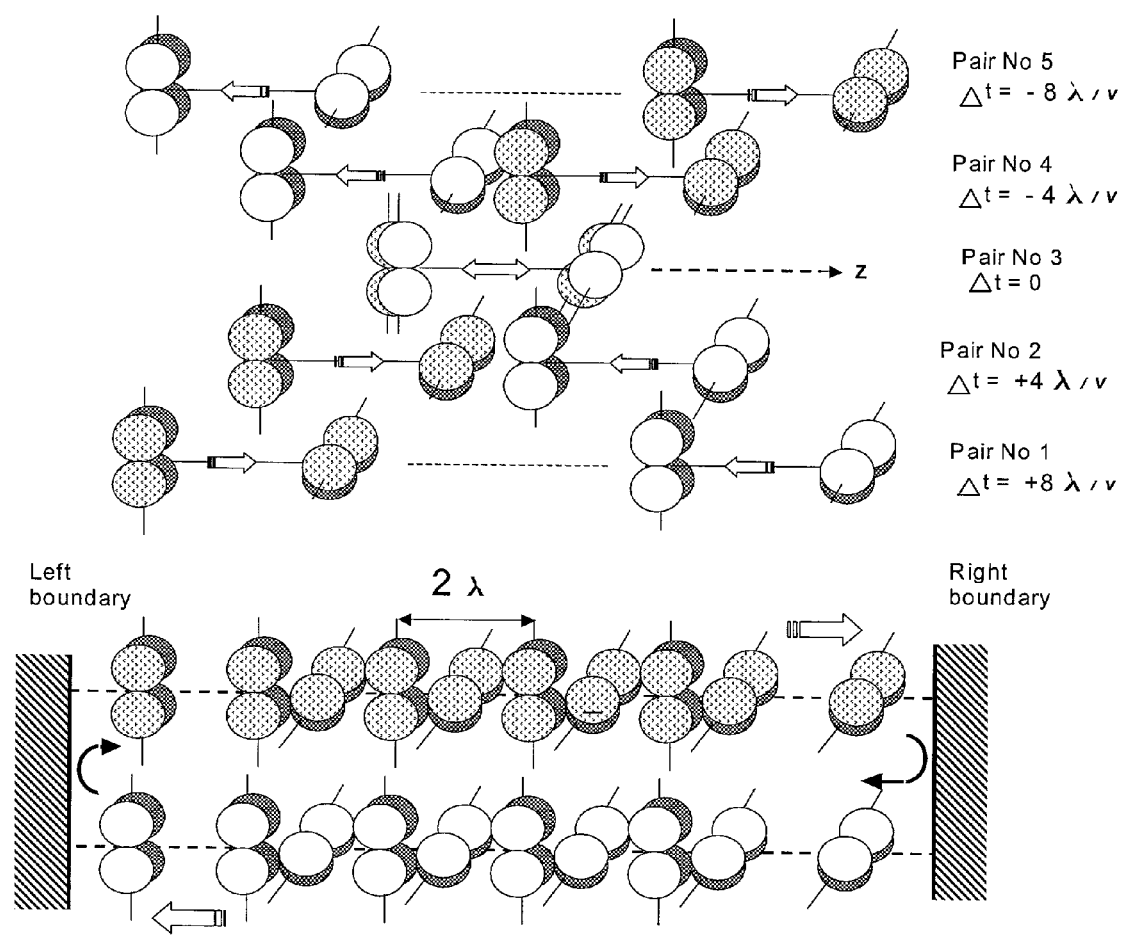
FIG. 6 depicts internal structure of negative charges of a nanowire domain comprising two persistently moving sub-crystals (shown near the bottom) built of electron pairs (shown separately near the top).

IV Nature of Crystalline Structure of Quantum Nanowires Comprising Crystallized Electron Pairs: Main Physical Properties and General Basis for Quantum Devices A simple structure of a growing quantum nanowire comprising crystallized electron pairs maybe called a "quantum nanowire domain" as depicted in FIG. 6 as an example only, in which second half-electrons of each half-pair are shown on the background as slightly shadowed. To be more clearly illustrated, this example is limited to depicting only five electron pairs, but it can be readily appreciated that the total amount of condensed pairs defining the length of the nanowire, have no theoretical limitation. All electron pairs are centered on the same z-axis, but for structural clarity the position of each pair on z-axis at given moment t=0 is shown separately in the upper part of FIG. 6, and their right-moving half-pairs are marked with point shadowing. All right-moving half-pairs have the same shape of their wave functions, and the only difference between them is the time shift $\Delta t_n$ provided on right margin of FIG. 6. Because the speed of all right moving half-pairs is the same, the time shift results in their periodic shift along the z-axis by constant distance $2\lambda$. That is a reason why the assembly of same right-moving half-pairs on their common z-axis is a desirable, quasi-one-dimensional sub-crystal shown shadowy near the bottom of FIG. 6. The first negatively charged sub-crystal moving in a rightward direction keeps its form as a whole, because all half-pairs situated in its nodes move coherently with the same speed in the same direction. Similar considerations related to the leftward-moving half-pairs lead to the formation of a second negatively charged sub-crystal, similar to the first one in regard of its structure, but moving in a leftward direction as shown on the bottom of FIG. 6 (without shadowing). This example demonstrates how coherent triplet electron pairs having charges −2e and spin S=1 can become elementary units used to build both right- and left-moving sub-crystals. Due to conditions previously discussed, spins of all pairs are parallel and, therefore, the whole nanowire domain built of two persistently moving sub-crystals can exist in a ferromagnetic state.

When the structure of assembled sub-crystals is analyzed, another feature becomes apparent. In FIG. 6, due to the "dumb-bell-like" shape of each half-pair, two pieces of both left- and right-neighbors penetrate inside and get an exchange interaction gain, equivalent to a chemical bond, because of overlapping of crossed $p_x$ and $p_y$ orthogonal orbitals having the same spin direction. That forms each sub-crystal as a strong chain of chemically bound half-pairs.

The example shown in FIG. 6 corresponds to zero macroscopic current because the centers of mass of all pairs remain in the same point and all pairs have zero momentum. At the same time, due to evident periodic modulations of electron density, such a crystalline structure can be directly observed with the use of non-contact diffraction methods. They include conventional low angle X-ray diffraction and, in the case of relatively thin surface layers, low energy electron diffraction. In any case, to be directly observed, the material is required to have the concentration of nanowire domains above the threshold of the method's sensitivity.

Thus, rigorous solutions of the time-dependent Schrödinger equation shows that in such systems, only electron pairs of that kind are stationary particles, condensed together on same energetic level corresponding to well defined ground state energy of the whole system. Pairing energy depends on several factors and cannot be less than 0.5 eV and more than 2 eV. At the same time, all electrons have only non stationary, time-dependent wave functions with no definite energy at all. From the viewpoint of quantum mechanics, such electrons cannot be treated as self-consistent entities, and a better approach is to consider that these persistently moving sub-crystals are built of electron pairs but not of electrons. Moreover, in accordance with definitions given herein, even these non stationary electrons cannot be considered as free electrons. That is because first, they have no ground state energy at all, and second, the localized wave function of each particular non-stationary electron remains always within a small volume of the same order of magnitude as the volume of usual molecular groups.

A useful feature of a crystalline structure built of negatively charged localized particles (i.e., electron pairs) is that it can be a current carrier. Moreover, it possesses features common to all conventional superconductors, as collectivized electron pairs condensed on the same energetic level and having zero momentum in the absence of external excitation. Nonetheless, if one provides such excitation, the persistent movement of half-pairs allows that crystalline structure to move as a whole and to carry non zero current without dissipation of the energy. In addition to ferromagnetism, there is one more new property making that system substantially different from conventional superconductors. A nanowire's pairing energy is about 1 eV by the order of magnitude and, correspondingly, a critical temperature $T_c$ of transition may be expected in the vicinity of at least few thousand Kelvin degrees. Therefore, the Meisner effect, considered in frameworks of its classic understanding, becomes non-observable because such high $T_c$ is well above of the temperature of molecular material decomposition. That is a reason why even extremely high conductivity of quantum nanowires comprising crystallized electron pairs should be characterized with the term "ultrahigh conductivity."

High pairing energy of about 1 eV explains also why, in contrast to classic Wigner crystals, there is no pinning effect in quantum nanowires comprising crystallized electron pairs if they are produced in accordance with the teaching of the present invention. The reason is that positive molecular groups, separated by high mean distance about 2 to about 3 nm, having size $\rho$ well above 0.3 nm, provide strong delocalization of compensating positive charges whose electric fields may be additionally screened by surrounding polar groups and molecules. Combined together, all these features produce rather modest stochastic modulation of mean positive background, which does not exceed 0.5V and is much below the pairing energy described above. Therefore, moderate disturbances in such systems can have little adverse effects because moderate disturbances are not able to break up the electron pair and thus, cannot stop their persistent movement.

Based upon the above description, there is no theoretical maximum length of nanowire domains. Taking that into account, FIG. 6 shows that the right boundary reflects right-moving sub-crystal and converts it coherently to left-moving sub-crystal as shown by the rounded arrow. Obviously, similar processes can occur simultaneously on the left boundary. That allows persistent movement of both sub-crystals to continue for indefinitely long time periods, even though the nanowire domain has a finite length. The nanowire's macroscopic current is equal to zero in two cases if boundaries are made of thick insulating material or if no voltage is applied between the boundaries made of conducting materials. In both these cases the reflection coefficient is precisely equal to r=1 and oppositely directed sub-currents carried by the persistently moving sub-crystals can compensate each other. Non zero macroscopic current can be experimentally observed in at least the following three general cases.

IV-a: The reflection coefficient becomes r<1 when boundaries are made of conducting materials (for instance, normal metal electrodes) and a non-zero voltage is applied between them. This voltage U≠0 compels the center of mass of negatively charged pairs to move in the direction of positive (e.g., to the right) electrode. In this case, the right-moving half-pairs reach the positive electrode with increased speed, allowing them to leave the nanowire domain with probability 1−r>0. Simultaneously, some deficit of negative charge appears near the negative electrode because left-moving half-pairs must decrease their speed in order to keep necessary condition described in expression (12) for constant relative velocity V. That is why the negative (left) electrode, having the excess of normal electrons, begins to provide them to the nanowire domain with same probability 1−r>0 in order to cover the deficit and to restore the number of pairs lost on the positive electrode. Thus, under such conditions, two sub-currents can't compensate each other any longer because of the difference of absolute velocities of two sub-crystals, and this difference leads to macroscopically observed currents within the quantum nanowire domain.

Figure 7:
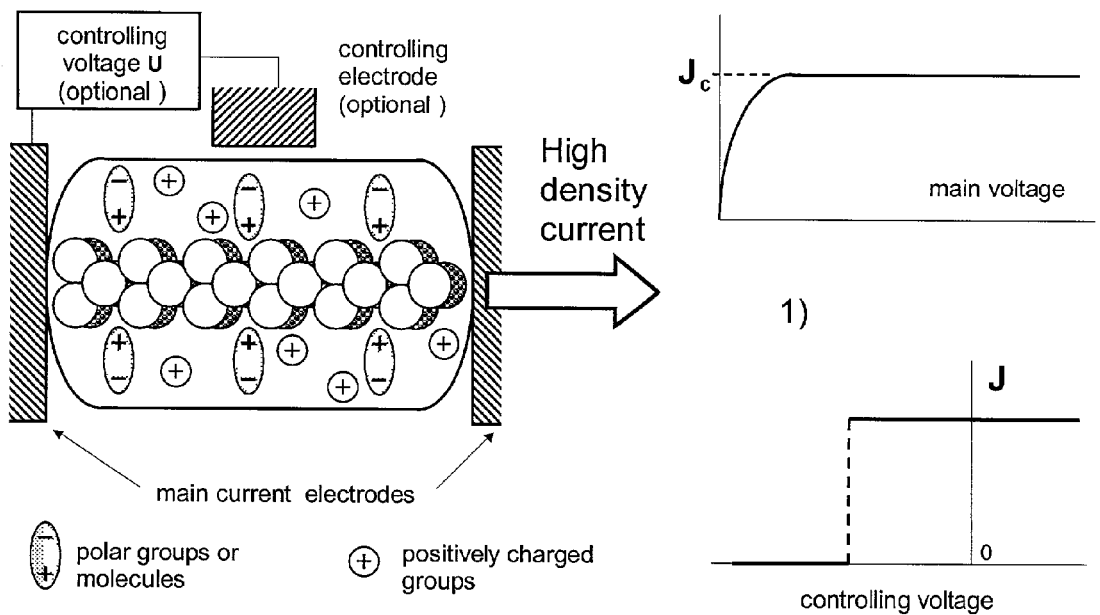
FIG. 7 depicts schematically two designs of conducting elements comprising at least one linear quantum nanowire domain comprising crystallized electron pairs: (1) a high current density element; and (2) a Josephson contact element.
Figure 7:
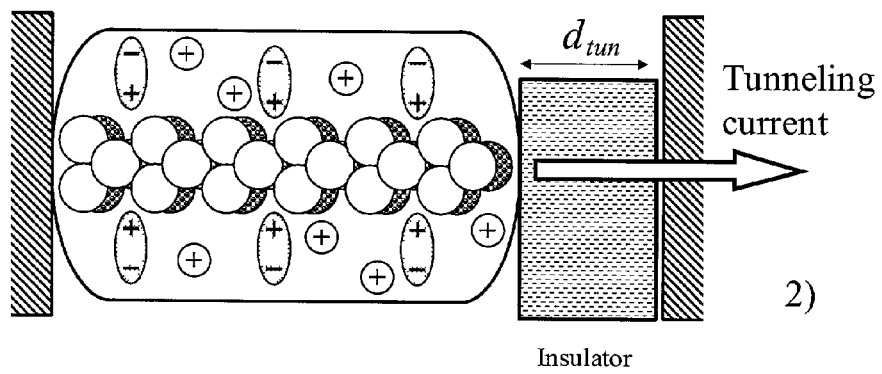

The current carrying capacity of such system, which can be also called critical current $J_c$, can be reached when one sub-crystal gets zero speed and the second one gets a maximum speed V, equal to about $2 \cdot 10^7$ cm/s at k=1 and λ=0.5 nm in accordance with condition described in expression (12). Therefore, within the range λ from 0.5 nm to 1.5 nm, corresponding to the mean axial density of charges of each sub-crystal between about $0.3 \cdot 10^7$ electron/cm and about $10^7$ electrons/cm, the critical current of one quantum nanowire comprising crystallized electron pairs domain is between about 7 μAmp and about 70 μAmp. One can see that at the domain's effective radius $R_{domain} \approx 3$ nm, its critical current density, as described by expression (12), can be between about $2 \cdot 10^7$ A/cm$^2$ and about $2 \cdot 10^8$ A/cm$^2$ by the order of magnitude. Practical embodiments of present invention demonstrate that a quantum nanowire's DC current carrying capacity exceeds $10^6$ A/cm$^2$ within temperature ranges from about 0 Kelvins up to about 470 or 490 Kelvins. High current DC measurements are typically limited by melting of resistive metallic electrodes and by long-term thermal stability of molecular substances placed between hot electrodes. While short-term pulse measurements partially avoiding both those measurement obstacles, real current carrying capacity has been found as $J_c$ to be about $2 \sim 10^8$ A/cm$^2$ or few times more at all temperatures up to about 700 Kelvins. A simplified design of a high current density passive conducting element is shown in FIG. 7-1. It comprises at least one linear quantum nanowire comprising crystallized electron pairs domain situated between at least two main current electrodes which have to be connected with an external source of the current, and are preferably made of metal. Such passive elements can be also used as quantum current limiters as follows from its typical I-V curve shown near the top of FIG. 7-1. The shortest distance between both ends of a linear nanowire cannot be less than about $3\lambda_p$ where $\lambda_p$ is understood as periodicity of electron pairs in a quasi-one dimensional current carriers of a quantum nanowire domain comprising crystallized electron pairs. It has been described above that a minimum $\lambda_p$ is about 1 nm and $3\lambda_p$ must be at least about 3 nm or greater.

An interesting alternative embodiment can be used to transform a passive conducting element into a quantum switch if a third (optional) electrode is electrically isolated from a quantum nanowire comprising crystallized electron pairs and is situated sufficiently close enough to it. A controlling voltage applied to that electrode can create an external electric field, and therefore, can form within a nanowire a potential "bump" which is able to pin sub-crystals if the controlling voltage exceeds a certain threshold. A second I-V curve, shown near the bottom of FIG. 7-1 depicts that such pinning stops any current completely. The quantum nature of charge carriers makes such transitions, controlled by external voltages, extremely sharp because sub-crystals can be ether pinned or not pinned, but they cannot have any intermediate state. The time of that field-induced transition between on-off states inherent for a quantum switch is shorter than about $10^{-12}$ s.

Figure 2:
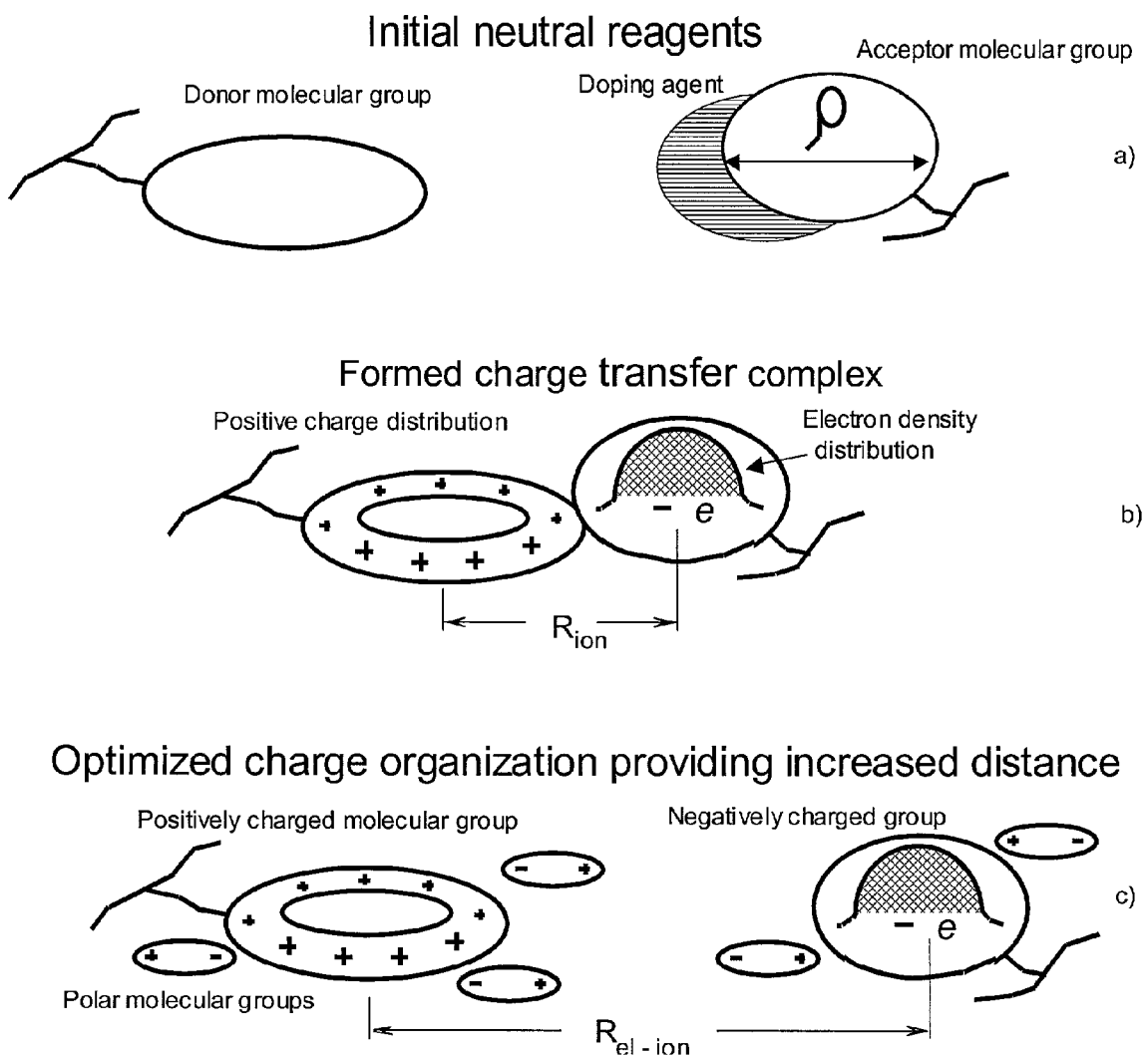
FIG. 2 shows schematically the distributions of positive and negative charges at different stages of chemical and electronic transformation of molecular substance: (a) before doping reaction within molecular substance; (b) within charge transfer complex formed while the first step of manufacture described herein; and (c) at optimal distances between charges resulting from the third step of manufacture described herein.

IV-b: An additional, passively conducting element comprises two electrodes made of a conducting material, at least one quantum nanowire domain comprising crystallized electron pairs, and at least one insulating layer between the electrode and the end of said domain as shown in FIG. 7-2. An insulating layer having typically the thickness $d_{tun}$ of between about 0.5 nm and about 3 nm is thin enough to be transparent for tunneling currents to transport electrons and electron pairs. This case results in the formation of Josephson-like contacts useful in some applications. A peculiarity of these contacts is that their reflection coefficient $0 \leq r(U) \leq 1$ can depend on the applied voltage U, thereby providing specific current-voltage characteristics typical for the so-called "stationary Josephson effect" and is observable by direct electrical measurements. Related to Josephson contacts, non stationary quantum mechanical effects are observable in opto-electronic measurements in the near infrared region of the optical spectrum corresponding to typical pairing energies of about 1 eV. These observations demonstrate that based on quantum nanowires comprising crystallized electron pairs, Josephson-like contacts are able both to generate optical signals of said region and to serve as receivers transforming optic signals to electric signals. To provide quick switching on and off, a Josephson-like contact as shown in FIG. 7-2 can be also supplied with a third electrode similar to one shown in FIG. 7-1.

In the case of any element shown in FIG. 7, the external electric circuitry involved has always non zero resistance independently on extremely high internal conductivity of quantum nanowire comprising crystallized electron pairs. That is because electrodes made of conventional conducting materials inevitably contribute their own contact resistance if they are not in a superconducting state.

Figure 8:
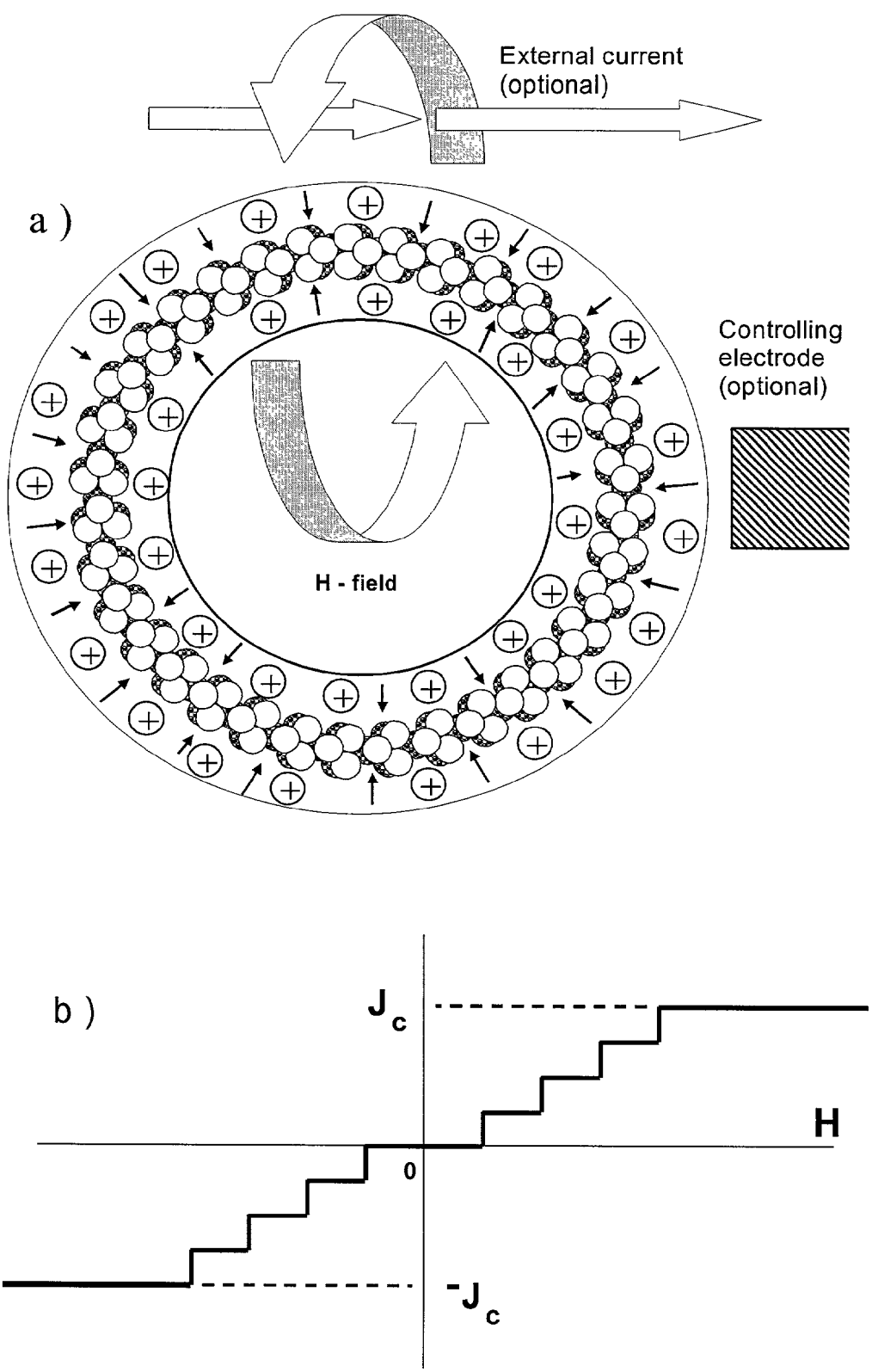
FIG. 8 depicts schematically a design of a persistently conducting element comprising (a) at least one quantum nanowire domain comprising crystallized electron pairs in the form of closed loop; and (b) the dependence of the intensity of its persistent current on the intensity of an external magnetic field.

IV-c: The reflection coefficient is zero (r=0) when a relatively long quantum nanowire domain comprising crystallized electron pairs is formed as a ring-like closed loop, in which both ends of the domain are electrically connected together. The length of the domain must significantly exceed a minimum value of about 3 nm, whereas the distance between domain's ends must be much shorter than $2\lambda \leq 3$ nm. In this case, there are no boundaries at all, and a non zero, persistent current can be electro-magnetically induced in such a loop if one changes the magnetic flux within its area. For instance, such magnetic changes can be caused by an external current passing within any conductor situated not so far away from the loop. Another possibility is if the change of is caused by high frequency electromagnetic wave. Taking into account the extremely high conductivity of a quantum nanowire comprising crystallized electron pairs, the circulating persistent current, being once induced, may persist for very long periods of time. Therefore, such a loop can exhibit a high degree of diamagnetism over a wide range of temperature. A simple design of a passive, ultra-highly conducting nano-element possessing the property of diamagnetic and comprising at least one quantum nanowire domain comprising crystallized electron pairs in the form of closed loop is shown in FIG. 8a. An induced current is limited by the value Jc, and obeys quantum mechanical rules applicable to a closed loop of micro- or nanoscale size. The magnetization of this element has a step-like dependence upon an external magnetic field as shown in FIG. 8b. Several different applications of closed loops are possible.

In one case, a material filled with such loops can be used as a shield reflecting electromagnetic waves with high efficiency. Same materials can possess the property to create substantial force sufficiently large to expel the material from any external magnetic field independently of its frequency. Due to an ability to carry non-zero persistent currents, such closed loops can be used as energy storage devices.

Another design shown in FIG. 8a can be used in microelectronics. It comprises a quantum nanowire loop comprising crystallized electron pairs and a controllable source of external magnetic field, and can be used as energy saving element of random access memory, combining short access times of less than about $10^{-11}$ s with an ability to store the information while the power is off. Technical characteristics of such memory devices can be further provided if one provides an electrostatic, controlling electrode situated near the closed loop.

Direct contact electric measurements are not easily applicable to loop-like quantum nanowires because of the absence of a place for contacting electrodes. However, indirect examination of closed loop quantum structures and their internal electric properties can be carried out with the use of either macroscopic magnetic measurements of the bulk material or by magnetic imaging of thin films provided by atomic force microscopy in non-contact modes.

In this section, we have described mainly the structures and physical properties of small quasi-one-dimensional units called quantum nanowire domains comprising crystallized electron pairs, having very low diameters of about a few nanometers. Parallel domains can join each other to form more thick, bundle-like structures having diameters from nanometers to micrometers and are called quantum nanowire bundles. Nonetheless, their main features can be understood on the basis of properties of quantum nanowire domains comprising crystallized electron pairs discussed above. Thus, larger quantum nanowire bundles also fall to the same three general categories represented schematically in FIGS. 7 and 8. Being initially created in the form of passively conducting nano-elements, they provide a basis for a wide spectrum of useful nano-devices including active ones.

V. Manufacturing Devices Comprising Quantum Nanowires Comprising Crystallized Electron Pairs In previous sections, physical processes and proper treatments of materials can result in producing bulk molecular substances which comprise self-formed quantum nanowire domains comprising crystallized electron pairs, which, in turn can form bigger structures called quantum nanowire bundles. We have discovered methods for manipulating quantum nanowires based upon the molecular substance involved in the nanowire's structure and other conditions. These conditions can depend on the components of the quantum nanowire and their mutual interactions.

Figure 9:
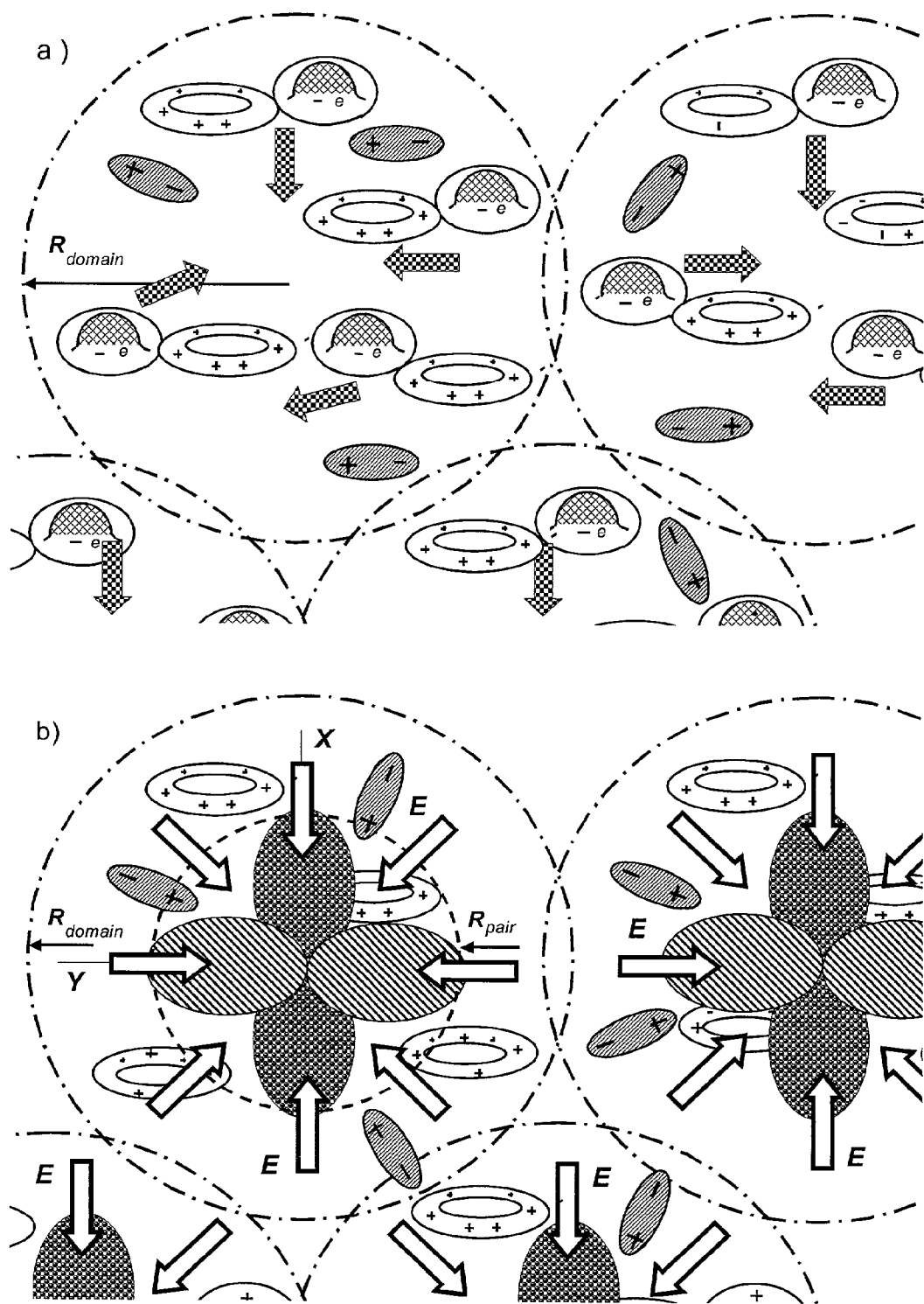
FIG. 9 depicts two states of a molecular substance following one after another during nanowire formation: (a) a first stage of randomly distributed charge transfer complexes with no significant electric field (shadowed arrows show directions of further electron displacements); and (b) a cross-section of a massive nanowire self-assembled in the form of the bundle of parallel nanowire domains (thick white arrows show the direction of cylindrical electric field within each domain).

Chemical processes of the first step described above can result in the appearance of charge transfer complexes distributed in bulk molecular substances randomly, as well as non-oriented polar molecules or polar molecular groups whose presence in the medium can be desirable (FIG. 9a; shadowed ellipses). Nanowire domains begin to grow statistically, but due to a strong requirement of electric neutrality, their final structure may only have the form of a three-dimensional bundle, where parallel quasi-one-dimensional domains are joined together to form a more thick quantum nanowire comprising crystallized electron pairs. Dash-dotted circles in FIG. 9a represent the future cross-sections of domains having radius $R_{domain}$, whereas checked arrows depict directions of electron displacements during further charge self-organization. The cross-section of formed quantum nanowire comprising crystallized electron pairs is shown in FIG. 9b, where repulsive, negatively charged quasi-one-dimensional crystals quickly find optimal distances, greater than about 4 nm, and desirably between about 5 nm and 7 nm. Magnetic interaction between neighboring domains can depend on this distance so that a nanowire is in a ferromagnetic state when separated domains have parallel spins, and in an antiferromagnetic state when decreased distance between domain axis' causes their spins to be antiparallel.

In contrast to light electrons, heavy positively charged molecular groups of randomly distributed charge transfer complexes cannot move quickly, and some of them take place within smaller radius $R_{pair}$ about 2 to about 2.5 nm and some in between $R_{pair}$ and bigger radius $R_{domain}$ about 3 to about 3.5 μm. After electron self-organization, the local density of negative charge within $R_{pair}$ can exceed that of positive charge about $\gamma \approx 20\%$ to about 30%, and each nanowire domain resembles a cylindrical capacitor having an effective negative charge within $R_{pair}$ and a effective positive one closer to $R_{pair}$. Given the above values of $R_{pair}$ relate only to a majority of the fraction of negative charge, of about 90% and more desirably between 90–95%, whereas the remaining 5–10% of the same charge creates very modest negative background concentrated outside of said radius $R_{domain}$. Such a design depicted in FIG. 9b shows that only partial separation of positive and negative charges takes place in quantum nanowires comprising crystallized electron pairs, and no moieties or molecules can be fully ionized in this kind of quantum system.

Partial charge separation can create an internal cylindrical electric field E shown in FIG. 9b by thick white arrows. One can easily calculate that at $\lambda \approx 1$ μm, the typical intensity of this field is at least $10^6$ V/cm, and is strong enough to result in two important consequences. First, the field can orient molecular dipoles and therefore can increase long-term stability of quantum nanowires comprising crystallized electron pairs because of formation of a deep potential well decreasing the ground state energies of charges involved. Usually this well has a cylindrical form if it is in close proximity to a nanowire and the concentration of dipoles is at least about two to about three times more than that of positively charged groups, and preferably more than five times. Second, same field causes strong Coulomb force F attracting positive charges from big radii about $R_{domain}$ to smaller radii about $R_{pair}$.

$$F \cong \gamma \frac{2e^2}{\varepsilon_0 \lambda R_{pair}} \approx (1.3 - 6)10^{-11} \text{ N} \quad (14)$$

One has to take into account that in highly viscous substances this force, applied to each positive charge near the surface of cylindrical domain, is quasi-statically distributed within the mean surface area $S = 2\pi\lambda R_{domain}/\gamma$ having the order of magnitude about 0.3 to about 1.5 $10^{-12}$ cm². Being directed to the axis of each nanowire domain such forces create increased internal pressure P expressed as follows $$P = \frac{F}{S} \cong \gamma^2 \frac{e^2}{\pi\varepsilon_0 \lambda^2 R_{pair} R_{domain}} \approx 0.05 \text{ to } 0.6 \text{ MPa} \quad (15)$$

Internal pressure P caused by electrostatic forces appears only within domains and cannot exist in that part of molecular substance which is not involved in these nanostructures. Moreover, even between neighboring nanowire domains, the molecular substance is not strongly compressed due to field intensity along ring-like boundaries shown in FIG. 9b with dash-dotted circles being close to zero. The pressure of that range, following from expression (15) can be sufficient to cause a so called "mechanical transition" to a glassy state, in which disordered molecular substances are characterized with increased density (e.g., up to about 10% to about 15%) and sharply decreased solubility in organic solvents. Increased density within self-compressed quantum nanowires can be easily monitored by conventional optic microscopy in phase contrast mode.

A consequence is that after manufacturing of quantum nanowires in bulk molecular substance containing proper fraction of macromolecules, one can choose such solvent which, on one hand, quickly can dissolve passive regions (i.e., molecular substances containing no nanowires), and on other hand, does not change self-compressed molecular substances within nanowire domains. Such selective action provided by proper solvents leads to the preparation of colloid solutions where passive parts of molecular substances are in a dissolved state, whereas bundled nanowires or even single nanowire domains are suspended in a liquid phase as non-dissolved micro- or nanoparticles. This property can be readily exploited to provide easy ways to manipulate with them.

V-1. One type of useful manipulation of colloid solution includes concentrating nanowires by different means, including but not limited to the use of: (a) filtration; (b) sedimentation with the help of a centrifuge due to increased density of nanowires differs usually from that of the solvent; (c) non-uniform electric and/or magnetic fields to attract colloid particles to areas of increased field intensity. Nanowires can have increased electric and magnetic susceptibilities, permitting them to be moved to desired locations.

V-2. Another type is the manufacturing of wide class of microdevices where quantum nanowires comprising crystallized electron pairs are embedded into a relatively thin layer in the X-Y plane and are preferably oriented in normal direction in order to produce ultrahighly conducting elements directed along the Z-axis (e.g., across the thickness of the film).

V-3. A further type is the manufacturing of more complicated microdevices in which quantum nanowires comprising crystallized electron pairs are used in the form of either linear ultrahighly conducting structures, or of circled ones, or both in combination, and are preferably directed in same X-Y plane of the thin support.

V-4. A yet further type is the manufacturing of long self-insulated electric wires for the use as either power transmittance lines or as a part of an inductance coil. These devices can be used to provide storage of energy in the form of a high intensity magnetic field.

Each of these four types uses its own method of manipulation of quantum nanowires comprising crystallized electron pairs discussed below in detail, but all of them deal with differently concentrated solutions of quantum nanowires. It is desirable for such approaches to be carried out in a proper solvent system in which quantum nanowires remain to be non dissolved for the time $\tau_{manuf}$ long enough for the manufacturing procedure, which may continue typically from a short time about 10 s up to a long time of about $10^6$ s. During manufacturing, the internal pressure P obeying expression (15) is desirably preserved at least for $\tau_{manuf}$ and alternatively for as long as the useful lifetime of the product. However, the internal pressure can be lost if the force F obeying expression (14) moves positively charged groups from radius $R_{domain}$ to smaller radius $R_{pair}$ too quickly. In order to avoid that result, the viscosity $\mu$ of the insulating matrix in close proximity of the nanowire is desirably be high enough to restrict the speed of such movement v in accordance with the expression.

$$v \leq D/\tau_{manufacturing} \quad (16)$$

where $D \approx 0.5–1$ nm is a typical distance between starting radius $R_{domain}$ and final radius $R_{pair}$ which is similar to characteristic sizes of positively charged molecular groups. Using Stocks law one can describe such viscous movement with following equation $$F = 6\pi\mu v(D/2) \quad (17)$$

where force F and speed v are given by expressions (14) and (16) respectively. Taking into account the solution of equation (17) the final condition for viscosity is expressed as:

$$\mu \geq \frac{2\gamma e^2 \tau_{manuf}}{3\pi\varepsilon_0 \lambda D^2 R_{pair}} \quad (18)$$

It follows from expression (18) that even for short manufacturing times of about 10 s, the minimal viscosity of insulating matrix in close proximity of quantum nanowire must be at least $10^7$ Pa·s at temperature ranges convenient for manufacturing, whereas for longer manufacturing times up to $10^6$ s, it can be desirable that the viscosity is more than $10^{12}$ Pa·s. Usually, manufacturing process involving organic media requiring temperatures in the range between about 270K and about 450 K, whereas typical long-term use of ready products typically occurs in a more narrow temperature range from ambient temperature up to about 400 K. For stability of ready products for more than 3 years, it can be desirable that viscosity of an insulating matrix in close proximity of the quantum nanowire to exceed about $10^{14}$ Pa·s in the range from ambient temperature up to 400 K. Values of viscosity defined by condition (18) are sufficiently close to conditions desirable for the methods III-a-3 following from expression (11). These conditions can be met by compositions of molecular substances comprising a reasonable fraction of highly viscous macromolecular compounds. Increases in viscosity can be also obtained if the substance contains inorganic non conducting particles of nanoscale size.

Thus, bulk processes disclosed above can be used to produce molecular materials containing quantum nanowires comprising crystallized electron pairs. Because both conditions (11) and (18) are desirably fulfilled, one can further dissolve this material in a proper solvent in order to have long-lived nanowires in the solution. Using appropriate methods from the set disclosed in section V-1, one can further obtain desirable concentrations of quantum nanowires in solution. The present invention also teaches two general approaches to cause said nanowires to become oriented in proper directions, to assembled, and/or incorporated into specific devices suitable for production of practical electric and electronic elements comprising quantum nanowires comprising crystallized electron pairs.

One approach is to use the nanowire's before-mentioned tendency to join together if the mean distance between them is less than their characteristic size, L. High mobility of nanowires in concentrated solutions can cause two nanowires to join their ends when they meet. If one needs to cause such joining in a specific place of an electronic element, the same mobility can permit movement of nanowires in the solvent mechanically, with little danger of their damage. That allows "mechanical formation," including one or more of the following operations:

a) to provide concentration of nanowires in the solution about or more than $(1/L)^3$ where L is the typical characteristic length of a quantum nanowire comprising crystallized electron pairs (about $10^{-4}$ cm);

b) to move nanowires using mechanical manipulation;

c) to allow nanowires to become fix in location while evaporation of excess solvent occurs.

Another approach is to use the high susceptibility of quantum nanowires of this invention to external electric and/or magnetic fields in order to move nanowires in the solution into proper positions. One feature of this approach is that in these cases, the concentration of the solution can be much less than $(1/L)^3$ because nanowires polarized in an external field can be moved along a field gradient in order to get proper position. Thus, this approach may be called "electromagnetic formation" and can be carried out using one or more of the following operations:

a) allowing nanowires in the solution to be polarized by a properly formed electromagnetic field;

b) allowing nanowires to follow field gradient for the time long enough to take proper position;

c) allowing nanowires to become fix in position while evaporation of excess solvent occurs.

The first approach described above requires no additional comments for anyone of ordinary skill in the art, whereas the second one above requires certain quantitative clarification assuming that each quantum nanowire comprising crystallized electron pairs is built of $1 \leq n \leq 10^6$ parallel domains and has characteristic length L about $10^{-4}$ cm or a little bit less. Evaluation below is based on the assumption that proper positioning requires quantum nanowire to move the distance about L for the time $\tau_{manuf}$ and, correspondingly, mean speed $\theta^- L/\tau_{manuf}$ is required. The force inducing this speed appears from the interaction of saturated moment of ferromagnetic nanowire with external magnetic field, and for given field gradient dH/dz can be expressed by the order of magnitude as $$F_H \approx n\mu_B \frac{L}{\lambda} \frac{dH}{dz} \quad (19)$$

where $\mu_B$ is Bohr's magneton. On other hand, within viscous medium having average viscosity $\mu_{med}$ this speed is limited by Stocks friction in accordance with equation.

$$F_H \cong 6\pi\mu_{med}v(L/2) \quad (20)$$

It was found by the inventors that the characteristic time to move a nanowire follows from equations (19) and (20) as $$\tau_{manuf} \cong \frac{3\pi\mu_{med}\lambda L}{n\mu_B(dH/dz)} \approx \frac{\mu_{med}}{n(dH/dz)} 10^7 s \quad (21)$$

where field gradient is expressed in Tesla/cm. One can see from expression (21) that even a single domain (n=1) can be effectively moved by modest gradient about 1 Tesla/cm for few hours if the colloid solution has low viscosity $\mu_{med} \cong \mu_{solv}$, which is close to the typical viscosity of an organic solvent of about $10^{-3}$ Pa·s. Obviously, bigger quantum nanowires having n>>1 can be moved faster. Nonetheless, even in that case average medium's viscosity $\mu_{med}$. desirably does not exceed about $10^3$ Pa·s.

Similar to expression (21), another expression can describe that a non uniform electric field E having gradient of the intensity dE/dz of about $10^5$ V/cm$^2$ or more may be highly effective as well.

$$\tau_{manuf} \cong \frac{12\pi^2\mu_{med}L}{nSE(dE/dz)} \quad (22)$$

where S of about $4\cdot10^{-13}$ cm$^2$ is the order of magnitude of the domain's cross-section. Both expressions (21) and (22) show that electric and magnetic fields can be effective in cases where a relatively low average viscosity of the molecular medium is used for device manufacturing. In solidified or highly viscose media, including plasticized media, a medium having viscosity $\mu_{med}$. significantly more than $10^3$ Pa·s, the same electromagnetic approach may be somewhat less effective.

In fact, many practical embodiments can combine both mechanical and electromagnetic approaches together as, for instance, is demonstrated in section VII below, where some methods are based mainly on a mechanical approach and use electromagnetic methods as a manufacturing aid.

VI. Manufacturing of Bulk and Film Materials Containing Quantum Nanowires Comprising Crystallized Electron Pairs In this section we describe practical methods to manufacture materials containing high concentrations of quantum nanowires comprising crystallized electron pairs. These materials, especially produced in bulk form, are suitable for further manufacturing of different quantum devices according to general recommendations disclosed in previous sections. Each manufacturing procedure consists of several sub-steps as indicated below.

VI-1 Mechanically Modified Materials Using Alkali Metal as Doping Agents

EXAMPLE NO 1

Material Comprising Ester Groups, Amino Groups, and Inorganic Plasticizer

Step 1 Forming Viscous Insulating Molecular Substance Comprising Charge Transfer Complexes Sub-Step 1.1. Forming a Molecular Substance A molecular substance was prepared containing following two components:

(a) About 0.5 gram of viscous, amorphous, non-conducting polymer substance, poly(dimethyl-amino-ethyl-methacrylate), having mean molecular weight about $10^5$ amu. This amount corresponds to $5\cdot10^{-6}$ mol of macromolecules having about 640 monomer units each. The chemical structure of a group, having a molecular weight of 157 amu is shown in FIG. 10a. The monomer contains an ester group having an electron affinity of about 0.7±0.2 eV, as well as an amino group having a proton affinity of about 9.9±0.4 eV. This polymer was synthesized in a metal-free reactor system made of glass only. After its synthesis it was purified and dried in order to eliminate un-reacted monomer, solvent, and other low molecular weight molecules. Purification resulted in a relatively high glass transition temperature $T_g$ of about 20–25° C. and a viscosity exceeding $10^{12}$ Pa·s. Atomic absorption analysis did not detect any ferromagnetic impurities more than $10^{15}$ cm$^{-3}$, corresponding to the method's threshold of sensitivity. The polymer was in the form of film having a thickness of about 0.8 mm and an area of about 0.8 cm×about 8 cm.

(b) To add a second component, the polymer film was placed into a glass chamber with humid atmosphere in order to provide water adsorption, which occurs easily due to high polarity of both water molecules and internal molecular groups within the polymer chains. Adsorption continued for few hours at ambient temperature with short interruptions for weighing. It was stopped when 0.015 gram (i.e., about $8\cdot10^{-4}$ mol) of water molecules were introduced into the molecular substance of the polymer. Due to plasticizing with water molecules, the molecular composition had a lower $T_g$ of about 10–15° C. and a lower viscosity about $10^9$ Pa·s. That composition was optically transparent and had no visible color. A small piece of it (i.e., about 0.01 gram) was taken from the film to measure its magnetic properties using the Faraday method. We found rather low-normal diamagnetism, conventional for any insulating molecular substance.

Thus, the ratios of ester groups: amino groups:water molecules:macromolecules in that composition was approximately 640:640:150:1. Some part of the water existed as separate molecules absorbed between molecular monomers, and some water may have been joined in liquid clusters restricted by the small size of internal voids that are typical for amorphous substances. Due to its preparation in air atmosphere, a small amount of oxygen and nitrogen molecules were probably present in the voids as well. However, even a small number of viscous macromolecules was enough to provide high viscosity of the whole composition.

Figure 10:
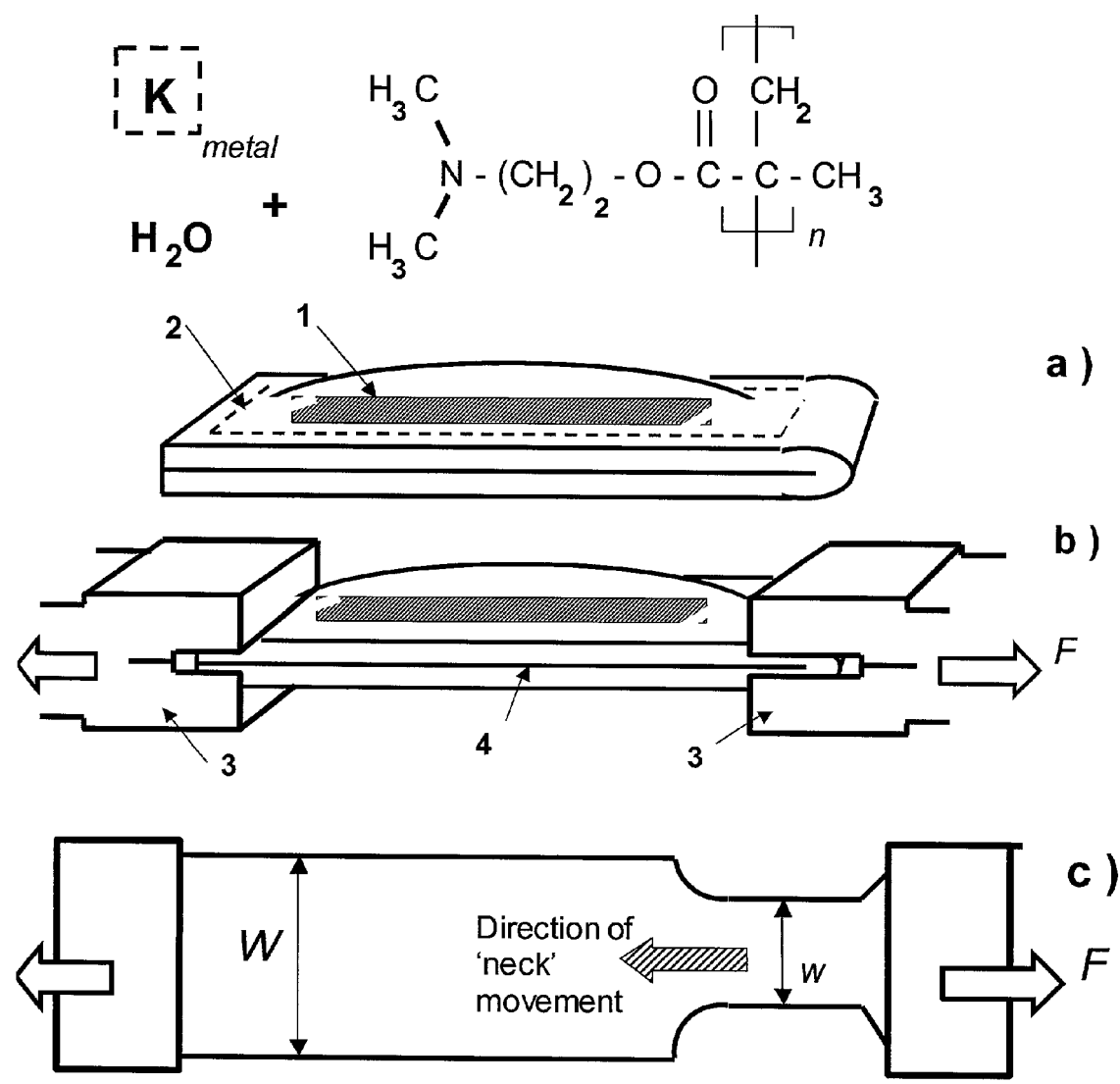
FIG. 10 depicts the formation of a viscous insulating molecular substance containing (a) initially a doping agent in the form of metallic potassium, and (b) after a first set of mechanical treatments, and (c) in atomically dispersed form.

Sub-Step 1.2. Forming Charge Transfer Complexes: Chemical Precursors of Quantum Nanowire Comprising Crystallized Electron Pairs The manufacture of a doped molecular substance was then produced. The process is illustrated by FIG. 10.

(c) According to FIG. 1a, a small amount (about 0.02 gram) of metallic potassium, having form of a strip with thickness of about 0.25 mm and an area of about 4 mm×25 mm, was added to the molecular substance resulting from step 1.1 above as a doping agent. The amount constituting about $5 \cdot 10^{-4}$ mol of potassium corresponded to a mean concentration about $6 \cdot 10^{20}$ atom/cm$^3$ if this metal is homogeneously distributed within the volume of about 0.5 cm$^3$. To avoid complete oxidation by the air the metal potassium strip 1 was placed between two layers of folded molecular film and quickly sealed along its perimeter line 2 using the natural stickiness of the polymer as shown in FIG. 10a where the potassium strip is seen through the transparent material. Corresponding to that stage, the chemical composition of formed molecular substance is exhibited by FIG. 10a.

(d) To distribute the potassium uniformly, two copper clamps 3 were applied to ends of the sample 4 as shown in FIG. 10b, and the sample was stretched slowly with the force F high enough to cause plastic flow of the polymer film. Different layers of viscous sample moved with different speeds and formed a narrowed neck gradually moving from one clamp to another one as shown in FIG. 10c. After sample elongation reached 200–250% of the initial length, the film was folded twice again and clamps were applied to new ends so formed in order to continue stretching. That procedure, repeated several times, resulted in effective stirring of the potassium in the sample's material. Due to the softness of potassium and strong intermolecular friction, metallic atoms became so deeply involved in the molecular flow that after elongation of the sample exceeded about 400–500%, the potassium atoms became atomically distributed within the molecular substance. In this state, the whole sample became transparent and no metal particles could be seen. To this point the whole process took about 40–45 min. After that, a small fraction of the mechanical mixture (about 0.01 gram) was taken and measured by the Faraday method which showed only insignificant changes of low diamagnetism.

Figure 11:
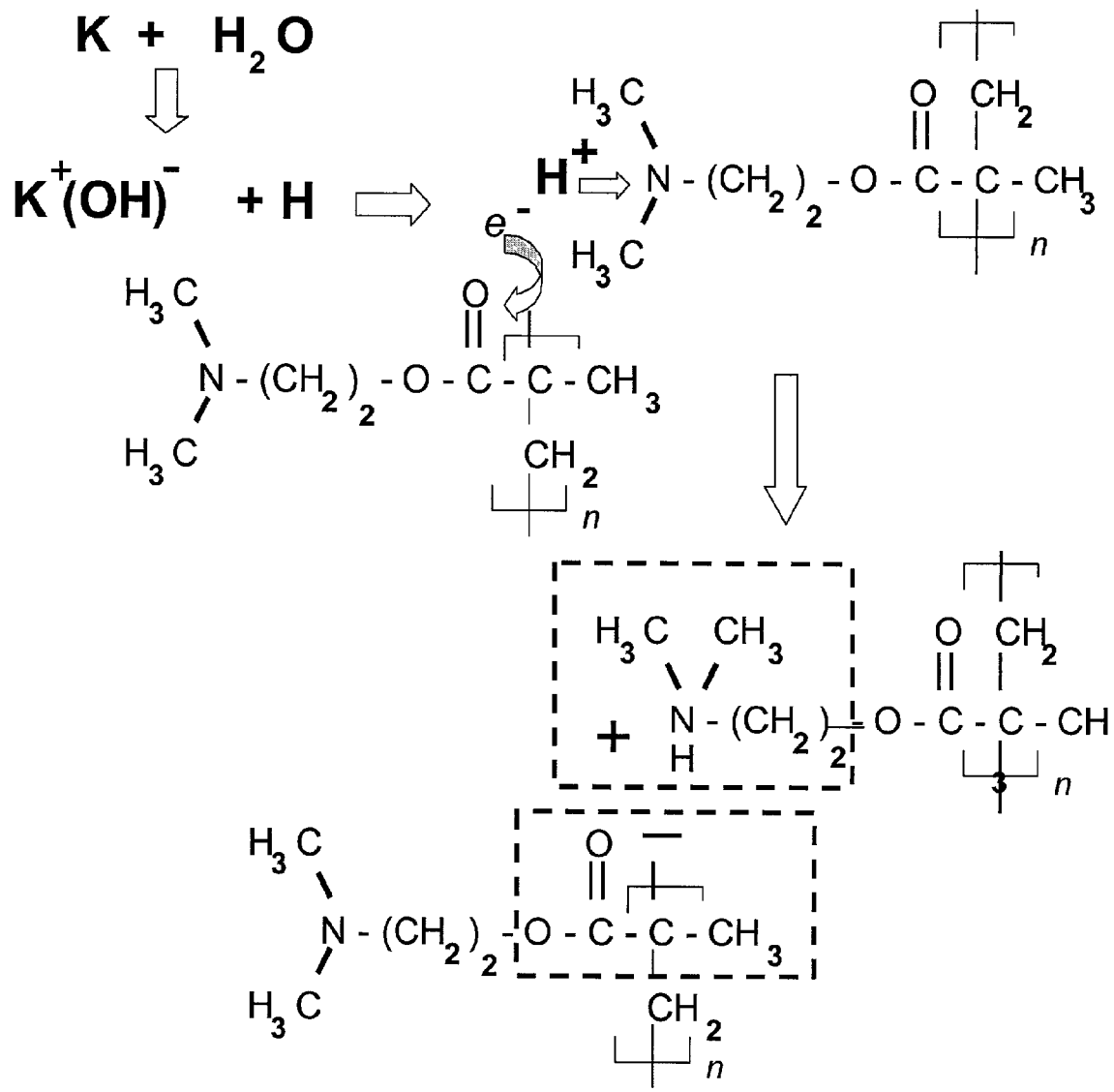
FIG. 11 depicts the sequence of chemical processes involving potassium as a doping agent in the presence of ester groups and amino groups.

In the molecular substance, molecular water reacted with atomically distributed potassium atoms producing a complicated sequence of chemical processes shown in FIG. 11. They involved the appearance of atomic hydrogen as an intermediate product. Further reactions including electron transfer resulted in the amino group belonging to one monomer captured a proton, whereas an electron was presumably captured by the ester group of another monomer unit situated near-by. These processes lead to the formation of charge transfer complexes, whose negative and positive parts are depicted with dashed lines. The charge transfer complexes are depicted in direct contact with each other. In this case, the doping agent did not exists in its initial form because it was transformed into dipole molecules of potassium hydroxide which are not dissolved, because of an insufficient amount of liquid water. So, finally all electric charges are in bound states, which may account for the observation that the whole molecular substance remained in an insulating state.

Simultaneously with main process shown in FIG. 11, some side reactions may have occured, such as oxidation of potassium by traces of oxygen molecules, recombination of hydrogen atoms, and others. Thus, the final concentration of charge transfer complexes within the material was expected to be about $3 \cdot 10^{20}$ complex/cm$^3$ or even a little bit less.

Step 2 Mechanical Modification of Charge Transfer Complexes to Create Quantum Nanowires To create quantum nanowires comprising crystallized electron pairs, the charge transfer complexes formed in prior steps were further modified mechanically in accordance with the third method described in section IIIa. For that, the deformation of the sample was similar to that shown in FIG. 10c was continued for about 350–400 min. longer at room temperature. During that time, the force applied to the copper clamps was kept between 300 and 500 N, and mean area of the "neck" cross-section was about 0.1 cm$^2$ or a little bit less. Due to partial participation of plasticizing water in the doping reaction, the viscosity of the material increased a little bit and remained in between $10^9$ Pa·s and $10^{10}$ Pa·s. That provided a mean speed of sample material plastic flow of about 0.01 cm/s and, in compliance with previous discussion in Section III-a-3, the mean speed gradient was about 0.1 s$^{-1}$ directed perpendicularly to the direction of motion. After each cycle of the elongation of the sample about 100–150% (one cycle took about 7–10 min) strongly deformed strip of the material was folded two to three times to make it shorter, clamps were applied to new ends, and a new cycle of stretching was started. Small samples of the sample of about 0.01 gram each were taken every hour to measure magnetic characteristics.

Thus, strong internal deformation of the material caused a significant portion of the charge transfer complexes to increase the distance between positively and negatively charged molecular groups, thereby initiating self-organization of quantum nanowires comprising crystallized electron pairs. After approximately one hour of such deformation, the initially transparent material became turbid, reflecting the formation of internal microscopic regions having significantly increased refractive index within the size comparable with wavelength of the light (about 0.5 micron). Roughly, these regions were characterized by an increase in local density of molecular substance about 5–10% corresponding to self-compression of that substance in some vicinity of formed quantum nanowires. The first sample, measured at the same time, showed the appearance of a small ferromagnetic response. In subsequently taken samples, the ferromagnetic signal gradually increased during continuing treatment, and finally obtained a value corresponding to a mean concentration of ferromagnetic spins within the material of about $1.4 \cdot 10^{19}$ cm$^{-3}$. In accordance with teaching of the present invention, the appearance of ferromagnetic quantum nanowires comprising crystallized electron pairs indicated that within them, local concentrations of spins were between about $3 \cdot 10^{19}$ cm$^{-3}$ and about $2 \cdot 10^{20}$ cm$^3$, and in other samples, was between about $5 \cdot 10^{19}$ cm$^{-3}$ and about $10^{20}$ cm$^{-3}$). Additional treatment for about half an hour did not change this value. The dependence of magnetization on the intensity of the magnetic field indicated that ferromagnetic domains formed during mechanical treatment of the molecular substance, and contained approximately 500–2000 electrons, allowing us to estimate the mean domain's length approximately between about 0.25 micron and about 3 microns.

A sample was left in a dry atmosphere to allow the rest of the water to evaporate and to increase the mean viscosity of the material up to its final value of more than $10^{12}$ Pa·s. Due to effect of self-compression, local viscosity of the substance in the vicinity of formed nanowires increased by at least one order of magnitude and became higher than $10^{13}$ Pa·s. Ferromagnetism of this sample was so strong that the whole sample was held by a small magnet. Measurements carried out in following three months did not detect any decrease of this magnetic strength.

EXAMPLE NO 2

Material Comprising Ester Groups, Amino Groups, and Organic Plasticizer

In this example, the same poly(dimethyl-amino-ethyl-methacrylate) was used to form the intitial molecular substance. What made the difference with example No 1 was that its molecular weight was about $2 \cdot 10^4$ amu, and polymer was additionally plasticized with molecules of non polymerized dimethyl-amino-ethyl-methacrylate (8 weight %). That resulted in following ratios: water molecules:plasticizing molecules:macromolecules of 32:11:1 and decreased the viscosity close to $10^8$ Pa·s. All other procedures were similar to those described in Example No 1. The final result was the formation of a turbid bulk material containing quantum nanowires comprising crystallized electron pairs and exhibiting ferromagnetism equivalent to mean spin concentration $4 \cdot 10^{18}$ cm$^{-3}$.

EXAMPLE NO 3

Material Based on Epoxy Compound Comprising Amino Groups

Figure 12:
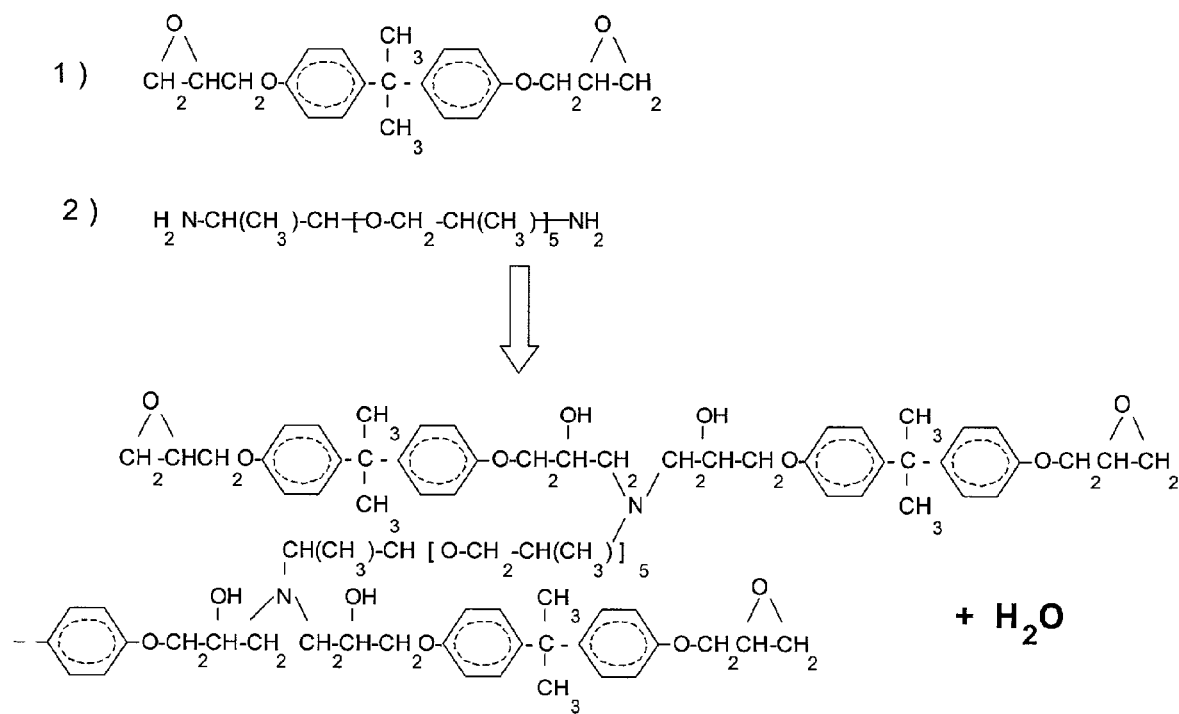
FIG. 12 depicts the formation of a molecular substance using epoxy compounds.

To use an epoxy-based material, the molecular substance formed by sub-step 1 was formed by the reaction of two low molecular weight liquid components shown in FIG. 12; (1) diglycidyl ether of bisphenol A (Epon resin 830) having a molecular weight 340 amu, and (2) the curing agent polyoxypropylene diamine (Texaco Jeffamine D-230) having a molecular weight of 364 amu were mixed under stirring in following amounts: 6.8 gram (0.02 mol) of first component, and 3.64 gram (0.01 mol) of curing agent. Being mixed, these components began a slow reaction of polycondensation (shown partially in FIG. 12 as well, middle) which resulted in some hardening of the material. In the present example, the use of a relatively low amount of curing agent slowed the hardening process. After 24 hours at room temperature, the initially liquid substance became a viscous material characterized by a viscosity between $10^7$ Pa s and $10^8$ Pa·s. At that time, more than 50 weight % of the whole composition remained in low molecular weight state and had not become a macromolecular structure of a viscous matrix. The resulting substance contained amino groups having high proton affinity, epoxy groups, and hydroxyl groups which can be positively charged after processing with doping agent. At the same time, in contrast to Examples Nos. 1 and 2, this substance had no ester groups.

All other sub-steps were performed as in Example No 1 except the following: step(b) of water absorption was excluded from sub-step 1 because some amount of water molecules was already present in the substance as a by-product of the hardening reaction and no additional water was required.

Figure 13:
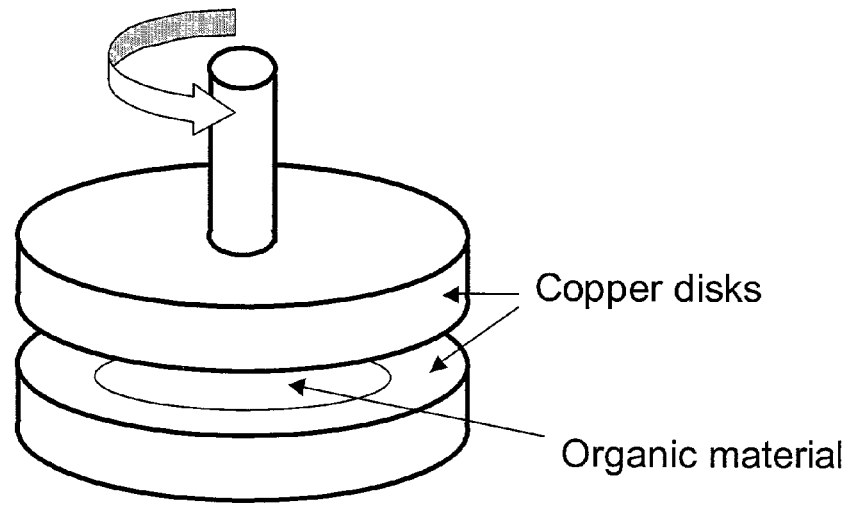
FIG. 13 depicts a press used to modify charge transfer complexes during plastic flow of a viscous molecular substance.

Due to the decreased viscosity of the molecular substance, it was possible to increase the speed of its mechanical deformation by about one order of magnitude and to complete whole process in two hours. Instead of using clamps, continuous slow plastic flow of the material was performed between two slightly compressed copper disks using the press shown in FIG. 13. That allowed us to maintain the mean speed gradient in plastically flowing molecular substances between 1 s$^{-1}$ and 3 s$^{-1}$.

The final viscous organic material exhibited the presence of quantum nanowires comprising crystallized electron pairs in amounts corresponding to mean spin concentration within the bulk material a little bit more than $3 \cdot 10^{18}$ cm$^{-3}$. In present example, protonation of amino groups may have been most responsible for formation of the positive part of charge transfer complex as shown in FIG. 11, whereas its negative part was formed with participation of other molecular groups having appropriate values of electron affinity such as either epoxy, hydroxyl, ether groups, or connected with oxygen in aromatic rings. However, it can be appreciated that other types of charge transfer complexes can be formed in that system, due to the fact that all these groups combine appropriate values of electron affinities with high proton affinities exceeding 8 eV.

EXAMPLE NO 4

Material Comprising Polymer Liquid Crystal

Figure 14:
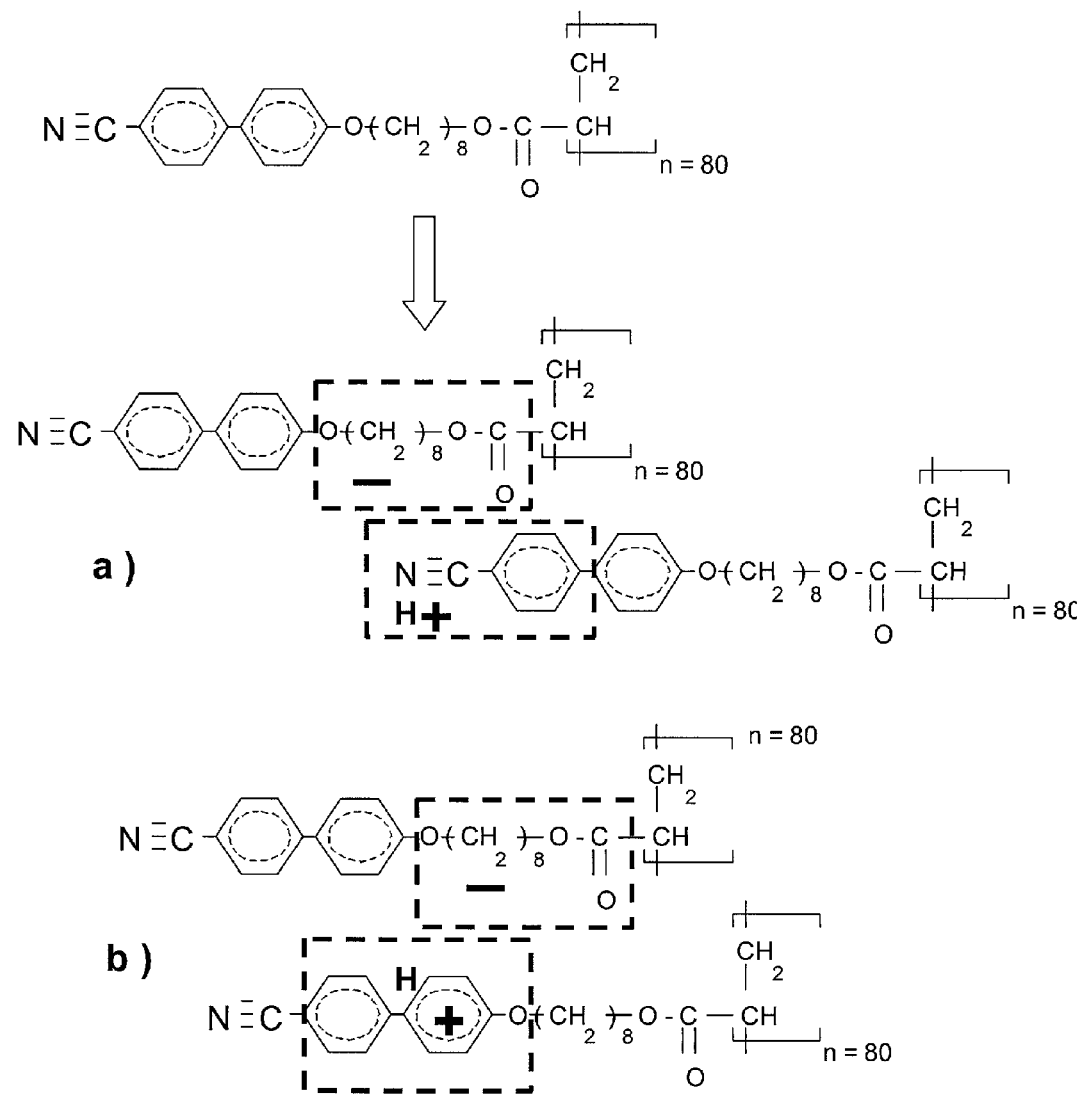
FIG. 14 depicts a chemical structure of a liquid crystal polymer substance and the structure of charge transfer complexes.

Molecular substances of this example were synthesized as liquid crystal polymers having a mean molecular weight of about $3 \cdot 10^4$ amu and built of mesogenic groups shown in FIG. 14. The chemical structures of these insulating polymers contain ester groups, ether groups and cyan-biphenyl groups, and has no amino groups. Liquid crystal structures of this substance melts at about 120° C. That is why, in contrast to amorphous materials of Example No. 1, at room temperature, the plastic flow of this liquid crystal material requires mechanical stress exceeding a certain threshold, and is characterized by having a viscosity above $10^{12}$ Pa·s. Being slightly plasticized with polar water molecules absorbed from atmosphere (about 0.009 gram of water per 1 cm$^3$), the polymer has a decreased viscosity of about $10^{11}$ Pa·s.

To polymer samples having amass of organic substance of about 0.5 gram, we added a 0.01 gram strip of metallic potassium. The material was prepared using methods as in Example No. 1. This amount of alkali metal corresponds to the ratios of water molecules:potassium atoms:macromolecules of about 15:15:1, and provided a concentration of charge transfer complexes between about $10^{20}$ cm$^{-3}$ and about $3 \cdot 10^{20}$ cm$^{-3}$. A similar clamp technique was used to distribute alkali metal uniformly to complete step 1 which lead to protonation of cyan-biphenyl groups and, in some cases, of aromatic rings having oxygen as a side substitute, as shown in FIGS. 14a and b. Following step 1, step 2 was also performed with the use of clamp technique to modify these charge transfer complexes mechanically in order to increase the distance between positive and negative groups. The increased viscosity of the material resulted in lowered speeds of plastic flow of about 0.001 cm/s and a speed gradient about 0.01 s$^{-1}$. In the end of the entire procedure, a turbid bulk material contained quantum nanowires comprising crystallized electron pairs in amounts enough to provide a mean concentration of ferromagnetic spins of about $6 \cdot 10^{18}$ cm$^{-3}$.

VI-2 Mechanically Modified Material Using Acetic Acid as Doping Agent

EXAMPLE NO 5

Material Comprising Ester Groups, Amino Groups, and Inorganic Plasticizer

Step 1. Forming Viscous Insulating Molecular Substance Comprising Charge Transfer Complexes In this example, the intiial molecular substance was prepared using the same method as described in Example No. 1.

The doping agent was introduced into substance while sub-step 2. The polymer film was moisturized with acetic acid (molecular weight 60 amu) containing also about 10 vol. % of water molecules. Then moisturized film was kept in air for about 10 min to allow (1) the diffusion of both molecular components into internal layers of the polymer; and (2) the evaporation of the excess liquid from the film surface. About 0.02 gram of the mixture (acetic acid+water) was absorbed by the polymer film and, therefore, the expected concentrations of acid and water molecules within molecular substance were about $3 \cdot 10^{20}$ cm$^{-3}$ and $10^{20}$ cm$^{-3}$, respectively. The ratios of ester groups:amino groups:acid molecules:water molecules:macromolecules was estimated as 640:640:50:16:1.

Then a short mechanical treatment similar to the operation described in point (d) of Example No. 1 was used to stir the substance carefully. This resulted in the formation of charge transfer complex shown in FIG. 15. In contrast to previous examples, in the presence of a trace amount of water, acetic acid dissociated and provided a proton to the amino-group. The rest of the acetic acid molecule captured an electron and, therefore, became a negatively charged part of the charge transfer complex. Thus, in this example, ester groups were not directly involved in chemical formation of the charge transfer complexes. Nonetheless, that did not exclude their participation in further processes during modification of said complexes. The viscosity of the molecular substance so formed was about $10^9$ Pa·s at room temperature The acetic acid caused a desirable plasticizing effect.

Step 2. Mechanical Modification of Charge Transfer Complexes to Create Quantum Nanowires Comprising Crystallized Electron Pairs The mechanical treatment inducing charge transfer complexes to increase the distance between negative and positive parts was provided at the same general conditions as in Example No 1. The only difference was that due to a slightly decreased viscosity, the same speed of the material's deformation was attained at a lowered applied force. The material finally obtained had a similar turbid look as that described in Example No 1 and exhibited ferromagnetic features corresponding to a mean concentration of electrons organized in ferromagnetic structures of about $5 \cdot 10^{18}$ cm$^{-3}$. This yield is rather high, but smaller one than that obtained for materials described in Examples Nos. 1 and 4. It may be that the decreased efficiency of mechanical modification of charge transfer complexes occurred because their negative part has smaller size than in Examples Nos. 1 and 4.

All bulk materials containing quantum nanowires comprising crystallized electron pairs described in sections VI-1 and VI-2 did not exhibit macroscopic conductivity and can be characterized only by their magnetic properties, which changed during manufacturing. Small nanowires were statistically distributed in the organic bulk and did not form conducting percolation nets themselves. All these materials can be dissolved in proper solvents and thin conducting films can be made of such solutions. A broad set of physical methods allowing one to characterize such thin films are disclosed in Section VI-3 below.

VI-3 Modification of Charge Transfer Complexes Using of Light Irradiation

EXAMPLE NO 6

Step 1. Forming Viscous Insulating Molecular Substance Comprising Charge Transfer Complexes Sub-Step 1.1. Forming Liquid Initial Molecular Medium A composition of plasticizing molecules of dimethylaminoethyl-methacrylate (5 weight %) and a co-polymer of octhylmethacrylate (97% of monomer units) with dimethylaminoethyl-methacrylate (3% of monomer units), having a molecular weight about $5 \cdot 10^4$ amu, was dissolved in toluene containing 0.3 weight % of residual water. The amount of toluene provided a concentration of about 1 weight % of the organic substance dissolved. This solution was heated in an open flask at a temperature of about 70° C. for 5 min in order to cause partial evaporation of solvent preventing the diffusion of molecular oxygen from the air to the solution.

Sub-Step 1.2. Composing Initial Molecular Medium with Doping Agent to Produce Charge Transfer Complexes Then, metallic potassium was added calculated so that 1 metal atom corresponded to about 50 monomer units of copolymer (approximately the amount of potassium in the co-polymer was 0.5 weight %). That initiated a chemical reaction between the potassium and amino groups of both co-polymer and plasticizer. In about 15 min., this reaction resulted in complete dissolution of the potassium and the formation of charge transfer complexes providing slightly yellow color of the solution. Due to the small amount of water remaining in the reaction system, the first type of charge transfer complex is the one shown in FIG. 11. Other types of charge transfer complexes can be also formed, for instance, another may correspond to the scheme (2) provided in text previously.

Sub-Step 1.3. Forming of Molecular Substance having Necessary Viscosity and Concentration of Charge Transfer Complexes Then, small amounts of that solution were poured onto several flat glasses having conducting indium-tin-oxide (ITO) layers on one surface. The use of transparent ITO supports allowed us to combine optic control of the samples with electric measurements. After 24 hours in air atmosphere and at room temperature, the toluene evaporated completely (as well as some amount of plasticizing molecules) and samples, prepared in the form of thin insulating layer (thickness about 3 micron) of highly viscous molecular material on ITO support, were ready. During that period, organic material was allowed to adsorb additional small amounts of water from the air. The mean concentration of charge transfer complexes within that material was about $9 \cdot 10^{19}$ cm$^{-3}$, and due to statistical fluctuations, could have been up to $2 \cdot 10^{20}$ cm$^{-3}$ in some local regions of small size.

Step 2 Self-organization of Quantum Nanowires Induced by Modification of Charge Transfer Complexes with the use of UV-light In order to realize a second modification method described in section III-a above, all samples prepared were irradiated using a low pressure mercury UV-lamp for 30 min. at room temperature. The lamp had an electric power of about 100 Watts, and provided uniform illumination of an area 7×20 cm; the distance between the lamp and samples was about 10 cm. Some samples were irradiated with the full range of the spectrum, and some were irradiated through a glass filter removing wavelengths shorter than 300 nm.

Figure 16:
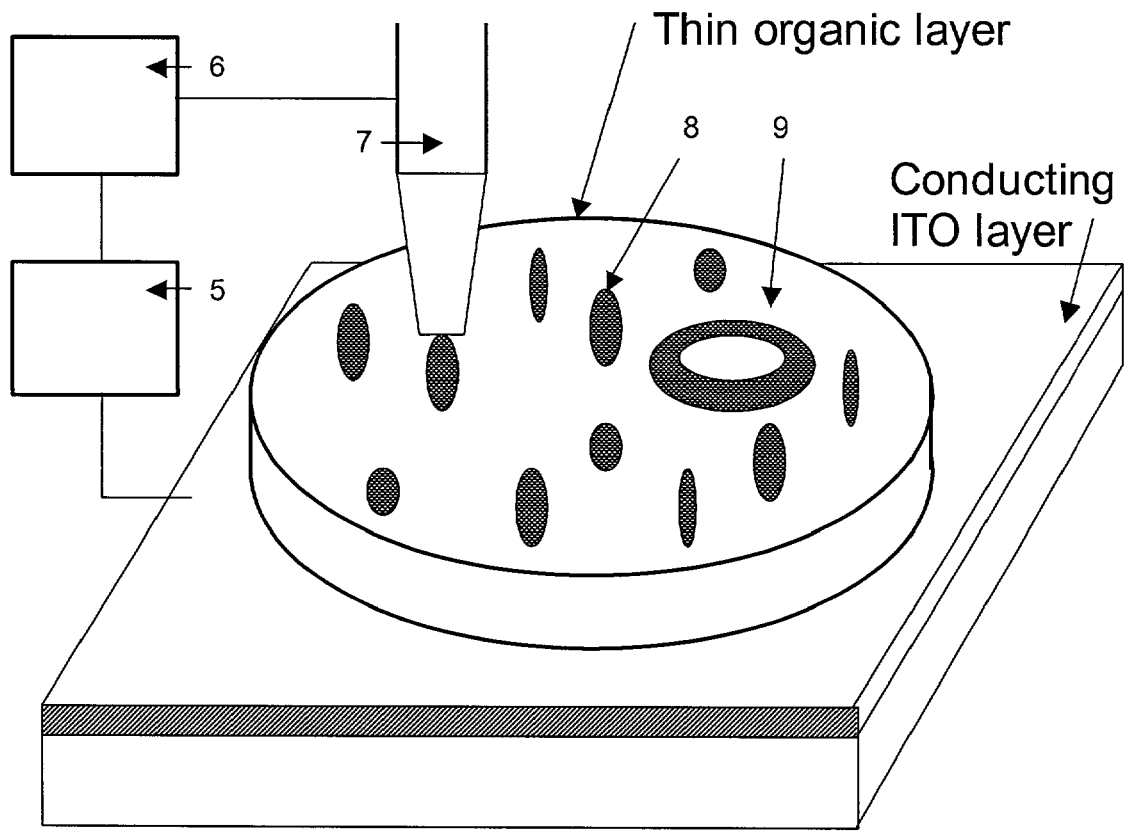
FIG. 16 depicts schematically the typical distribution of highly conducting quantum nanowires comprising crystallized electron pairs in thin layers of molecular substance found by both direct electric measurements and atomic force microscope in both electric and magnetic non-contact modes.

During irradiation and after for the relatively short period of about few hours, the organic layers exhibited very low levels of ionic conductivity quickly decaying in time when voltage was applied. This was a signature that irradiation redistributed electrons from initial charge transfer complexes to new, relatively shallow electron traps, including small molecules of high mobility. The next day after irradiation, no ionic conductivity was found at all because self-organization of quantum nanowires comprising crystallized electron pairs caused these electrons to find positions more stable from thermodynamic viewpoint. Instead of that, all samples demonstrated high transverse conductivity present in local points of organic layers as shown in FIG. 16 where 5 depicts a low voltage DC power supply, 6 depicts a current measuring device, 7 depicts a fine needle-like contact, dark spots 8 depict regions of high conductivity. If electrode 7 contacted the matrix between said regions, perfect insulating properties were recorded. Phase contrast optic microscopy showed that molecular substances within the microscopic conducting regions were strongly compressed because their refractive index was higher than that of surrounding non-conducting matrix. Typical diameters of conducting regions was found to be between about 100 and about 1000 $\mu$m, and the mean distance between them was about 2–3 microns.

Electronic properties of each separate region varied over a rather wide range: (a) Some exhibit a high resistance of about $10^6$ Ohm and more, and have non-linear I-V curves characteristic for Josephson-like tunneling contacts. They can carry DC current at least $3 \cdot 10^{-5}$ Amp. (b) Some, corresponding to highly conducting structures in FIG. 7-1, had quasi-linear I-V curves and can carry DC current more than $10^{-2}$ Amps, corresponding to a current density at room temperature in between $10^6$ Amp/cm$^2$ and $10^8$ Amp/cm$^2$. Some regions explored in a short pulse regime with higher precision exhibited current carrying capacity in between $10^8$ Amp/cm$^2$ and $10^9$ Amp/cm$^2$. In the DC regime, these regions had very low resistance, about 10 Ohm, which related to specific contact resistance of the ITO support. After its subtraction, internal specific resistance of nanowires was estimated to be at least one order of magnitude less than that of copper, therefore, greater than $10^7$ S/cm. (c) Many other regions exhibit values of resistance intermediate between the two previous cases (a) and (b) above, because the thickness of the insulating gap between nanowires and the conducting electrode shown in FIG. 7-2 probably varied. The specific quantum nature of their conductivity was pointed out by the observation that I-V curves contain the set of shallow quantum steps whose height was proportional to square current, namely $I^2$.

Exploration of same samples with atomic force microscope showed the following:

(a) Statistically distributed quantum nanowires (see FIG. 16) was obtained in a non-contact imaging mode with the cantilever elevated over the film surface by about 40 $\mu$m in the presence of an electric field. This picture revealed similar features (size and distance between quantum nanowires) as followed from optical and direct electrical measurements.

(b) Contact (or taping) imaging mode included the recording of the phase of cantilever oscillations and revealed that in close proximity of each nanowire, organic material was elevated few nanometers over the mean film surface and was much more dense than the adjacent molecular substance.

(c) Non-contact magnetic imaging revealed that all ferromagnetic features were located in same microscopic conducting regions which were previously detected with all other contact and non-contact methods disclosed above. Ferromagnetic nanowires created the force attracting the slightly elevated magnetized cantilever and recorded by microscope. At the same time, magnetic imaging allowed us to discover some new features which were not detected using other methods. For instance, due to statistical reasons, in some places the distance between neighboring nanowires was much less than the mean value. That allowed them to join each other and to form closed loops as shown as 9 in FIG. 16 and considered in section IV of the general basis for quantum devices (see FIG. 8). Such loops carry persistent current and can exhibit extremely strong diamagnetism, causing the repulsion of a magnetized cantilever. Loops having diameters of about 1000 nm provided stronger repulsion to the cantilever than their own ferromagnetic attraction. The density of the current induced within the loop by external magnetic field can be as high as up to about $10^9$ Amp/cm$^2$. That observation becomes the first irrefutable experimental evidence of extremely high internal conductivity of quantum nanowires comprising crystallized electron pairs, whether linear or loop-like ones.

(d) Exploration of different samples revealed that organic layers irradiated with a full range of the spectrum of a mercury lamp exhibited less concentration and significantly smaller size of quantum nanowires comprising crystallized electron pairs in comparison with ones irradiated through the glass filter. A possible explanation for this observation is that the mobility of molecular substances important for self-organization of nanowires maybe strongly reduced by molecular cross-linking caused by quanta of far UV-region.

Conventional DC and AC measurements did not show any significant changes in electric properties of quantum nanowires comprising crystallized electron pairs with temperature over a wide range from about 0 K up to about 470 K. Only at the highest temperatures (470–490 K) some long-term instability was observed, which correlated with thermal decomposition of the organic material which lead to decreased viscosity and worsened contact between quantum nanowire comprising crystallized electron pairs and the external electrodes. Additional tests accompanied by pulse heating of the material revealed that the main conducting properties survived up to about 700 K so long as the organic matrix remained intact.

EXAMPLE NO 7

Figure 15:
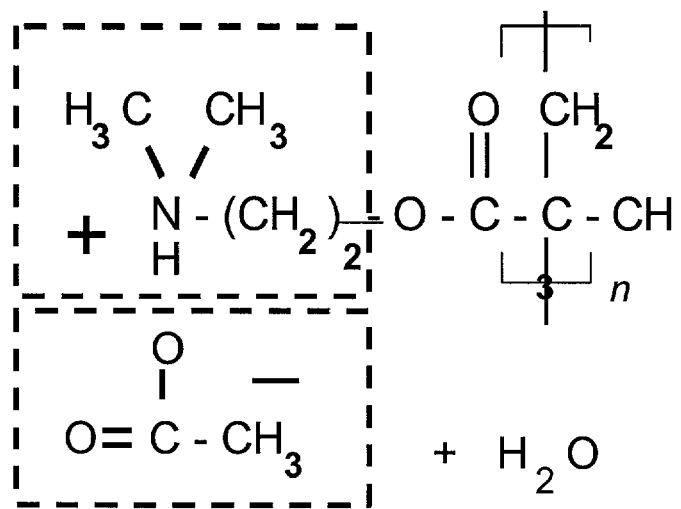
FIG. 15 depicts charge transfer complexs formed with the use of acetic acid as a doping agent.

In this example sub-step 1.2 was slightly different from the previous one for Example 6. An identical solution as in Example No 6 was prepared in the flask, but potassium was not introduced into it. Instead, after a short period of heating, portions of the solution containing plasticizing molecules of dimethylaminoethyl-methacrylate and co-polymer of octhylmethacrylate (97% of the total monomer units) with dimethylaminoethyl-methacrylate (3% of the total monomer units), were poured onto glasses covered with conducting ITO layer similar to those used previously. The toluene was allowed to evaporate at room temperature for 24 hours. After that time, samples prepared in the form of thin insulating layers (thickness about 3 micron) of highly viscous molecular material on the ITO support, were placed for about 2 hours in an atmosphere containing ambient concentration of water vapor and saturated vapor of acetic acid having a partial pressure about 1300 Pa at ambient temperature. That allowed the organic film to adsorb both molecular components from gas phase and to form charge transfer complexes as depicted in FIG. 15. The amount of absorbed acid and water did not exceed about 1 weight %.

Step 2 was performed as in Example No 6, and was accompanied by similar consequences, including an initial appearance of ionic conductivity followed by self-organization of conducting quantum nanowires comprising crystallized electron pairs. The only difference found with the help of atomic force microscope was that nanowires formed in Example No 7 had smaller diameters, typically in between about 50 nm and about 200 nm. The main electric and magnetic properties related to that decreased diameter were substantially the same as for nanowires created in Example No 6. Similar physical properties of quantum nanowires were also found in thin films made of bulk materials produced in Examples Nos. 1–5.

Materials resulting from the above examples may be dissolved in proper solvents, including but not limited to such organic solvents as toluene, heptane, and some others, in situations in which it is desirable to produce the final material in the form of a colloid solution having low or modest viscosity, and comprising small particles containing quantum nanowires comprising crystallized electron pairs suspended in the solvent. In other embodiments, in which cross-linked polymers form a matrix, solubility in solvents may be decreased.

It may be also desirable in some embodiments to have final material in a plasticized form in which a limited amount of solvent or other plasticizing agent is present to decrease the average viscosity of a highly viscous molecular substance comprising local regions containing nanowires, but does not allow the material to form a colloid solution.

VII Devices Comprising Quantum Nanowires Comprising Crystallized Electron Pairs and Methods for their Production In this section we consider several different embodiments related to methods for treating molecular substances containing quantum nanowires comprising crystallized electron pairs to produce useful devices and electronic components. By way of illustration only, quantitative parameters presented in this section are related only to either bulk material resulting from manufacturing procedures of Example No. 1 in section VI, a similar material plasticized with proper amounts of toluene in order to maintain desirable viscosity, or a colloid solution of a similar material in toluene. However, it can be readily appreciated that other materials described in section VI as well as other solvents can be also used and be within the scope of the present invention.

For simplicity we will use the numerical classification as in section V where general conditions and physical principles of such treatments have been discussed.

Figure 17:
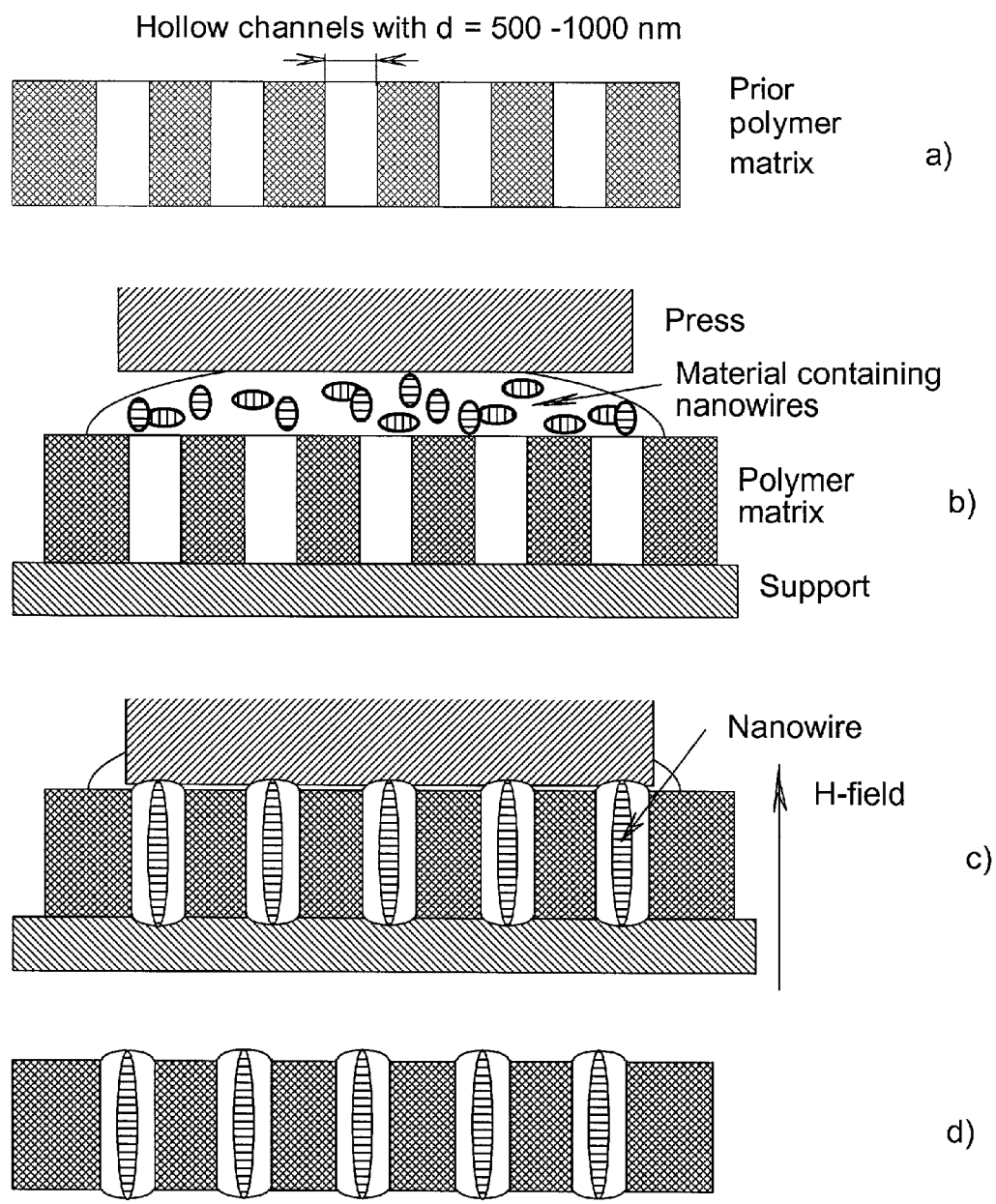
FIG. 17 depicts the combination of main "mechanical" method to form a free-standing Z-conducting film with the help of an "electromagnetic" method.

V-2.M Methods for Producing Patterns of Z-Conducting Quantum Nanowires Comprising Crystallized Electron Pairs V-2.M-1. A free standing film conducting in the Z-direction, normal to the surface of a thin film, can be produced from an initial matrix film having thickness h within a typical range from about 3 to about 30 micron as shown in FIG. 17a. The initial matrix can be made of any suitable polymer material, for instance, a polyimide having high mechanical strength and good thermal stability. The thickness of that film is not critical and is mainly defined by requirements of a specific application. The initial matrix must be provided with a set of hollow channels having diameters d from about 500 nm to about 1000 nm. In other embodiments, the channels can have dimensions substantially smaller than 500 nm, and in some embodiments, channels can have a diameter in the range of about 250 nm to about 100 nm, and in yet other embodiments, of about 180 nm to about 500 nm. There are well known standard methods for preparing channels of such dimensions.

Then a molecular substance is prepared having quantum nanowires comprising crystallized electron pairs formed as described herein, and having a mean length L of about the diameter of the channel into which the nanowires are to be placed. In embodiments in which the diameter of the channel is in the range of about 500 m to about 1000 nm, the lengths of nanowires can be between about 300 nm and 800 nm and present in a concentration of at least about $10^{12}$ cm$^{-3}$, and most preferably in between $5 \cdot 10^{12}$ cm$^{-3}$ and $10^{14}$ cm$^{-3}$. That can correspond to a volume concentration of nanowires between about 2.5 vol. % and about 50 vol. %. Elongated forms of quantum nanowires provides them to have typical diameters less than those of channels. A small amount of an appropriate organic solvent or plasticizing agent may be used if necessary to provide an average viscosity of that substance $\mu$ not more than about $10^5$ Pa·s, and preferably between about $10^2$ Pa·s and about $10^3$ Pa·s at a certain convenient temperature $T_0$ chosen within the range of about 290–450 Kelvins. It is understood that the average viscosity does not exclude the presence of small local volumes of nanowires, which are already hardened by self-compression effects discussed above, and have at the same $T_0$ much higher local viscosity satisfying conditions described in expression (18).

One can then put a drop of said substance on the surface of an initial matrix, heat it up to $T_0$ if desired, and then can apply mechanical pressure $P_{mech}$ as shown in FIG. 17b. The pressure causes the viscous molecular substance to flow into hollow channels and, therefore to fill them with highly concentrated nanowires. Simple calculations based on the well known Poison's expression for viscous substances flowing through the capillary at a given viscosity, diameter, length, and pressure, indicates that complete filling takes a time $\tau_{manuf}$ depending on these parameters as follows:

$$\tau_{manuf} \cong \frac{8\mu}{P_{mech}}\left(\frac{h}{d}\right)^2 \tag{23}$$

In situations in which the factor $(h/d)^2$ is less than 11000, it follows from the expression (23) that final filling will take less than 100 s at pressure $P_{mech}$ of about 0.1–1 MPa, which is low enough to preserve the structure of quantum nanowires against mechanical break.

It can be readily appreciated that the velocity gradient of viscous flow of molecular substances within a narrow channel can cause elongated nanowires to take the position near channel's axis, and simultaneously orients them longitudinally along the same axis. Therefore, due to the high concentration of nanowires, their neighboring ends begin to touch each other and have an increased probability of joining together as shown in FIG. 17c. The process thus can result in the formation of long Z-conducting nanowires within channels. The speed of manufacture may be additionally enhanced if gradients of magnetic fields, electric fields or both fields are also applied in accordance with recommendations of expressions (21) and/or (22). After this formation is complete, the ready free standing initial matrix containing quantum nanowires comprising crystallized electron pairs (see FIG. 17d) can be removed from the press, cooled to about ambient temperature if necessary, and left for a while to allow the rest of the solvent or plasticizer to evaporate to the extent desired to fix the nanowires within the matrix.

It maybe advantageous if the surface layers of both the press and bottom support used during this operation are made of a material softer than the self-compressed molecular matrix within close proximity of nanowires. For example, these surface layers can be made of soft plastic or metallic indium, which afre characterized by very low pressure of plastic flow. Using soft processing layers can preserve products against mechanical damage during removal from the press, because a matrix made of polyimide has higher mechanical strength than soft plastic or indium. Second, both ends of formed nanowires can remain above of the surfaces of the matrix film FIG. 17*d*, providing for good electrical contact between each nanowire and external electrodes to be applied later.

V-2.M-2

Figure 18:
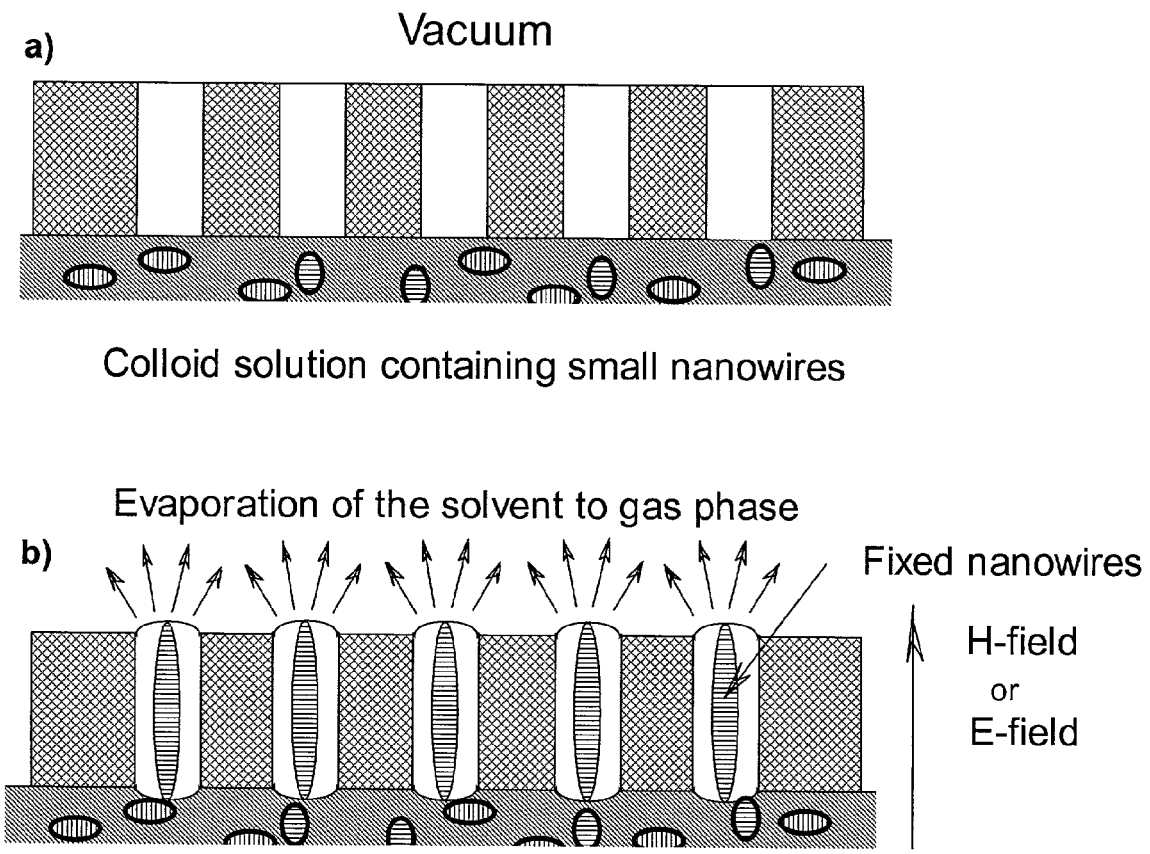
FIG. 18 depicts another method to form free standing Z-conducting film using vacuum pressure and the help of an "electromagnetic" method: (a) an initial state of empty prior matrix on the surface of a colloid solution, and (b) a final state having quantum nanowires comprising crystallized electron pairs fixed within channels.

One more method depicted schematically in FIG. 18 can be used to realize the idea of mechanical filling of hollow channels. This method exploits results of expression (23) showing that only a low pressure gradient may be required to fill hollow channels within a reasonable time. In this case, an empty initial matrix can be placed on the surface of a concentrated colloid solution containing quantum nanowires comprising crystallized electron pairs of proper size, and then decreased atmospheric pressure can be applied as shown in FIG. 18*a*. This process can create a pressure gradient between both surfaces of the matrix and can permit the solution to fill hollow channels. The application of Z-directed magnetic or electric field gradient can help to form Z-conducting nanowires within channels as shown in FIG. 18*b*. Decreasing the pressure in the gas phase pressure can also help to evaporate unneeded solvent from channels in order to fix the nanowires' positions. Previously discussed conditions relating to concentration and sizes of nanowires, as well as temperature and viscosity of the solution remain approximately the same as in the methods previous above.

V-2.D Devices Based on Z-Conducting Patterns

V-2.D-1

Figure 19:
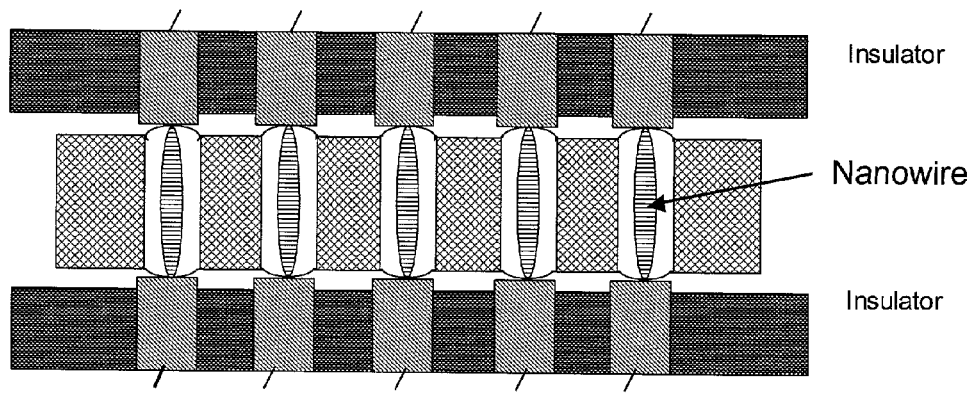
FIG. 19 depicts an interposer comprising a film containing Z-conducting nanowires to connect two electric or electronic circuits.

A device represented by that depicted in FIG. 19 uses free standing Z-conducting film described above as an interposer between two electronic schemes, let say two silicon chips containing conventional integrated circuits or, for instance, between integrated circuit silicon chips and a motherboard. Due to the small diameter of channels containing quantum nanowires, the distances between neighboring channels can be made as small as about 3 microns providing the density of input-output contacts as high as up to $10^7$ cm$^{-2}$. The current carrying capacity of each contact having diameter less than 1000 nm is not less than $7 \cdot 10^{-6}$ Amp if the corresponding nanowire contains only one domain, and has upper limit about 2 Amp if a multidomain nanowire is formed within the channel mentioned above.

V-2.D-2

Figure 20:
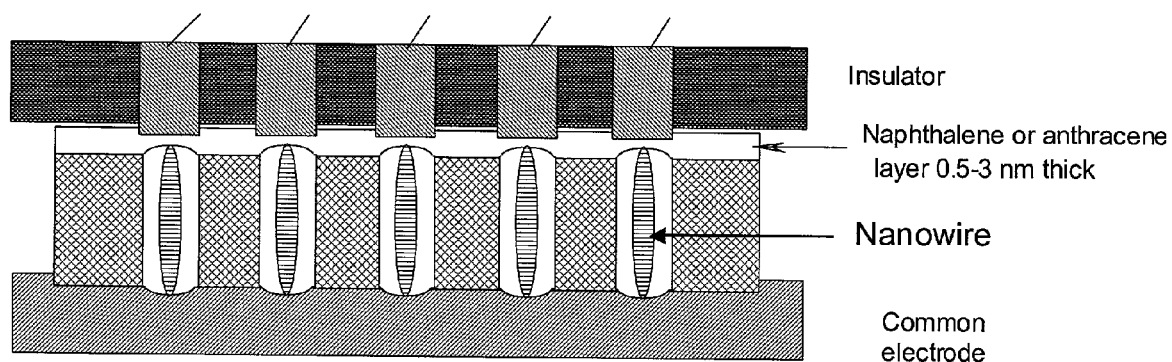
FIG. 20 depicts a device comprising a film containing Z-conducting nanowires and exhibiting the properties of an array of metal-superconductor Josephson contacts.

Another device incorporating similar films is shown schematically in FIG. 20. This device represents an array of individually controlled Josephson contacts. Taking into account quantum peculiarities of charge carriers within nanowires discussed above, over the entire range of material temperatures, the general electronic properties of each of its element correspond to those of conventional metal-superconductor Josephson contacts. The difference between the interposer shown previously in FIG. 19 and the design of this device is that each element of this array has a thin insulating layer between the quantum nanowire and an electrode made of normal conductors connecting this element with the electronic circuitry. This layer, having thickness between about 0.5 nm and about 3 nm maybe made of molecules of naphthalene or anthracene sputtered in vacuum before final connection of the Z-conducting film with the electrodes.

V-2.D-3

Figure 21:
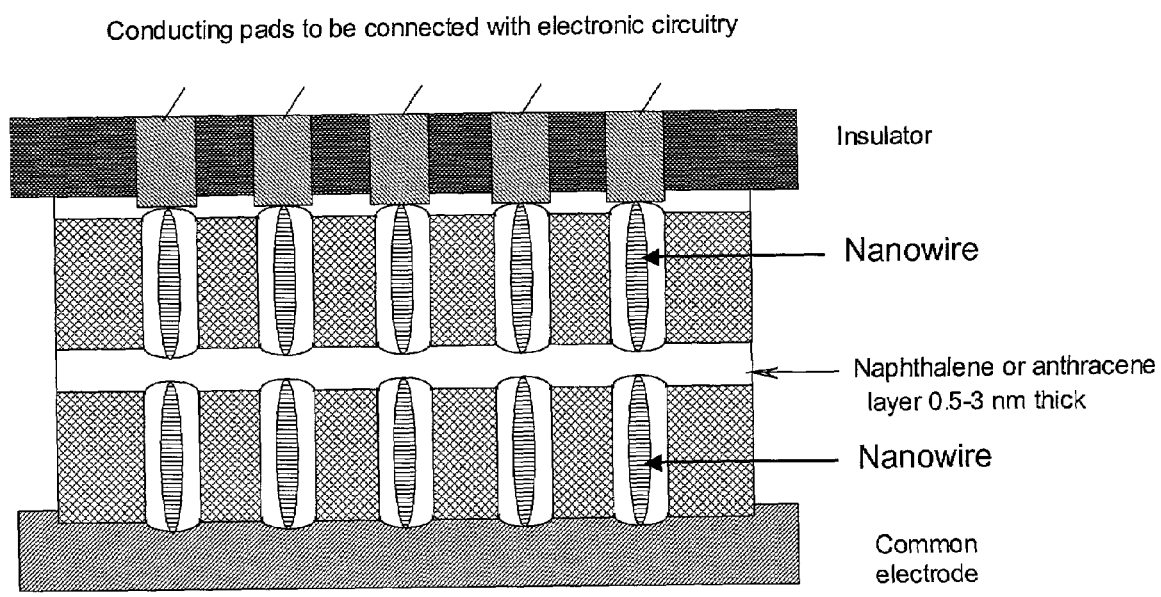
FIG. 21 depicts a device comprising two films containing Z-conducting nanowires and exhibiting the properties of an array of superconductor-superconductor Josephson contacts.

Another device of an array-type comprising two similar Z-conducting films is shown schematically in FIG. 21. Each element here comprises two nanowires separated by the same thin insulating layer, providing tunneling contact as in the previous device. Over the entire whole temperature range of the device existence each its element exhibits general electronic properties characteristic for conventional type of superconductor-superconductor Josephson contact.

The manufacturing of all three devices shown in FIGS. 19 to 21 can be relatively simple using methods, such as lithography, that are known in the semiconductor manufacturing arts.

V-3.M Methods to Produce X-Y-Conducting Quantum Nanowire Patterns

V-3.M-1

Figure 22:
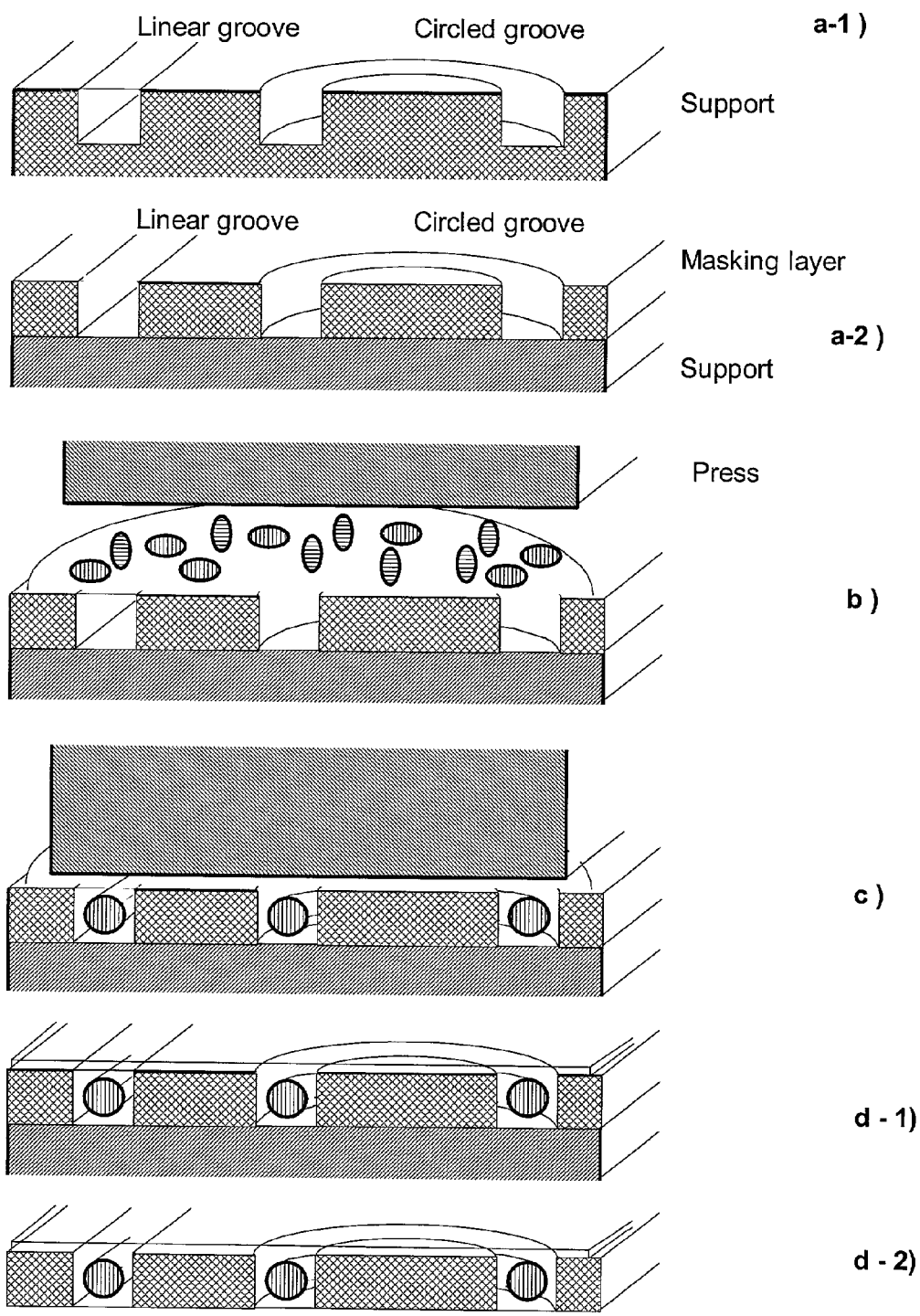
FIG. 22 depicts a process of mechanical formation of a pattern containing conducting quantum nanowires comprising crystallized electron pairs in an X-Y plane.

A "mechanical" approach can be also used to produce the patterns in which quantum nanowires comprising crystallized electron pairs are situated in the X-Y plane. The example of such a method is schematically shown in FIG. 22. The first step (a) produces a planar matrix whose desirable design of a future X-Y pattern is represented by system of microscopic grooves. These grooves can be etched within surface layer of a polished solid state support made of desirable material (FIG. 22*a*-1). A second possibility is if a corresponding mask is placed on the support's surface by a lithography technique (FIG. 22*a*-2). Either way, the choice between (a-1) and (a-2) can depend on what is more convenient for each particular case and does not adversely alter the general principles underlying the methods of the present invention. In contrast to methods V-2.M-1, in this method, the width d and depth h of the grooves may have the same order of magnitude, or alternatively maybe in the range between about 200 nm and about 500 nm.

Then a molecular substance containing quantum nanowires comprising crystallized electron pairs is placed on the surface of the matrix as shown in FIG. 22*b*. In general, parameters of the molecular substance and quantum nanowires in it can desirably obey similar conditions as in the methods described above in Section V-2.M-1. During the next step, the application of low external pressure causes viscous flow of the molecular substance into the grooves and fills them with quantum nanowires. Because each groove provides a preferable orientation of inserted nanowires, their closely situated ends join each other quickly and form desirable conducting patterns having similar form to that of the groove as shown in FIG. 22*c*. After this process is complete, the ready pattern can be removed from the press as depicted in FIG. 22*d*-1. If desired, residual molecular substance remaining on the pattern's surface can be removed with a short treatment in proper solvent or by other appropriate means. After that, the pattern can be dried to allow evaporation of the solvent or plasticizer from the grooves.

In some cases it may be desirable to remove an X-Y-conducting pattern from a solid state substrate in order to have the pattern in the form of free standing thin film shown in FIG. 22*d*-2. For example, this can be easily done without damage to the existing thin film pattern if the solid state substrate is made of polished salt, for instance NaCl, which is finally dissolved in water. It can be readily appreciated that other substrates and solvents can be used if they are compatible with the materials in the matrix or the quantum nanowires.

V-3.M-2

Figure 23:
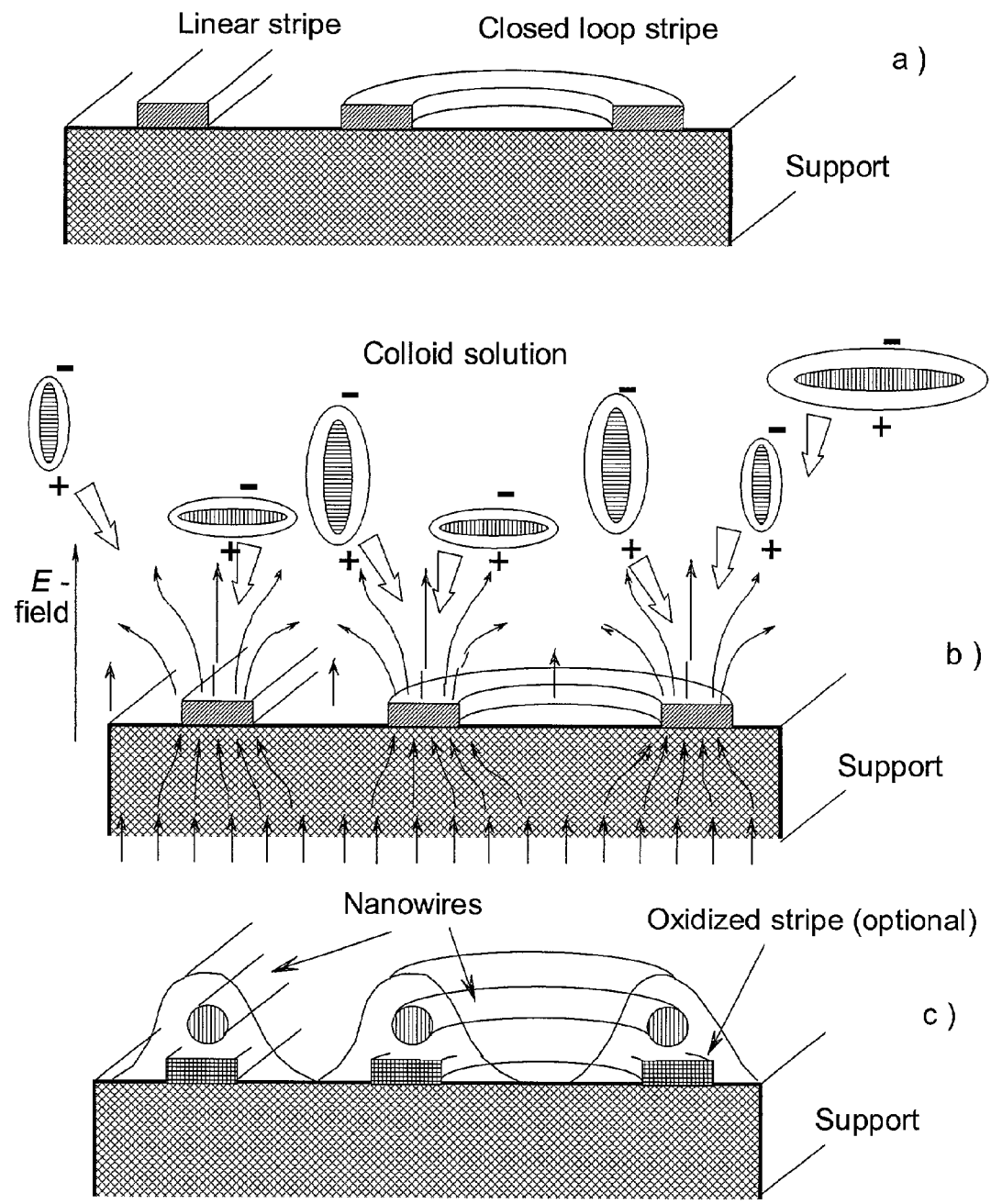
FIG. 23 depicts electric (or magnetic) formation of a pattern containing conducting quantum nanowires comprising crystallized electron pairs in an X-Y plane.

Another method of manufacturing X-Y-conducting quantum nanowire patterns comprising crystallized electron pairs can be carried out with the use of "electromagnetic formation." First, one can prepare a polished solid state support made of a dielectric material which is stable in the solvent of the colloid solution containing quantum nanowires to be used. A desirable design of future patterns is placed on the surface of the support in the form of thin conducting strips made, for instance, of appropriate metal as depicted in FIG. 23a. The thickness of these strips is not crucial, and can be, for example, as thin as about 5-10 nm. In some embodiments the conducting material can be thinner than 5 nm so long as the conductive properties are within a desirable range. At the same time, the width d of these strips is desirably less than about 1000 nm, alternatively between about 200 nm and about 400 nm using methods of contemporary lithography.

Then this support is covered with a colloid solution containing quantum nanowires comprising crystallized electron pairs in the form of self-compressed nanoparticles, and an external electric field is applied This field polarizes the conducting stripe on the surface and the quantum nanowires in the solution. Polarized conducting strips transform the shape of this field and create a corresponding pattern of a field gradient as shown in FIG. 23b. That causes attraction of polarized nanowires and their preferable deposition on the conductive strips. Thus, these strips become concentrators of nanowires, and after some time, the concentration of nanowires present on the surface of the strip can become so high that ends of neighboring nanowires begin to join each other forming necessary conducting patterns in the X-Y plane shown in FIG. 23c. Due to the molecular substance creating an insulating matrix in close vicinity of quantum nanowires, the nanowires can have no direct electric contact with conducting strips on the substrate surface. It is also seen from FIG. 23b that the field gradient has an opposite sign in the gap between two neighboring strips, and therefore polarized nanowires can be repulsed from the gap. That can prevent undesirable formation of shortening bridges between separate elements in the pattern.

To provide a reasonably short manufacturing time, it may be desirable during deposition or sedimentation to have the concentration of nanowires in the colloid solution between about $10^{10}$ cm$^{-3}$ and about $10^{12}$ cm$^{-3}$ and a viscosity of the solution close to that of the solvent (e.g., about $10^{-3}$ Pa·s). Taking into account the elongated shape of quantum nanowires, the combination of these conditions means that solution can desirably have a concentration of nanowires in between about 0.1% and 10% by volume. A modest field intensity can be provided as well. For instance, at a strip's width of about 300 nm, the local field gradient near the surface can become as strong as about 30 MV/cm$^2$ if the mean electric field has an intensity of about 1 kV/cm. In this case, a typical duration of the deposition or sedimentation process is about 10 s for nanowires containing n=100 domains. Nonetheless, it can be appreciated that the kinetics of the process can be determined by expression (22), which allows a practitioner to choose other combinations of the main parameters, if such other combinations permit a reasonable time of manufacturing.

In some embodiments it may be desirable for a final product to contain no conducting strips on the surface of the support. In this case it can be recommended that initially, strips can be made of easily oxidized metal, for instance, thin aluminum. After necessary quantum nanowire pattern is ready it can be modestly heated for sufficient time in an oxidant environment (e.g., in an oxygen containing atmosphere) in order to convert conducting aluminum into dielectric aluminum oxide. Instead of electric fields, magnetic fields can be used in some embodiments. In other embodiments, both electric and magnetic fields can be used. In this case, the support can desirably be made of any material having relatively low magnetic susceptibility whereas the strips can be made of materials having sufficient ferromagnetic properties to create strong local gradients of the magnetic field.

Based on physics of quantum nanowires comprising crystallized electron pairs previously discussed, monitoring of fabricated patterns can be provided by non-contact methods of scanning electron microscopy, scanning Auger spectroscopy, scanning tunnel microscopy and/or atomic force microscopy in both magnetic and electric field modes.

V-4 Methods to Produce Self-Insulating very Long Quantum Nanowires

Attractive forces between an external electrode and a quantum nanowire comprising crystallized electron pairs placed in a strong gradient of electric or magnetic field, as well as attractive forces between neighboring quantum nanowires in similar gradients, can be used to manufacture quantum nanowire as long as desired without any theoretical limitation of its length. The method is based on physical principles disclosed in sub-section V-3.M-2 above, where desired quantitative estimates have been provided. In the present method, the main properties of colloid solutions having quantum nanowires can desirably satisfy similar general conditions.

Figure 24:
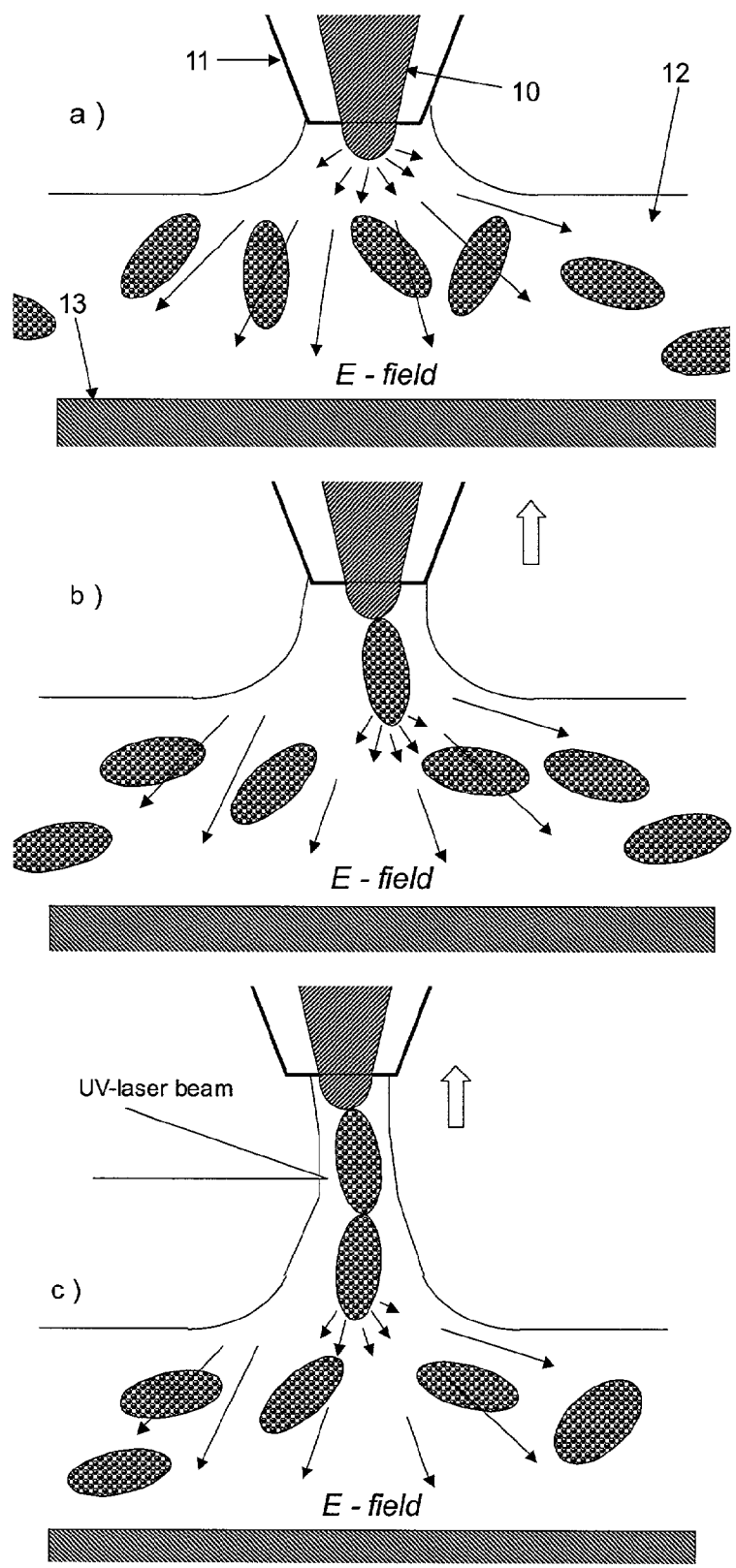
FIG. 24 depicts a method for producing very long quantum nanowires comprising crystallized electron pairs.

Manufacturing is depicted in FIG. 24. The process starts from the formation of the beginning of long nanowire. A sharp open tip of a conducting electrode 10 encapsulated partially in insulating shell 11 is placed near the surface of colloid solution 12 containing nanowires as shown in FIG. 24a. A voltage is applied between electrodes 10 and 13 and creates a strong field gradient (shown with arrows) concentrated mainly near the tip. It is well known that near spherical conducting surfaces having voltage U and small curvature radius p the electric field intensity is approximately equal to U/ρ whereas the gradient is about U/ρ$^2$ For instance, a relatively low voltage of about 1 V can create a field intensity of about 10 kV/cm and a gradient about 100 MV/cm$^2$ if the tip has radius ρ=1 micron. Then it follows from expression (22), that at under given conditions it can take only about 0.3 s to attract a first nanowire which closest to the tip's position. After the first nanowire has joined the tip the opposite end of the nanowire becomes a new concentrator of the electric field as shown in FIG. 24b because the conducting nanowire typically can have even a smaller radius of curvature than the conducting tip 10. That means the next nanowire can be attracted to the first one and join it, and so on. Continuing this process for an arbitrarily long time may entail pulling the initial tip in the direction of the white arrow, as shown in FIG. 24c, thereby keeping the contact between the end of the growing nanowire and the surface of the colloid solution. A rough estimation shows that at a low voltage of about 1 V, the speed of nanowire growth, equal to the speed of electrode pulling, can be as high as about 0.2 mm/min. Higher voltage can result in increased speed of the process.

Initially smaller nanowires can join each other in the present method with relatively weak forces caused by their polarization. In order to prevent accidental break of growing nanowires, it maybe desirable to improve the mechanical strength of the nanowires. For that one can locally heat a nanowire extracted from the solution in order to dry it and to weld the insulating matrix in places where smaller nanowires are connected. Another possibility is to provide chemical causing cross-linking of the matrix containing nanowires. Another possibility is to irradiate a growing thread with a well focused beam of UV-laser as a growing conducting thread is pulled from the solution. Such irradiation may simultaneously cause both rapid evaporation of solvents and cross-linking of the insulating polymer matrix surrounding the conducting core of long quantum nanowires comprising crystallized electron pairs Numerous types of devices can be manufactured using the highly conductive elements of this invention. Many are described in U.S. Provisional Patent Application Ser. No. 60/263,386, incorporated herein fully by reference.

It can be appreciated that the above descriptions and embodiments are illustrative of the invention and that other embodiments can be provided that remain within the scope of this invention. It also can be appreciated that the theoretical model(s) that are described are for purposes of visualizing the various embodiments, and that other theories may account for the properties of the highly conductive nanowires of this invention. Furthermore, all references cited herein are incorporated fully by reference.

INDUSTRIAL APPLICABILITY

Very small, highly conductive materials are provided that can be used in a variety of electronic, optico-electronic and other nano-scale devices. The materials can be made relatively inexpensively, and can have a large number of applications in the fields of electronics, optics, biomedicine, magnetics and other industries in which very high conductivity over temperature ranges from 0 Kelvins to the temperature of decomposition of the materials are desired.

We claim:

1. A conductive material, comprising:
    a molecular medium having a charge transfer complex including at least one positively charged molecular group and at least one negatively charged molecular group;
    a dopant;
    wherein said positive and negative charges are separated from each other by a distance from about 0.2 nm to about 20 nm;
    wherein the viscosity of said molecular medium is at least about $10^7$ Pa·s;
    wherein the concentration of said charge transfer complexes is at least about $1.6 \times 10^{19}$ cm$^{-3}$; and wherein at least two crystallized electron pairs occupy a region between said positive and negative charges, each of said crystallized electron pairs has charge $-2e$ and spin 1; each of said crystallized electron pairs situated in nodes of a two-coaxial, quasi-one-dimensional sub crystal.

2. The conductive material of claim 1, wherein said dopant is selected from the group consisting of Na, K, Cs$_2$O, BaO, $(C_5H_5)_2$CR and $(CH_3)_3$CH.

3. The conductive material of claim 1, wherein said positively charged molecular group comprises a tertiary amine and said negatively charged molecular group comprises a carboxylic acid.

4. The conductive material of claim 1, wherein said molecular medium comprises at least one of an epoxy, a polyoxypropylene diamine and dimethylaminoethylmethacrylate.

5. The conductive material of claim 1, wherein said molecular medium comprises at least one side chain comprising a mesogenic group.

6. The conductive material of claim 5, wherein said mesogenic group is selected from the group consisting of cyan-biphenyl, an ether group and an ester group.

7. The conductive material of claim 1, wherein said at least one positively charged molecular group and at least one negatively charged molecular group are present on one molecule.

8. A method for making a conductive material, comprising:
    providing a first precursor for a forming a molecular medium, said first precursor having a side chain capable of attaining at least a partial positive charge;
    providing a second precursor for a forming a molecular medium, said second precursor having a side chain capable of attaining at least a partial negative charge;
    mixing said first and second precursors thereby forming a precursor mixture;
    adding a dopant to said mixture thereby forming a solution comprising;
    said mixture having a viscosity of about $10^7$ Pa·s; and
    modifying said mixture to separate said at least partial positive charge and said at least partial negative charge to a distance of from about 0.2 nm to about 20 nm; thereby
    permitting at least two crystallized electron pairs to form within said molecular matrix.

9. The method of claim 8, wherein said molecular medium comprises at least one of an epoxy, a polyoxypropylene diamine and dimethylaminoethylmethacrylate.

10. The method of claim 8, wherein said dopant is selected from the group consisting of Na, K, Cs$_2$O, BaO, $(C_5H_5)_2$Cr and $(CH_3)_3$CH.

11. The method of claim 8, wherein said step of modifying includes at least one of exposing said mixture to ultraviolet radiation, applying heat or applying mechanical stress.

12. A conductive nanowire comprising the conductive material of claim 1.

13. The conductive nanowire of claim 12, said nanowire having two ends, each of which are in electrical contact with a main current electrode.

14. The conductive nanowire of claim 13, further comprising a control electrode sufficiently near said nanowire to alter polarity of said at least partial positive and said at least partial negative charge in the molecular matrix of said nanowire, thereby forming an electronic gate.

15. The conductive nanowire of claim 13, further comprising an insulator between one end of said nanowire and the main current electrode associated with that end of said nanowire.

16. A method for manufacturing an electronic device, comprising:
    manufacturing a shaped form in a substrate;
    introducing a solution comprising a nanowire of claim 13 therein; and
    permitting said solution to polymerize.

17. The method of claim 16, wherein said shaped form comprises a linear groove having two ends, each of said ends comprising a main current electrode.

18. The method of claim 17, further comprising forming a control electrode near said channel.

19. The method of claim 16, wherein said shaped form comprises a circular groove.

20. The method of claim 16, wherein said shaped form has a dielectric layer formed thereon, prior to introducing said mixture.

* * * * *